United States Patent
Koduri

(10) Patent No.: US 10,636,758 B2
(45) Date of Patent: Apr. 28, 2020

(54) EXPANDED HEAD PILLAR FOR BUMP BONDS

(71) Applicant: Texas Instruments Incorporated, Dallas, TX (US)

(72) Inventor: Sreenivasan K Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 79 days.

(21) Appl. No.: 16/030,371

(22) Filed: Jul. 9, 2018

(65) Prior Publication Data

US 2019/0109108 A1     Apr. 11, 2019

Related U.S. Application Data

(60) Provisional application No. 62/568,335, filed on Oct. 5, 2017, provisional application No. 62/568,336, filed
(Continued)

(51) Int. Cl.
 *H01L 23/00* (2006.01)

(52) U.S. Cl.
 CPC .............. *H01L 24/13* (2013.01); *H01L 24/11* (2013.01); *H01L 24/14* (2013.01); *H01L 24/16* (2013.01);
(Continued)

(58) Field of Classification Search
 CPC ......... H01L 24/13; H01L 24/11; H01L 24/14; H01L 24/16; H01L 24/03; H01L 24/05;
(Continued)

(56) References Cited

U.S. PATENT DOCUMENTS 6,300,250 B1 * 10/2001 Tsai ..................... H01L 21/2885
                                                                257/E21.175
6,316,831 B1    11/2001 Wang
                        (Continued)

FOREIGN PATENT DOCUMENTS

KR           20130126171 A      11/2013

OTHER PUBLICATIONS

PCT International Search Report for International Application No. PCT/US 2018/054404, dated Jan. 24, 2019, 2 pages.

*Primary Examiner* — Peter Bradford
(74) *Attorney, Agent, or Firm* — Dawn Jos; Charles A. Brill; Frank D. Cimino

(57) ABSTRACT

A microelectronic device has a bump bond structure including an electrically conductive pillar with an expanded head, and solder on the expanded head. The electrically conductive pillar includes a column extending from an I/O pad to the expanded head. The expanded head extends laterally past the column on at least one side of the electrically conductive pillar. In one aspect, the expanded head may have a rounded side profile with a radius approximately equal to a thickness of the expanded head, and a flat top surface. In another aspect, the expanded head may extend past the column by different lateral distances in different lateral directions. In a further aspect, the expanded head may have two connection areas for making electrical connections to two separate nodes. Methods for forming the microelectronic device are disclosed.

20 Claims, 66 Drawing Sheets

Related U.S. Application Data on Oct. 5, 2017, provisional application No. 62/568,338, filed on Oct. 5, 2017.

(52) U.S. Cl.
CPC ............. *H01L 24/03* (2013.01); *H01L 24/05* (2013.01); *H01L 2224/0345* (2013.01); *H01L 2224/03614* (2013.01); *H01L 2224/03912* (2013.01); *H01L 2224/0401* (2013.01); *H01L 2224/05073* (2013.01); *H01L 2224/05082* (2013.01); *H01L 2224/05085* (2013.01); *H01L 2224/05124* (2013.01); *H01L 2224/05147* (2013.01); *H01L 2224/05573* (2013.01); *H01L 2224/05644* (2013.01); *H01L 2224/05655* (2013.01); *H01L 2224/05664* (2013.01); *H01L 2224/05666* (2013.01); *H01L 2224/05669* (2013.01); *H01L 2224/119* (2013.01); *H01L 2224/1131* (2013.01); *H01L 2224/1145* (2013.01); *H01L 2224/1147* (2013.01); *H01L 2224/1181* (2013.01); *H01L 2224/1182* (2013.01); *H01L 2224/11312* (2013.01); *H01L 2224/11318* (2013.01); *H01L 2224/11462* (2013.01); *H01L 2224/11472* (2013.01); *H01L 2224/11474* (2013.01); *H01L 2224/11505* (2013.01); *H01L 2224/11612* (2013.01); *H01L 2224/11614* (2013.01); *H01L 2224/11616* (2013.01); *H01L 2224/11622* (2013.01); *H01L 2224/11825* (2013.01); *H01L 2224/11848* (2013.01); *H01L 2224/11901* (2013.01); *H01L 2224/11903* (2013.01); *H01L 2224/133* (2013.01); *H01L 2224/136* (2013.01); *H01L 2224/13011* (2013.01); *H01L 2224/13013* (2013.01); *H01L 2224/13014* (2013.01); *H01L 2224/13017* (2013.01); *H01L 2224/13018* (2013.01); *H01L 2224/13019* (2013.01); *H01L 2224/13083* (2013.01); *H01L 2224/13084* (2013.01); *H01L 2224/13144* (2013.01); *H01L 2224/13147* (2013.01); *H01L 2224/13155* (2013.01); *H01L 2224/13184* (2013.01); *H01L 2224/13193* (2013.01); *H01L 2224/13393* (2013.01); *H01L 2224/13564* (2013.01); *H01L 2224/13566* (2013.01); *H01L 2224/13582* (2013.01); *H01L 2224/13611* (2013.01); *H01L 2224/13613* (2013.01); *H01L 2224/13639* (2013.01); *H01L 2224/13655* (2013.01); *H01L 2224/13657* (2013.01); *H01L 2224/13684* (2013.01); *H01L 2224/14104* (2013.01); *H01L 2224/16106* (2013.01); *H01L 2224/16227* (2013.01); *H01L 2224/16245* (2013.01); *H01L 2924/3651* (2013.01); *H01L 2924/3656* (2013.01)

(58) Field of Classification Search
CPC ... H01L 2224/0345; H01L 2224/03614; H01L 2224/03912; H01L 2224/0401; H01L 2224/05073; H01L 2224/05082; H01L 2224/05085; H01L 2224/05124; H01L 2224/05147; H01L 2224/05573; H01L 2224/05644; H01L 2224/05655; H01L 2224/05664; H01L 2224/05666; H01L 2224/05669; H01L 2224/1131; H01L 2224/11312; H01L 2224/11318; H01L 2224/1145; H01L 2224/11462; H01L 2224/1147; H01L 2224/11472; H01L 2224/11474; H01L 2224/11505; H01L 2224/11612; H01L 2224/11614; H01L 2224/11616; H01L 2224/11622; H01L 2224/1181; H01L 2224/1182; H01L 2224/11825; H01L 2224/11848; H01L 2224/119; H01L 2224/11901; H01L 2224/11903; H01L 2224/13011; H01L 2224/13013; H01L 2224/13014; H01L 2224/13017; H01L 2224/13018; H01L 2224/13019; H01L 2224/13083; H01L 2224/13084; H01L 2224/13144; H01L 2224/13147; H01L 2224/13155; H01L 2224/13184; H01L 2224/13193; H01L 2224/1329; H01L 2224/133; H01L 2224/13393; H01L 2224/13564; H01L 2224/13566; H01L 2224/13582; H01L 2224/136; H01L 2224/13611; H01L 2224/13613; H01L 2224/13639; H01L 2224/13655; H01L 2224/13657; H01L 2224/1368; H01L 2224/13684; H01L 2224/14104; H01L 2224/16106; H01L 2224/16227; H01L 2224/16245; H01L 2924/3651; H01L 2924/3656

See application file for complete search history.

(56) References Cited

U.S. PATENT DOCUMENTS

| | | | |
|---|---|---|---|
| 7,122,897 B2 * | 10/2006 | Aiba | H01L 23/3114 257/738 |
| 7,391,112 B2 | 6/2008 | Li et al. | |
| 7,902,679 B2 * | 3/2011 | Lin | H01L 23/49816 257/737 |
| 8,072,070 B2 | 12/2011 | Lee et al. | |
| 8,242,011 B2 | 8/2012 | Lim et al. | |
| 8,462,516 B2 | 6/2013 | Wong et al. | |
| 9,040,381 B2 | 5/2015 | Yu et al. | |
| 9,245,860 B2 | 1/2016 | Feustel et al. | |
| 9,329,284 B2 * | 5/2016 | Spartiotis | G01T 1/247 |
| 9,484,291 B1 | 11/2016 | Dhandapani et al. | |
| 9,831,202 B2 | 11/2017 | Seo et al. | |
| 9,875,980 B2 | 1/2018 | Rinne et al. | |
| 2002/0121692 A1 * | 9/2002 | Lee | H01L 24/05 257/737 |
| 2005/0167830 A1 * | 8/2005 | Chang | H01L 23/49816 257/737 |
| 2006/0051954 A1 * | 3/2006 | Lin | H01L 21/4853 438/614 |
| 2006/0088992 A1 | 4/2006 | Huang et al. | |
| 2006/0163729 A1 * | 7/2006 | Lin | H01L 23/3128 257/738 |
| 2006/0223313 A1 * | 10/2006 | Yoon | H01L 24/11 438/687 |
| 2010/0246150 A1 * | 9/2010 | Wong | B81C 1/00095 361/770 |
| 2011/0031603 A1 | 2/2011 | Su et al. | |
| 2012/0007230 A1 | 1/2012 | Hwang et al. | |
| 2014/0048926 A1 | 2/2014 | Wang et al. | |
| 2014/0061642 A1 | 3/2014 | Srinivas et al. | |
| 2015/0340332 A1 * | 11/2015 | Rinne | H01L 24/13 257/737 |
| 2017/0141053 A1 | 5/2017 | Chen et al. | |
| 2018/0026001 A1 | 1/2018 | Chen et al. | |
| 2019/0109093 A1 * | 4/2019 | Koduri | H01L 24/13 |
| 2019/0237400 A1 * | 8/2019 | Herrault | H01L 23/535 |

* cited by examiner

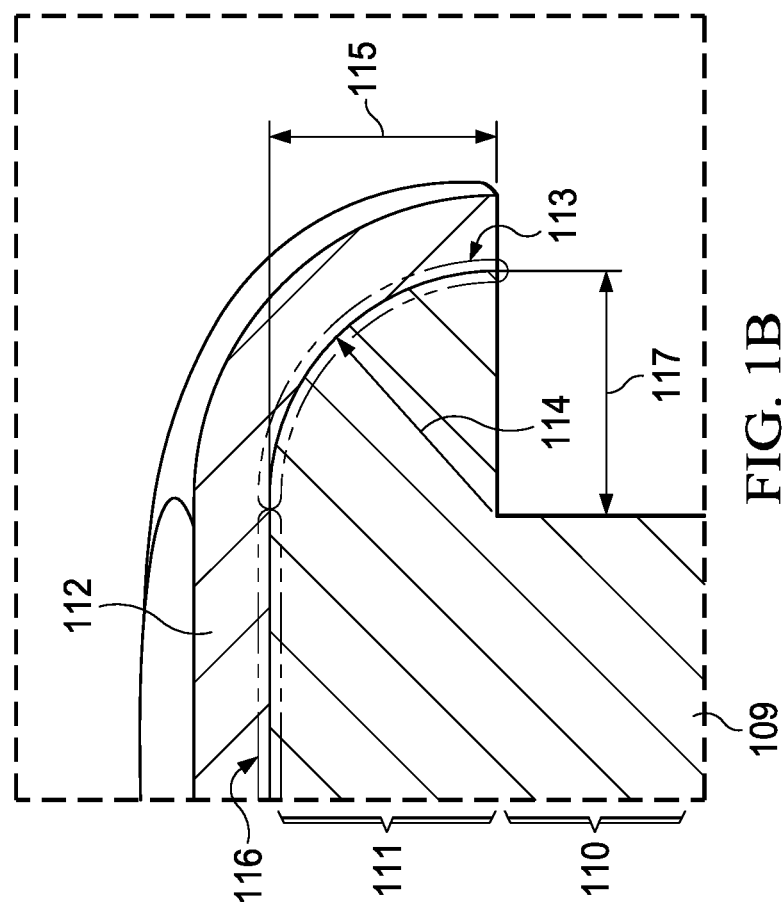

EXPANDED HEAD PILLAR FOR BUMP BONDS

CROSS-REFERENCE TO RELATED APPLICATIONS

This application claims the benefit of priority under 35 U.S.C. § 119(e) of the following provisional applications: U.S. Provisional Application No. 62/568,335 (Texas Instruments docket number TI 78661PS), filed Oct. 5, 2017, U.S. Provisional Application No. 62/568,336 (Texas Instruments docket number TI 78662PS), filed Oct. 5, 2017, and U.S. Provisional Application No. 62/568,338 (Texas Instruments docket number TI 78663PS), filed Oct. 5, 2017, all of which are hereby incorporated by reference in their entirety.

FIELD OF THE DISCLOSURE

This disclosure relates to the field of microelectronic devices. More particularly, this disclosure relates to bump bonds in microelectronic devices.

BACKGROUND OF THE DISCLOSURE

Some microelectronic devices have bump bond structures with electrically conductive pillars for input/output (I/O) connections. As component sizes decrease and circuit densities increase in successive technology nodes, current densities through the bump bond structures have been increasing in many cases, which may increase electromigration and other degradation mechanisms.

SUMMARY OF THE DISCLOSURE

The present disclosure introduces a microelectronic device having a bump bond structure including an electrically conductive pillar with an expanded head, and solder on the expanded head. The electrically conductive pillar includes a column extending from an input/output (I/O) pad to the expanded head. The expanded head extends laterally past the column on at least one side of the electrically conductive pillar. In one aspect of the disclosure, the expanded head may have a rounded side profile with a radius approximately equal to a thickness of the expanded head, and a flat top surface. In another aspect, the expanded head may extend past the column by a first lateral distance in a first lateral direction and by a second lateral distance in a second lateral direction, wherein the first lateral distance is greater than the second lateral distance. In a further aspect, the expanded head may have two connection areas for making electrical connections to two separate nodes. Methods for forming the microelectronic device are disclosed.

DETAILED DESCRIPTION OF EXAMPLE EMBODIMENTS

Figures 1A, 1B:
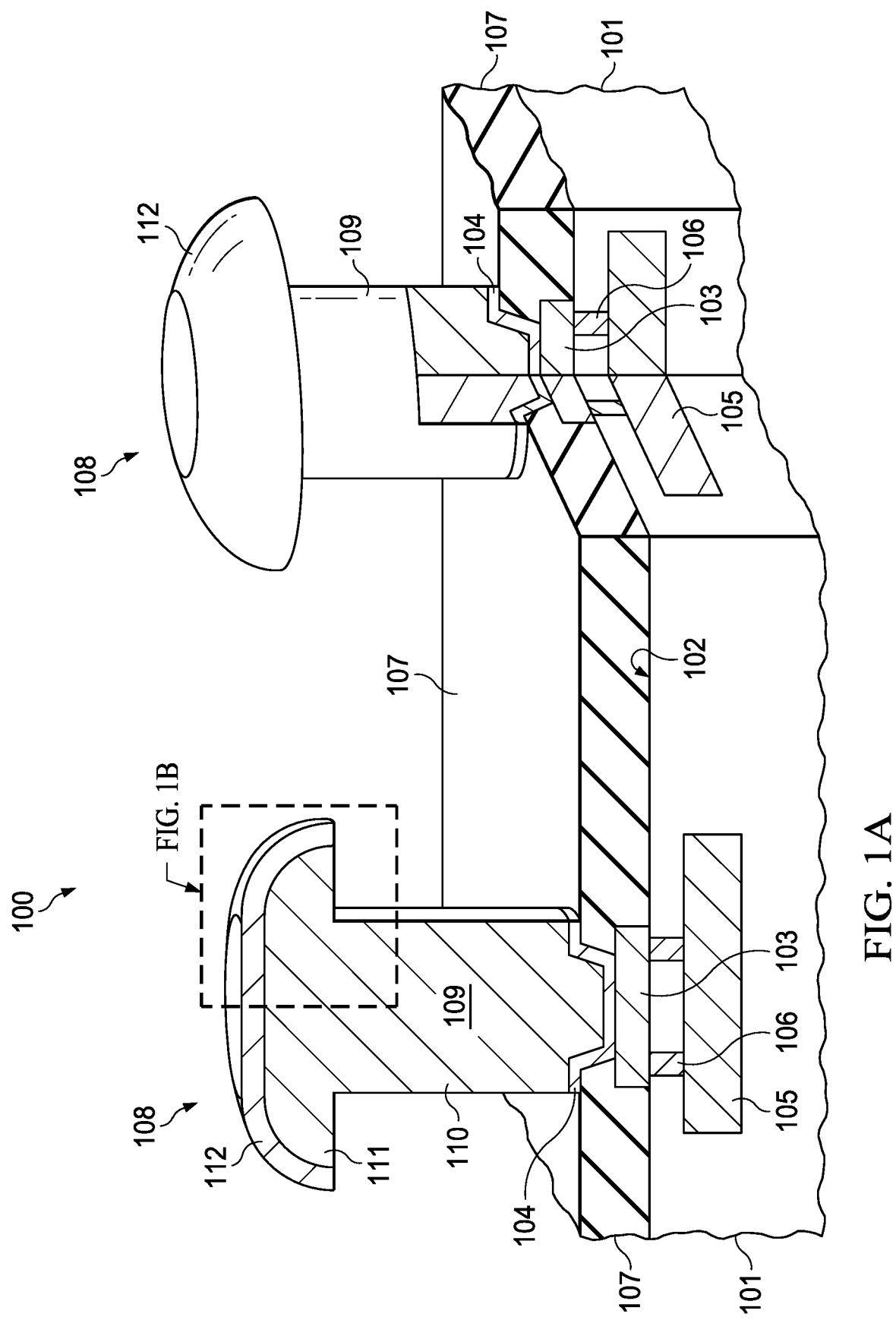
FIG. 1A through FIG. 1C are cross sections of an example microelectronic device which includes electrically conductive pillars with expanded heads.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a bump bond structure on an input/output (I/O) pad of the microelectronic device. The I/O pad may be a bond pad electrically coupled to interconnects of the microelectronic device. The I/O pad may be a portion of a redistribution layer (RDL) over the interconnects of the microelectronic device. The I/O pad may be a bump pad in a bond-over-active (BOAC) structure of the microelectronic device. Other manifestations of the I/O pad are within the scope of this disclosure. A seed layer may be disposed on the I/O pad. The seed layer is sometimes referred to as an under bump metallization (UBM) layer. The bump bond structure includes an electrically conductive pillar. In some versions of the microelectronic device, the electrically conductive pillar may include substantially only copper, or may include primarily copper with other materials such as gold, silver, nickel, or such. In other versions, the electrically conductive pillar may include one or more metals such as nickel or tungsten. In further versions, the electrically conductive pillar may include electrically conductive nanoparticles, graphene, carbon nanotubes, or an electrically conductive organic polymer. The electrically conductive pillar has a column on the I/O pad, contacting the seed layer, if present. For the purposes of this disclosure, if the column is described as being "on" the I/O pad, it may be directly on the I/O pad, or intervening elements such as the seed layer may be present. If the column is described as being "directly on" the I/O pad, there are no other intentionally disposed intervening elements present. The electrically conductive pillar includes an expanded head on the column. The expanded head is located opposite from the I/O pad, so that the column extends from the I/O pad to the expanded head. The expanded head extends laterally past the column on at least one side of the electrically conductive pillar. For the purposes of this disclosure, the terms "lateral" and "laterally" refer to a direction parallel to an I/O surface of the microelectronic device on which the I/O pads are located.

The bump bond structure includes solder on the expanded head. The solder may be directly on the expanded head, or a barrier layer may be located between the expanded head and the solder. An area of an interface between the solder and the expanded head is larger than a cross sectional area of the column parallel to the I/O surface. During operation of the microelectronic device, current through the column may spread out through the expanded head, so that a current density through the interface between the solder and the expanded head is lower than a current density through the column. Having a lower current density through the interface between the solder and the expanded head may advantageously provide lower electromigration and lower void formation in the bump bond structure.

In one aspect of the disclosure, the expanded head may have a rounded side profile with a radius approximately equal to a thickness of the expanded head, and a contact surface which is flat. The term "side profile" refers to a boundary of the expanded head along a plane perpendicular to the I/O surface of the microelectronic device. The term "contact surface" refers to a surface of the expanded head located opposite from the column and parallel to the I/O surface of the microelectronic device. The expanded head may extend laterally past the column by an approximately equal distance on all sides of the column. In one sense, the term "approximately" may be taken to mean within 10 percent. In another sense, the term "approximately" may be taken to mean within fabrication tolerances encountered during fabrication of the microelectronic device. In a further sense, the term "approximately" may be taken to mean within measurement tolerances encountered when measuring structures of the microelectronic device.

In another aspect, the expanded head may extend laterally past the column by a first lateral distance in a first lateral direction and by a second lateral distance in a second lateral direction, wherein the first lateral distance is greater than the second lateral distance. The expanded head has a contact surface which is flat. The flat contact surface may extend to a lateral perimeter of the expanded head. Alternatively, the expanded head may have a curved profile around at least a portion of the lateral perimeter of the expanded head.

In a further aspect, the expanded head may have two connection areas for making electrical connections to two separate nodes. Both connection areas may be located to make connections to package electrodes, such as leads. Alternatively, one connection area may be located to make a connection to a package electrode, and the other connection area may make a connection to another I/O pad of the microelectronic device through another column of the electrically conductive pillar.

Methods for forming the microelectronic device are disclosed. In some methods, the electrically conductive pillar may be formed by electroplating using a plating mask. The plating mask may be formed by a photolithographic process, an additive process, or a combination thereof. In other methods, the electrically conductive pillar may be formed by an additive process. The term "additive process" refers to a process which disposes material such as electrically conductive nanoparticle ink or plating mask material in a desired area, to produce a final desired shape of the electrically conductive pillar. Additive processes may enable forming the electrically conductive pillar or plating masks, advantageously reducing fabrication cost and complexity. Examples of additive processes include binder jetting, material jetting, directed energy deposition, material extrusion, powder bed fusion, sheet lamination, vat photopolymerization, direct laser deposition, electrostatic deposition, laser sintering, electrochemical deposition, and photo-polymerization extrusion.

Figure 1C:
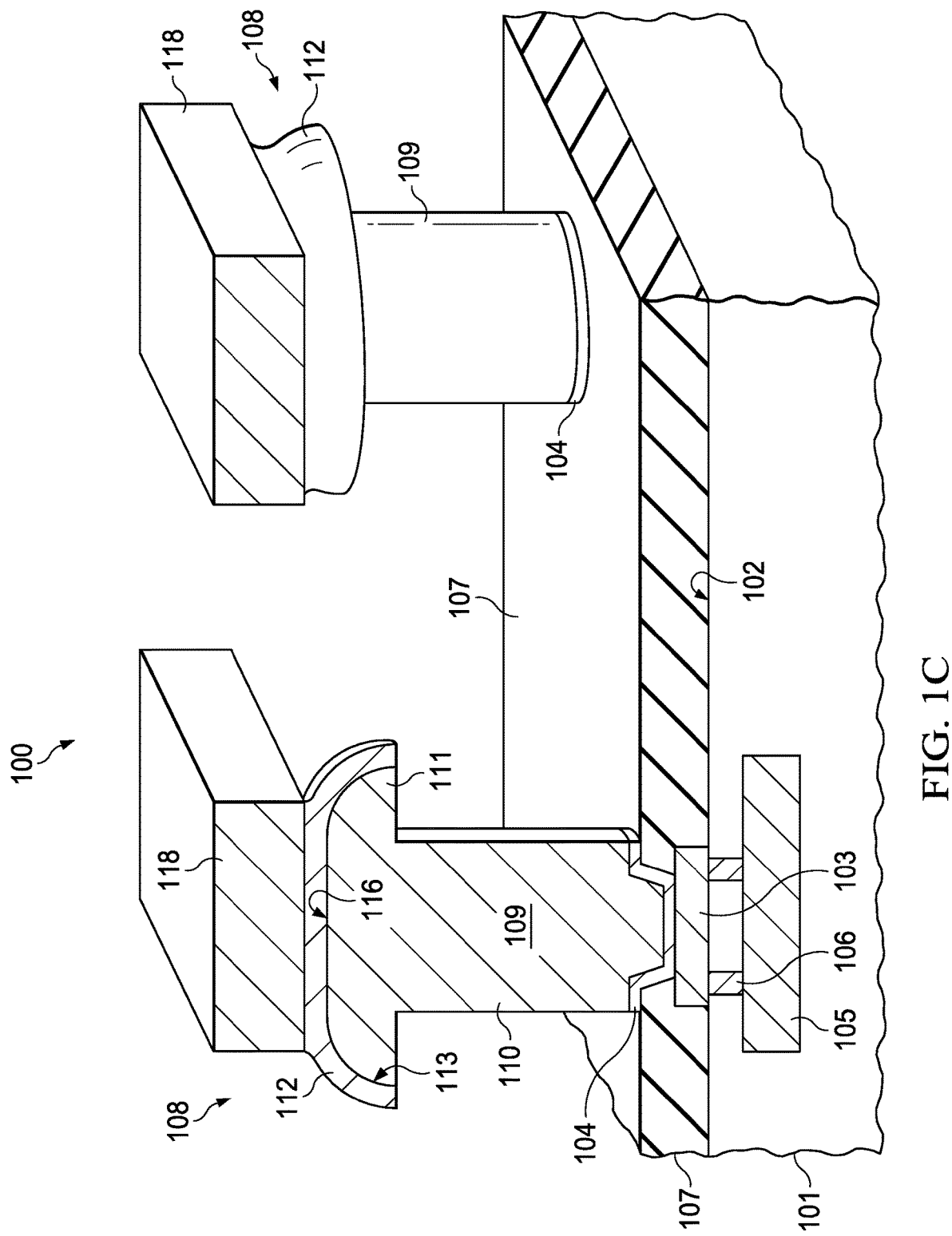

FIG. 1A through FIG. 1C are cross sections of an example microelectronic device which includes electrically conductive pillars with expanded heads. Referring to FIG. 1A, the microelectronic device 100 has a substrate 101 with an I/O surface 102. The microelectronic device 100 has I/O pads 103 on the I/O surface 102. The substrate 101 may be, for example, a semiconductor wafer with components such as transistors, and dielectric layers extending to the I/O surface 102. Alternatively, the substrate 101 may be a wafer which includes micro-electrical-mechanical systems (MEMS) devices. A seed layer 104 may be disposed on each I/O pad 103. The I/O pad 103 may include aluminum or copper, for example. The seed layer 104 may include titanium, nickel, palladium, or other metal suitable for providing a surface for electroplating a metal such as copper. The I/O pads 103 may be electrically coupled to interconnects 105 in the substrate 101, for example through vias 106. A protective overcoat (PO) layer 107 may optionally be disposed over the I/O surface 102, with openings that expose the I/O pads 103. The PO layer 107 may include, for example, silicon dioxide, silicon nitride, silicon oxynitride, aluminum oxide, polyimide, or other dielectric material which reduces diffusion of water vapor and contaminants. The seed layer 104 contacts the I/O pads 103 in the openings and may extend partway over the PO layer 107 adjacent to the openings, as depicted in FIG. 1A.

The microelectronic device 100 includes bump bond structures 108 on the I/O pads 103. Each bump bond structure 108 includes an electrically conductive pillar 109 having a column 110 and an expanded head 111. The column 110 extends from the corresponding I/O pad 103 to the expanded head 111. The column 110 may have a substantially circular cross section, in a plane parallel to the I/O surface 102, as indicated in FIG. 1A. Alternatively, the column 110 may have a rounded square cross section, an oval cross section, a round rectangular cross section, or other shape of cross section. The column 110 includes electrically conductive material, such as copper, tungsten, gold, nickel, metal nanoparticles, carbon nanotubes, graphene, or an electrically conductive organic polymer.

The expanded head 111 is located on the column 110, opposite from the I/O pad 103. The expanded head 111 includes electrically conductive material, for example any of the materials disclosed in reference to the column 110. The column 110 may be continuous with the expanded head 111, as indicated in FIG. 1A.

Each bump bond structure 108 includes solder 112 on the expanded head 111. The solder 112 may include, for example, tin, silver, bismuth, or other metals. An optional barrier layer, not shown in FIG. 1A, may be disposed between the solder 112 and the expanded head 111.

Referring to FIG. 1B, the expanded head 111 of the instant example has a rounded side profile 113 with a radius 114 that is approximately equal to a vertical thickness 115 of the expanded head 111. The radius 114 extends from an intersection of the column 110 and the expanded head 111 to a lateral surface of the expanded head 111. The expanded head 111 has a contact surface 116, which is flat, located opposite from the column 110. The flat contact surface 116 may extend to the rounded side profile 113, as depicted in FIG. 1B. The expanded head 111 of the instant example extends laterally past the column 110 on all lateral sides of the column 110 by a lateral distance 117 that is approximately equal to the vertical thickness 115 of the expanded head 111.

FIG. 1C depicts the microelectronic device 100 assembled into a package structure, such as a lead frame or chip carrier. The bump bond structures 108 are soldered to package electrodes 118 of the package structure. The package electrodes 118 may be manifested as leads 118 of the package structure, as indicated in FIG. 1C. The solder 112 couples each electrically conductive pillar 109 to the corresponding lead 118. The solder 112 covers the rounded side profile 113 and the flat contact surface 116.

Modeling has indicated current through the electrically conductive pillar 109 spreads out across the rounded side profile 113, due to the radius 114 of FIG. 1B being approximately equal to the vertical thickness 115 of FIG. 1B of the expanded head 111. Having the current distributed across the rounded side profile 113 reduces a current density across an interface between the expanded head 111 and the solder 112, which may advantageously reduce electromigration and void formation, and thus improve reliability of the microelectronic device 100. Having the contact surface 116 being flat provides a uniform thickness of the solder 112 between the contact surface 116 and the lead 118. Since the solder 112 has a higher electrical resistivity than the expanded head 111, the uniform thickness of the solder 112 may advantageously provide a more uniform current density through the contact surface 116 to the solder 112, further reducing electromigration and void formation.

Figure 2A:
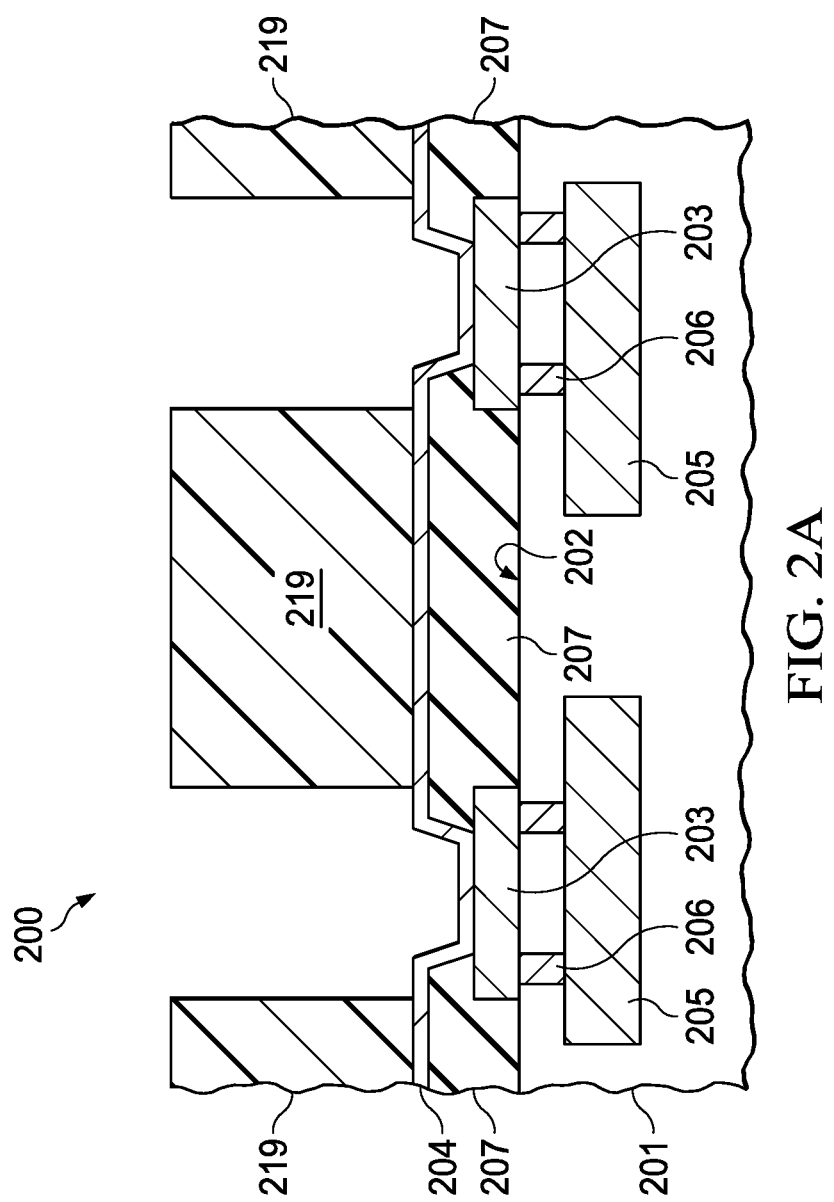
FIG. 2A through FIG. 2G are cross sections of a microelectronic device which includes electrically conductive pillars with expanded heads, depicted in stages of an example method of formation.

FIG. 2A through FIG. 2G are cross sections of a microelectronic device which includes electrically conductive pillars with expanded heads, depicted in stages of an example method of formation. Referring to FIG. 2A, the microelectronic device 200 has a substrate 201 with I/O pads 203 on an I/O surface 202. The substrate 201 may have the properties disclosed in reference to the substrate 101 of FIG. 1A. The I/O pads 203 may be electrically coupled to interconnects 205 in the substrate 201 through vias 206. A PO layer 207 may optionally be disposed over the I/O surface 202, with openings that expose the I/O pads 203.

A seed layer 204 is formed over the I/O surface 202, on the PO layer 207, if present. The seed layer 204 contacts the I/O pads 203, through the openings in the PO layer 207. The seed layer 204 provides an electrically conductive layer for a subsequent electroplating process. The seed layer 204 may include any of the metals disclosed in reference to the seed layer 104 of FIG. 1A. The seed layer 204 may be formed, for example, by a sputter process, an evaporation process, or a combination thereof.

A column plating mask 219 is formed over the seed layer 204. The column plating mask 219 exposes the seed layer 204 in areas over the I/O pads 203. The column plating mask 219 may include photoresist, and may be formed by a photolithographic process. Alternatively, the column plating mask 219 may be formed by an additive process such as material jetting or material extrusion.

Figure 2B:
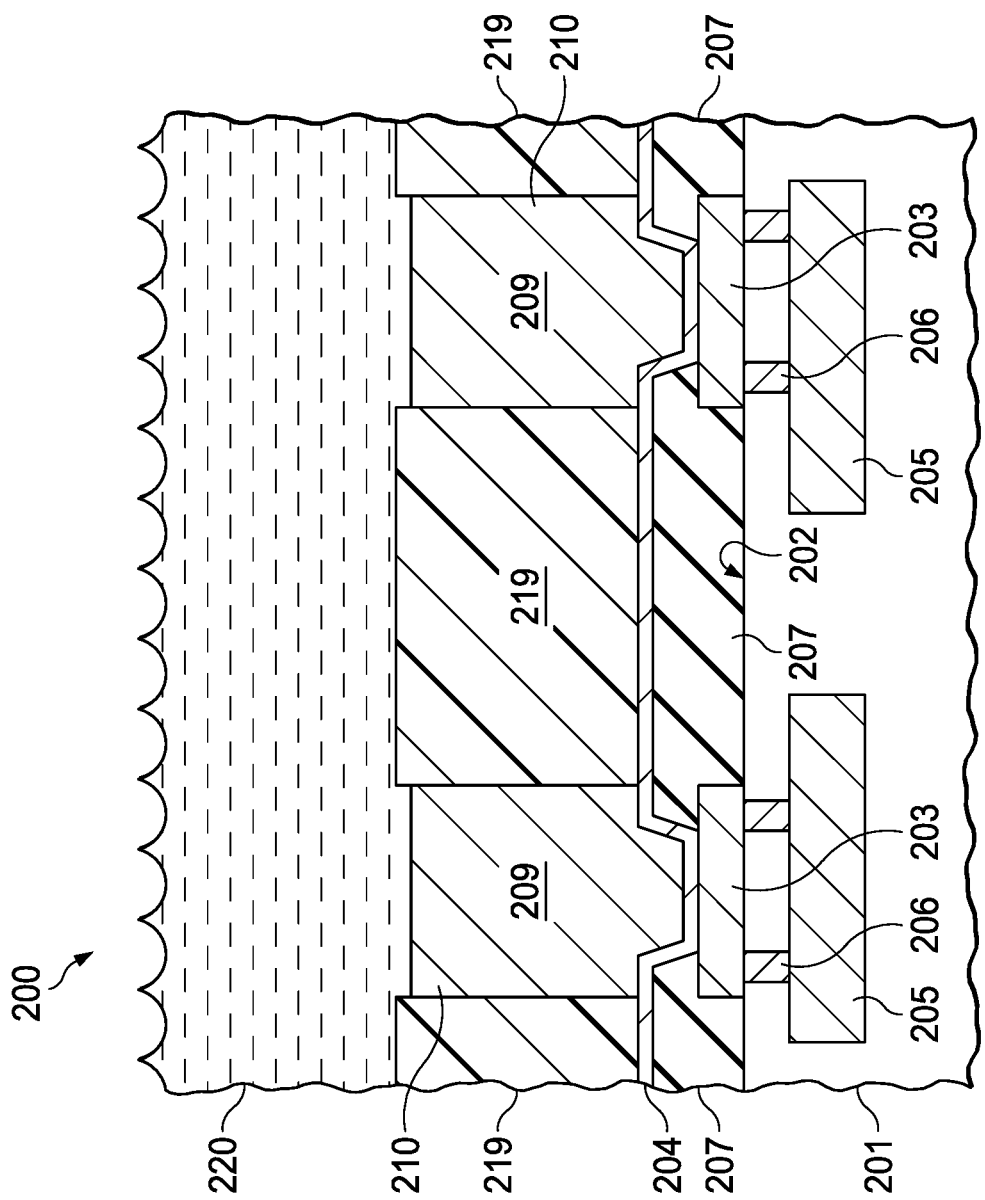

Referring to FIG. 2B, an electroplating process using a metal electroplating bath 220 forms electrically conductive pillars 209 on the seed layer 204 where exposed by the column plating mask 219. The metal electroplating bath 220 may include copper, for example in the form of copper sulfate, and may include additives such as levelers; suppressors, sometimes referred to as inhibitors; and accelerators, sometimes referred to as brighteners. The metal electroplating bath 220 may include other metals such as silver or nickel, to improve electrical or mechanical properties of the electrically conductive pillars 209.

The electrically conductive pillars 209 include columns 210 which extend from the seed layer 204 to a top surface of the column plating mask 219. The top surface of the column plating mask 219 is located opposite from the seed layer 204. FIG. 2B shows the electrically conductive pillars 209 partway to completion.

Figure 2C:
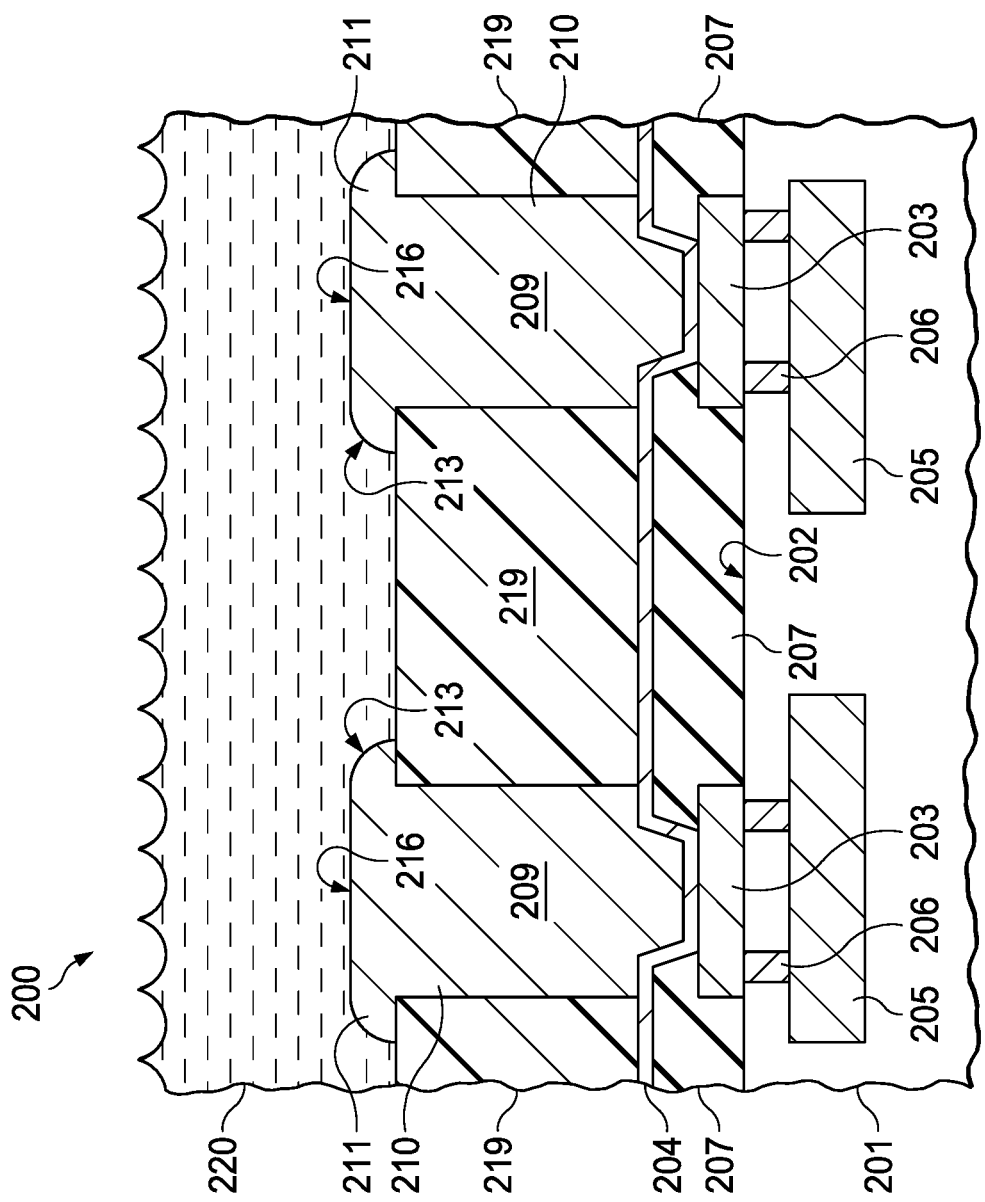

Referring to FIG. 2C, the electroplating process is continued using the metal electroplating bath 220 to form the electrically conductive pillars 209. Each electrically conductive pillar 209 includes the column 210 and an expanded head 211 on the column 210. The electroplating process is performed so as to mix the metal electroplating bath 220 sufficiently to provide isotropic metal plating on the electrically conductive pillars 209. The isotropic nature of the column electroplating process results in the expanded head 211 extending laterally past the column 210, and having a rounded side profile 213 and a flat contact surface 216 with the properties disclosed in reference to FIG. 1B. FIG. 2C shows the completed electrically conductive pillars 209.

Figure 2D:
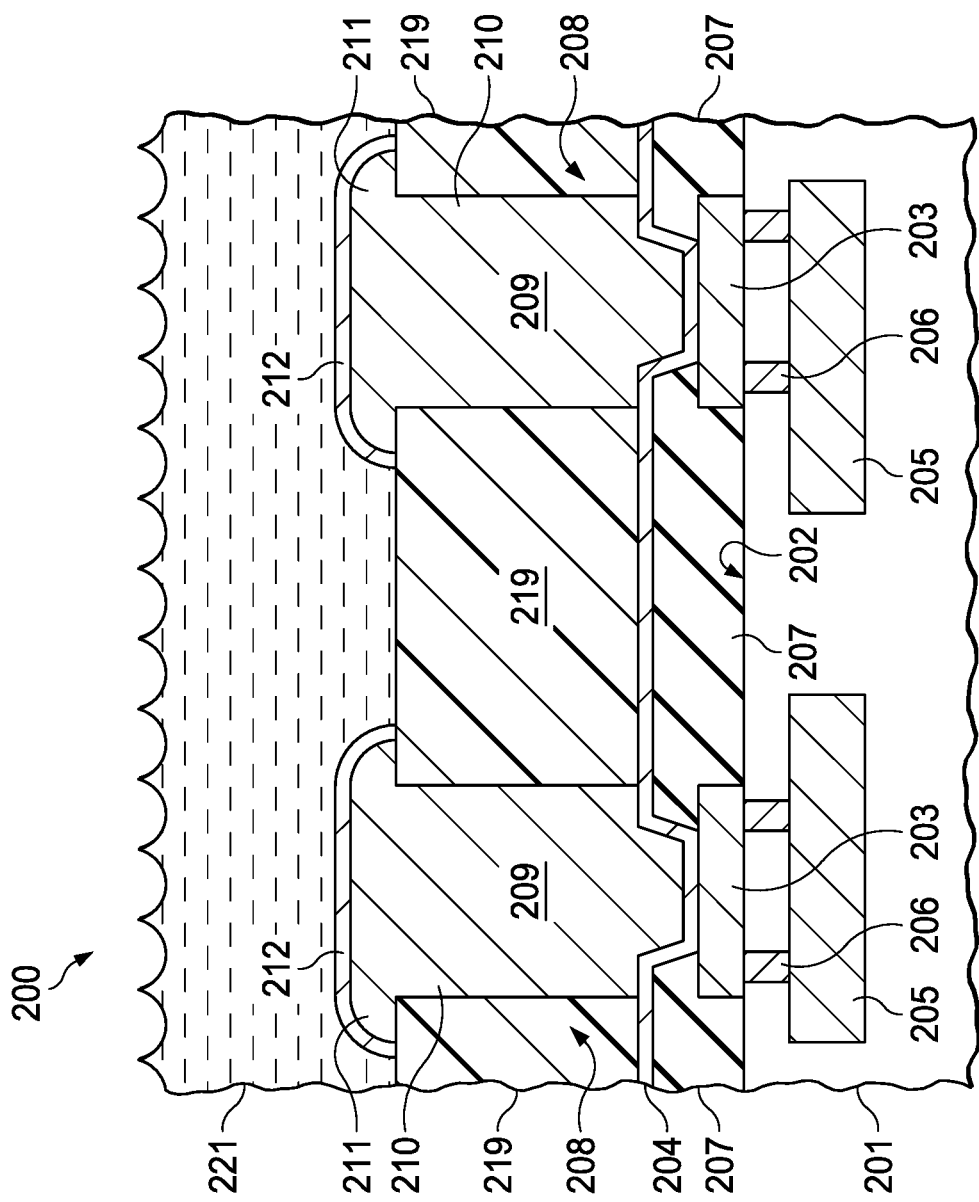

Referring to FIG. 2D, a solder electroplating process using a solder electroplating bath 221 forms solder 212 on the expanded heads 211. The solder 212 may include the metals disclosed in reference to the solder 112 of FIG. 1A. The column plating mask 219 may be left in place during the solder electroplating process, to prevent solder from forming on sides of the columns 210. An optional barrier layer, not shown in FIG. 2D, may be formed on the electrically conductive pillar 209 prior to forming the solder 212. The barrier layer may reduce formation of intermetallic compounds of copper from the electrically conductive pillar 209 and metals such as tin from the solder 212. The solder 212 and the electrically conductive pillar 209 together provide a bump bond structure 208.

Figure 2E:
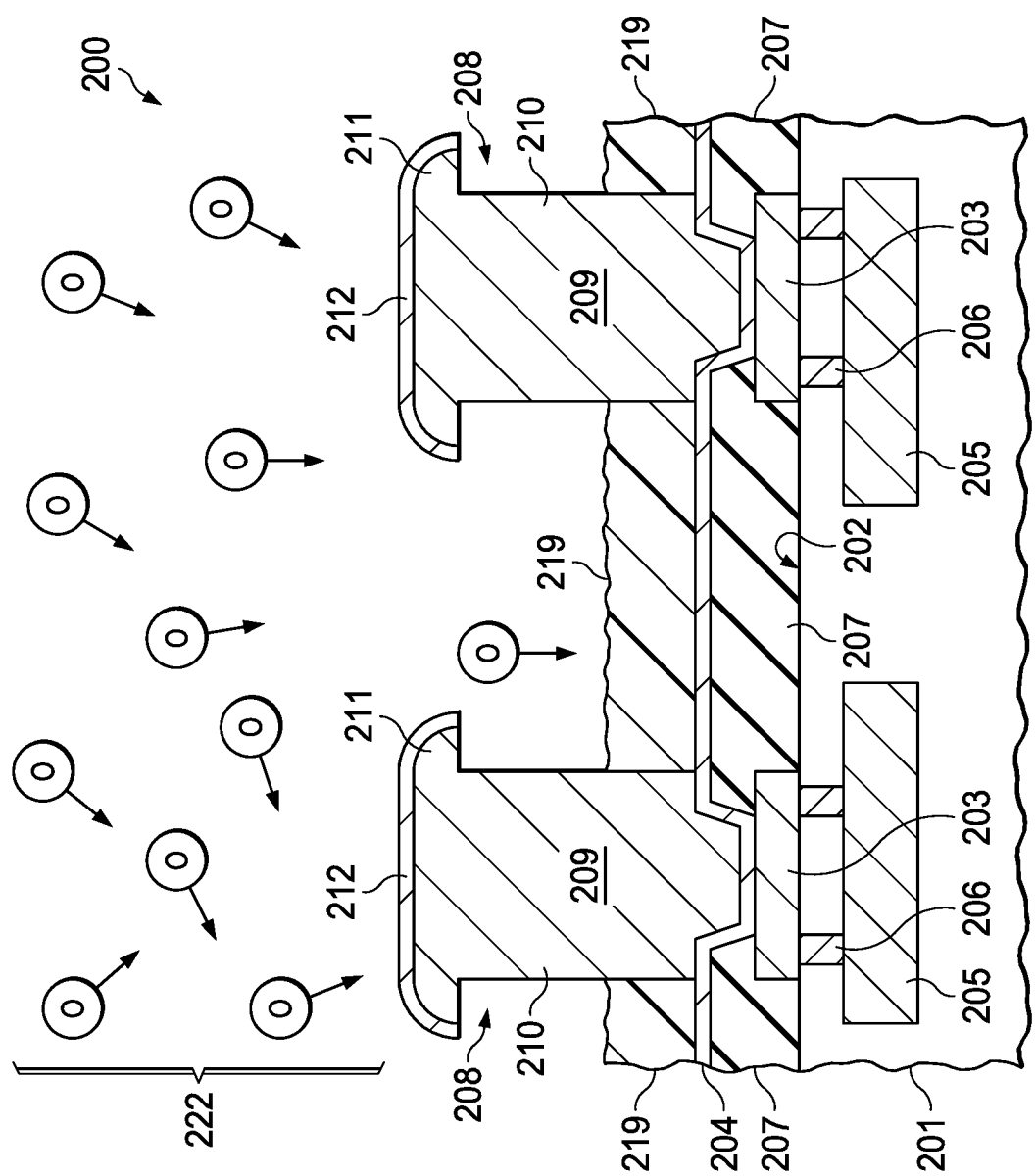

Referring to FIG. 2E, the column plating mask 219 is removed after the solder 212 is formed on the expanded heads 211. The column plating mask 219 may be removed using oxygen radicals 222, for example from an oxygen downstream asher, or an ozone generator. FIG. 2E shows the column plating mask 219 partway to complete removal. The column plating mask 219 may be removed by a wet clean process, or a combination of a process using the oxygen radicals followed by the wet clean process.

Figure 2F:
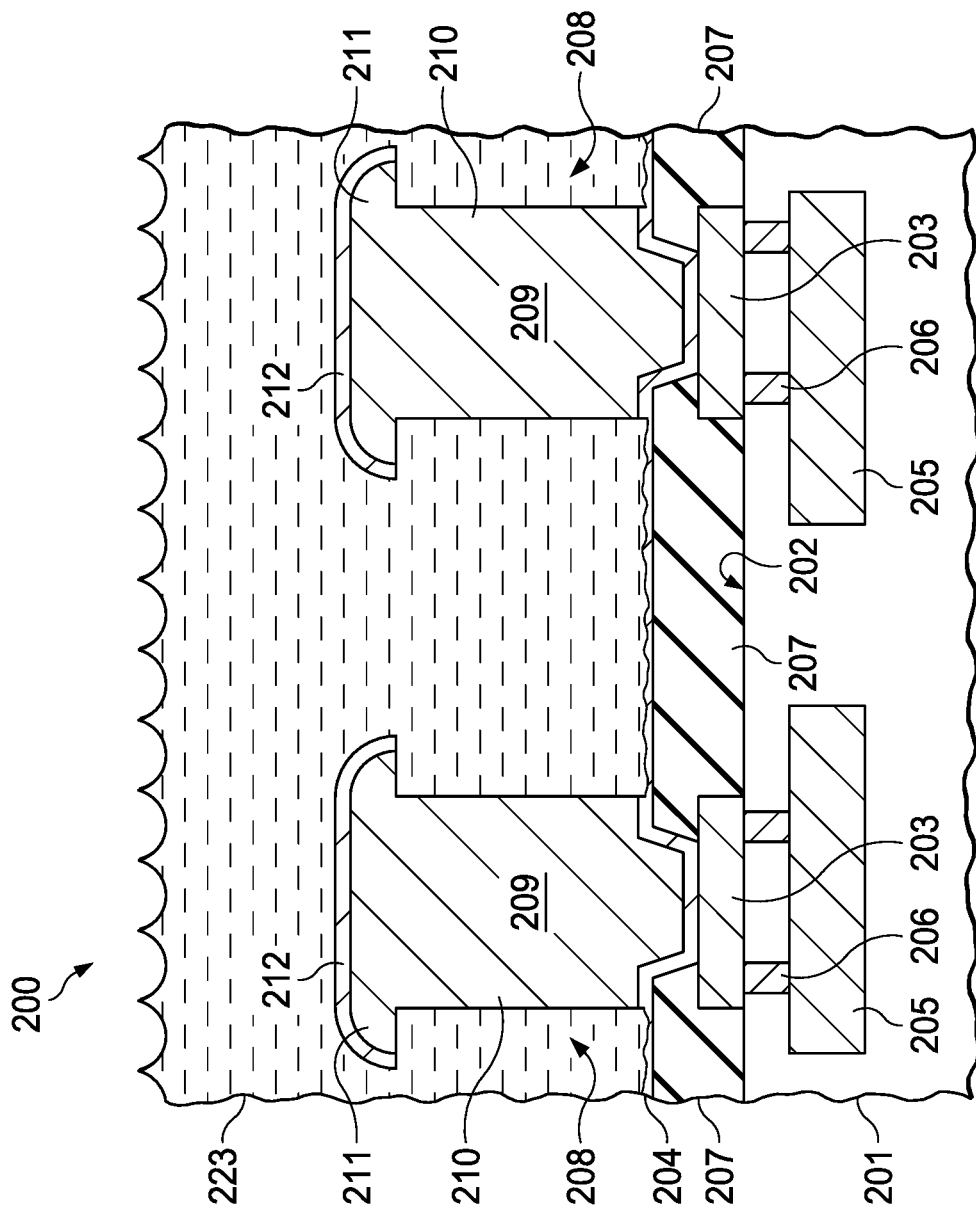

Referring to FIG. 2F, the seed layer 204 is removed where exposed by the electrically conductive pillars 209, leaving the seed layer 204 between the columns 210 and the I/O pads 203. The seed layer 204 may be removed by a wet etch process using an acid bath 223. The wet etch process may be timed to remove the seed layer 204 while keeping etching of the solder 212 and the electrically conductive pillar 209 within acceptable limits. FIG. 2F shows removal of the seed layer 204 partway to completion.

Figure 2G:
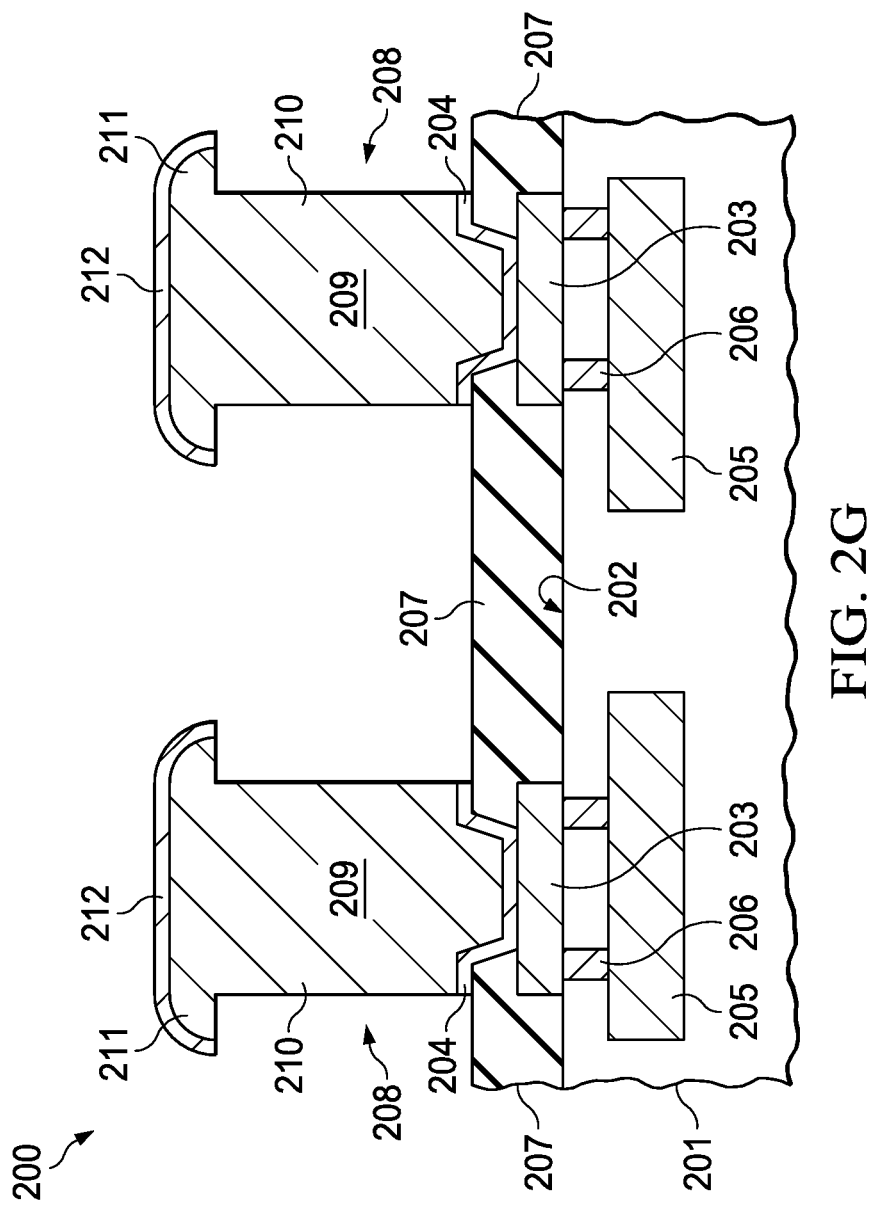

FIG. 2G depicts the microelectronic device 200 after formation of the bump bond structures 208 is completed. The microelectronic device 200 of the instant example may have a structure similar to the microelectronic device 100 of FIG. 1A, and may accrue similar advantages to those disclosed in reference to FIG. 1A through FIG. 1C.

Figure 3:
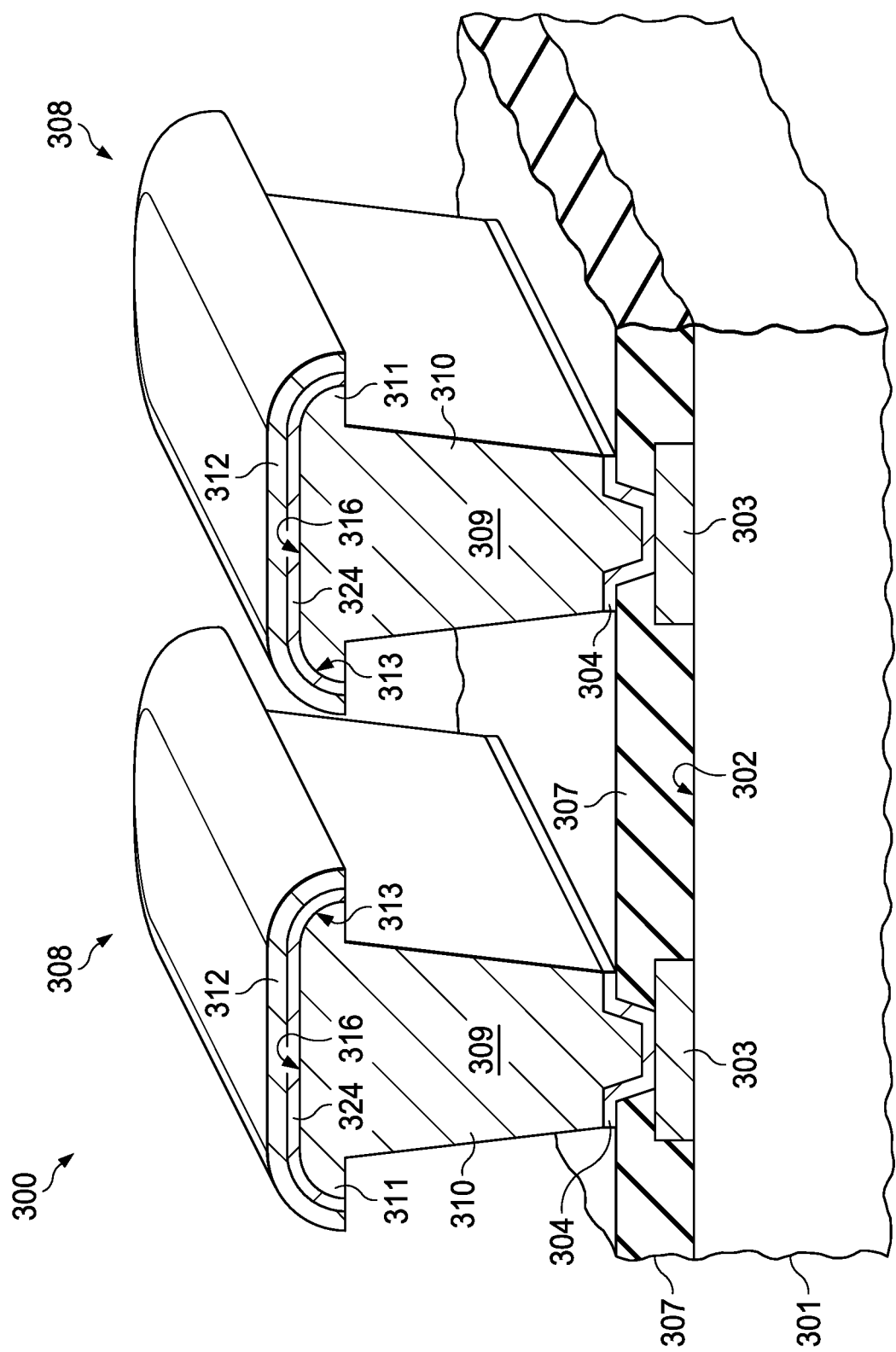
FIG. 3 is a cross section of another example microelectronic device which includes electrically conductive pillars with expanded heads.

FIG. 3 is a cross section of another example microelectronic device which includes electrically conductive pillars with expanded heads. The microelectronic device 300 has a substrate 301 with an I/O surface 302, and I/O pads 303 on the I/O surface 302. The substrate 301 may be, for example, a semiconductor wafer containing integrated circuits or discrete semiconductor components, or a MEMS wafer containing MEMS devices. A PO layer 307 may optionally be disposed over the I/O surface 302, with openings that expose the I/O pads 303. A seed layer 304 may be disposed on each I/O pad 303.

The microelectronic device 300 includes bump bond structures 308 on the I/O pads 303. Each bump bond structure 308 includes an electrically conductive pillar 309 having a column 310 and an expanded head 311. The column 310 extends from the corresponding I/O pad 303 to the expanded head 311. The column 310 may have a an elongated cross section, in a plane parallel to the I/O surface 302, as indicated in FIG. 3. The expanded head 311 is located on the column 310, opposite from the I/O pad 303. The column 310 may be continuous with the expanded head 311. The column 310 and the expanded head 311 may include any of the conducive materials disclosed in reference to FIG. 1A. In one version of the instant example, the column 310 and the expanded head 311 may include primarily copper.

The column 310 may have a tapered vertical profile, in which a width of the column 310 adjacent to the I/O pad 303 is less than a width of the column 310 adjacent to the expanded head 311, as depicted in FIG. 3. The term "vertical" refers to a direction perpendicular to the I/O surface 302. The tapered vertical profile may advantageously spread current through the column 310 compared to a similar column having a constant-width vertical profile. The expanded head 311 of the instant example extends laterally past the column 310, and has a rounded side profile 313 and a flat contact surface 316 with the properties disclosed in reference to FIG. 1B.

An optional barrier layer 324 may be disposed on the expanded head 311. The barrier layer 324 may include, for example, nickel, tungsten, cobalt, molybdenum, or other metals, which reduce diffusion of copper.

Each bump bond structure 308 includes solder 312 on the barrier layer 324. The solder 312 may include any of the metals disclosed in reference to the solder 112 of FIG. 1A. The barrier layer 324 may reduce formation of intermetallic compounds of copper from the electrically conductive pillar 309 and metals such as tin from the solder 312.

The bump bond structure 308 may accrue the advantages disclosed in reference to the bump bond structure 108 of FIG. 1A. The elongated cross section of the column 310 may enable a higher current on a specific lateral pitch than a similar bump bond structure with a column having a circular cross section.

Figure 4A:
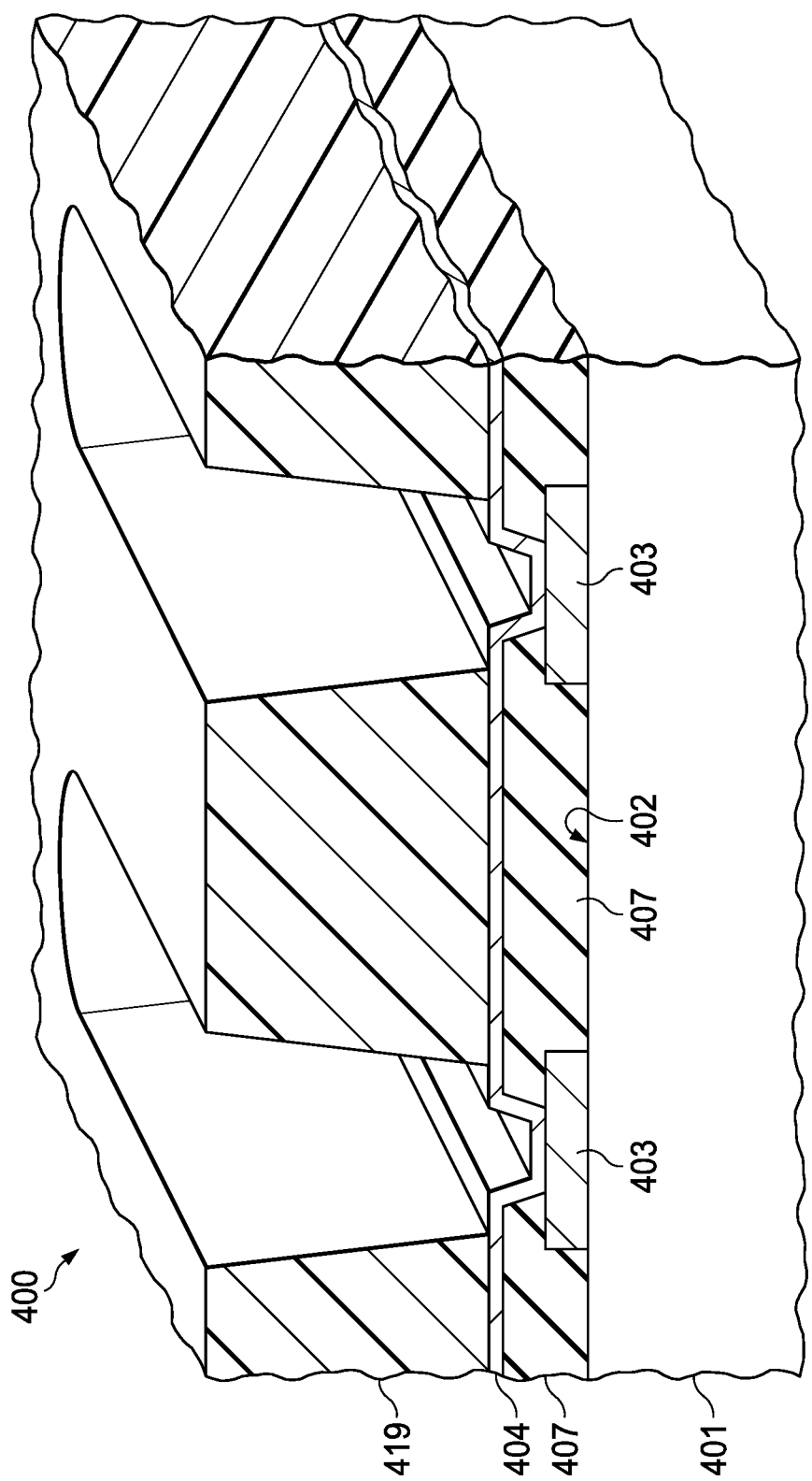
FIG. 4A through FIG. 4F are cross sections of a microelectronic device which includes electrically conductive pillars with expanded heads, depicted in stages of another example method of formation.

FIG. 4A through FIG. 4F are cross sections of a microelectronic device which includes electrically conductive pillars with expanded heads, depicted in stages of another example method of formation. Referring to FIG. 4A, the microelectronic device 400 has a substrate 401 with I/O pads 403 on an I/O surface 402. The substrate 401 may have the properties disclosed in reference to the substrate 101 of FIG. 1A. A PO layer 407 may be disposed over the I/O surface 402, with openings that expose the I/O pads 403.

A seed layer 404 is formed over the I/O surface 402, on the PO layer 407, if present. The seed layer 404 contacts the I/O pads 403, through the openings in the PO layer 407. The seed layer 404 provides an electrically conductive layer for a subsequent electroplating process. The seed layer 404 may include any of the metals disclosed in reference to the seed layer 104 of FIG. 1A. The seed layer 404 may be formed as disclosed in reference to the seed layer 204 of FIG. 2A.

A column plating mask 419 is formed over the seed layer 404. The column plating mask 419 exposes the seed layer 404 in areas over the I/O pads 403. The column plating mask 419 may include photoresist, and may be formed by a photolithographic process. In the instant example, the column plating mask 419 may have a tapered vertical profile, which may provide more process latitude for the photolithographic process than a similar plating mask with a constant-width vertical profile, advantageously reducing fabrication cost and complexity.

Figure 4B:
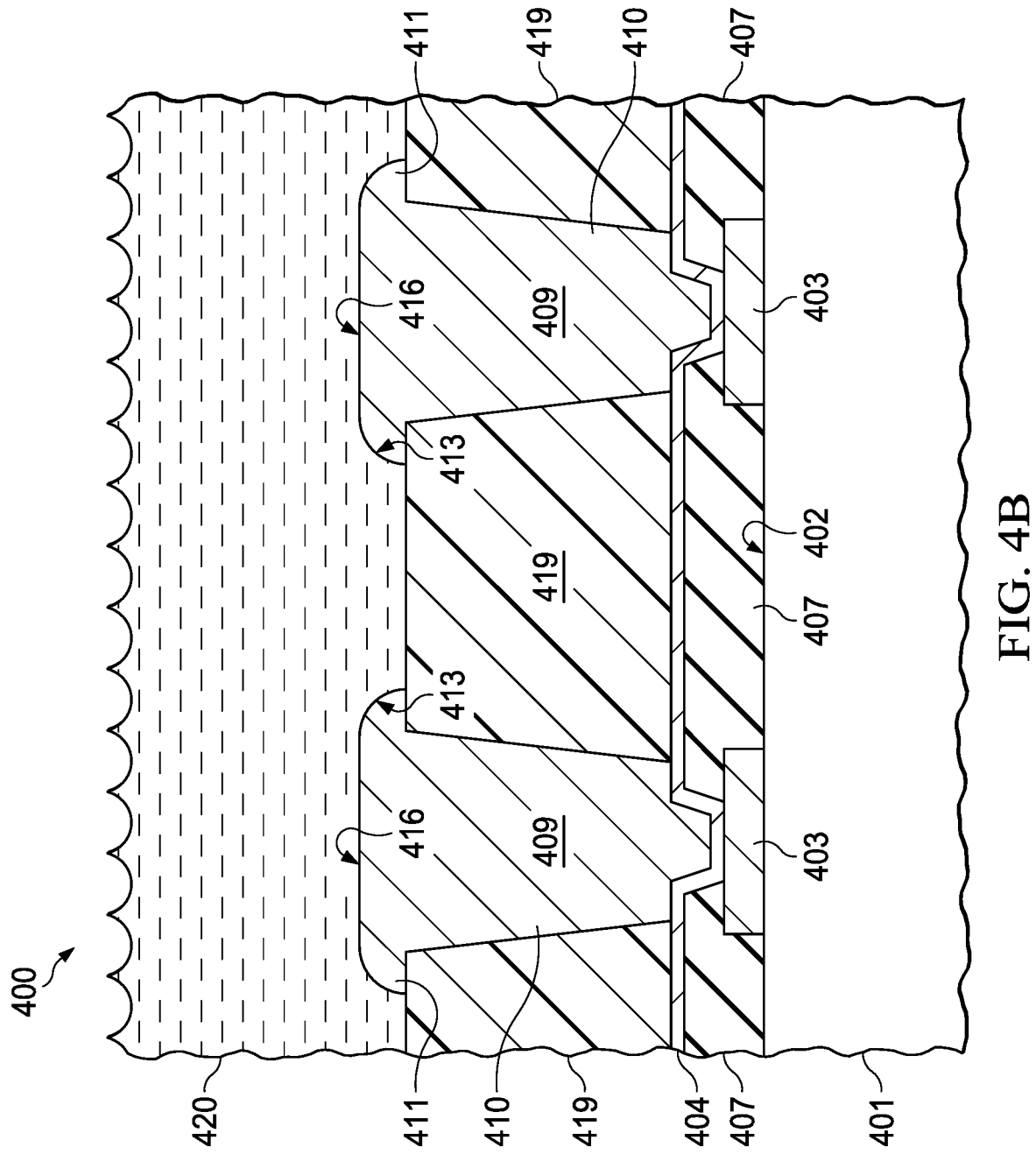

Referring to FIG. 4B, a column electroplating process using a metal electroplating bath 420 forms electrically conductive pillars 409 on the seed layer 404 where exposed by the column plating mask 419. The metal electroplating bath 420 may have a formulation similar to the metal electroplating bath 220 of FIG. 2B. The electrically conductive pillars 409 include columns 410 which extend from the seed layer 404 to a top surface of the column plating mask 419, and include expanded heads 411 on the columns 410. The top surface of the column plating mask 419 is located opposite from the seed layer 404. The column electroplating process is configured to provide isotropic metal plating on the electrically conductive pillars 409. The isotropic nature of the column electroplating process results in the expanded heads 411 extending laterally past the columns 410, and having rounded side profiles 413 and flat contact surfaces 416 with the properties disclosed in reference to FIG. 1B. FIG. 4B shows the completed electrically conductive pillars 409.

Figure 4C:
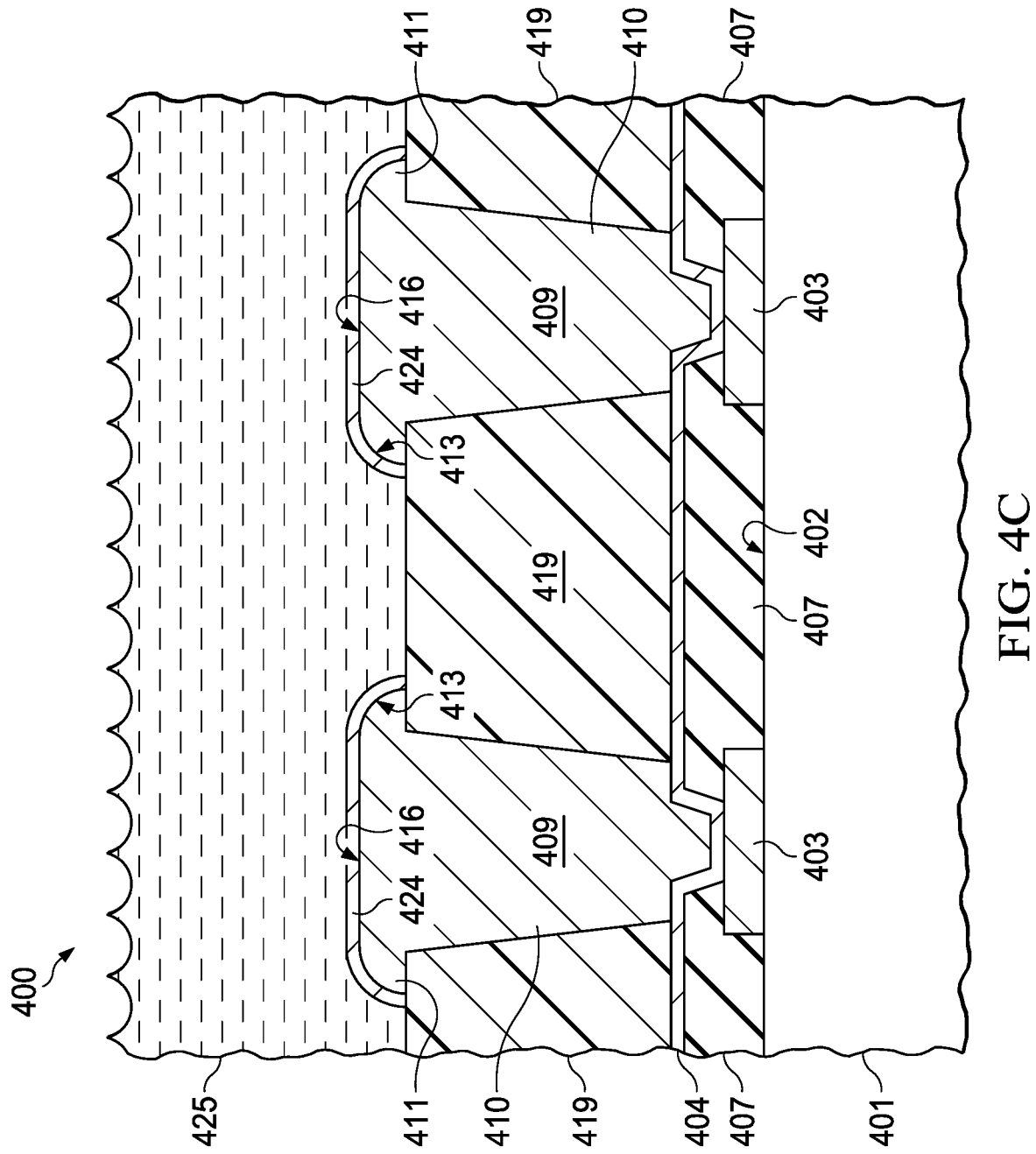

Referring to FIG. 4C, a barrier electroplating process using a barrier electroplating bath 425 forms a barrier layer 424 on the expanded heads 411. The barrier electroplating bath 425 may include, for example, nickel, cobalt, tungsten, molybdenum, or a combination thereof, and optionally other metals. The barrier electroplating process may use a pulse plating process or a reverse pulse plating process to form the barrier layer 424 with a desired composition and structure. The barrier layer 424 may have a composition as disclosed in reference to the barrier layer 324 of FIG. 3.

Figure 4D:
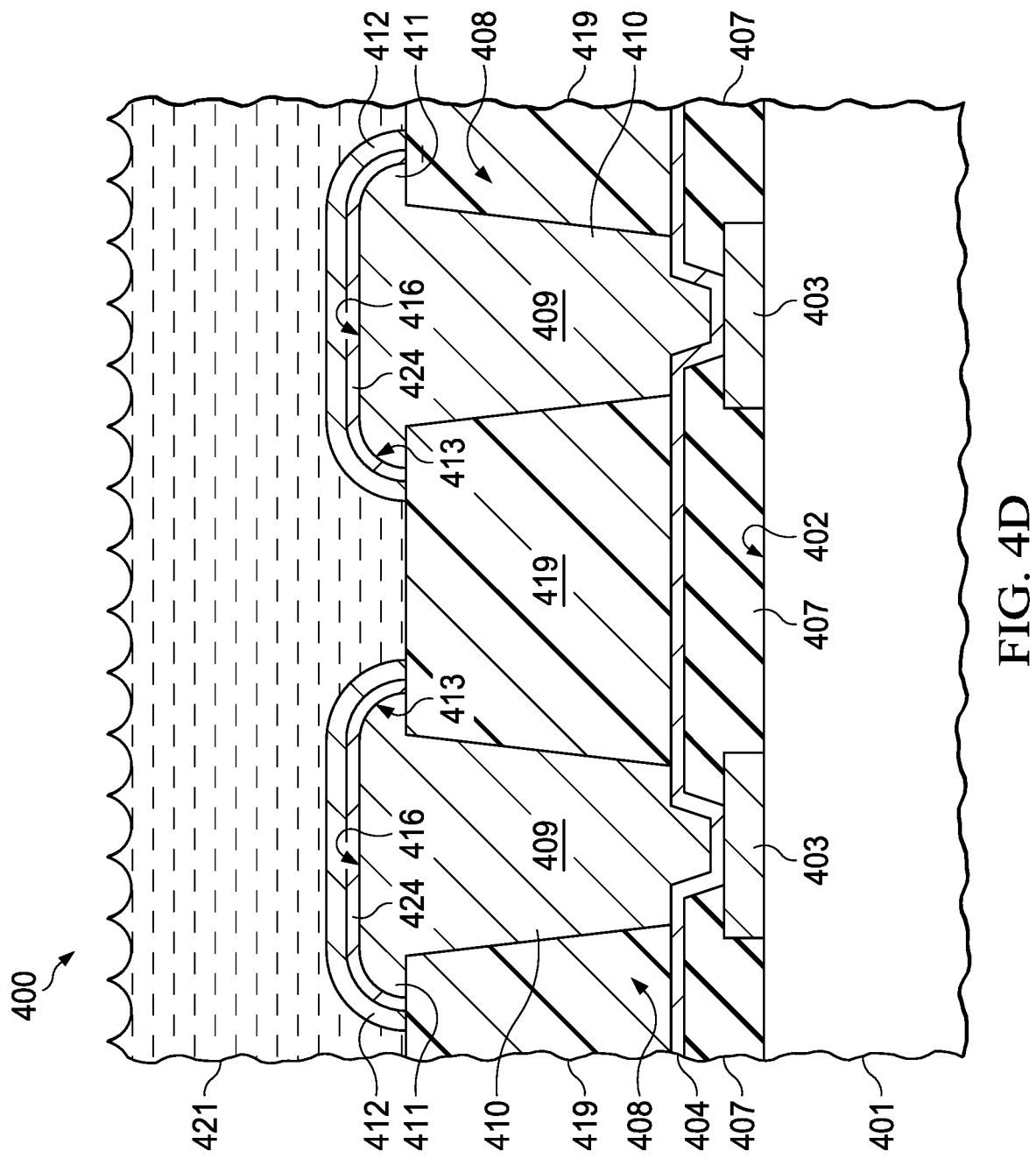

Referring to FIG. 4D, a solder electroplating process using a solder electroplating bath 421 forms solder 412 on the barrier layer 424. The solder 412 may include the metals disclosed in reference to the solder 112 of FIG. 1A. The column plating mask 419 may be left in place during the solder electroplating process. The barrier layer 424 may reduce formation of intermetallic compounds of copper from the electrically conductive pillars 409 and metals such as tin from the solder 412. The solder 412, the barrier layer 424, and the electrically conductive pillars 409 together provide bump bond structures 408.

Figure 4E:
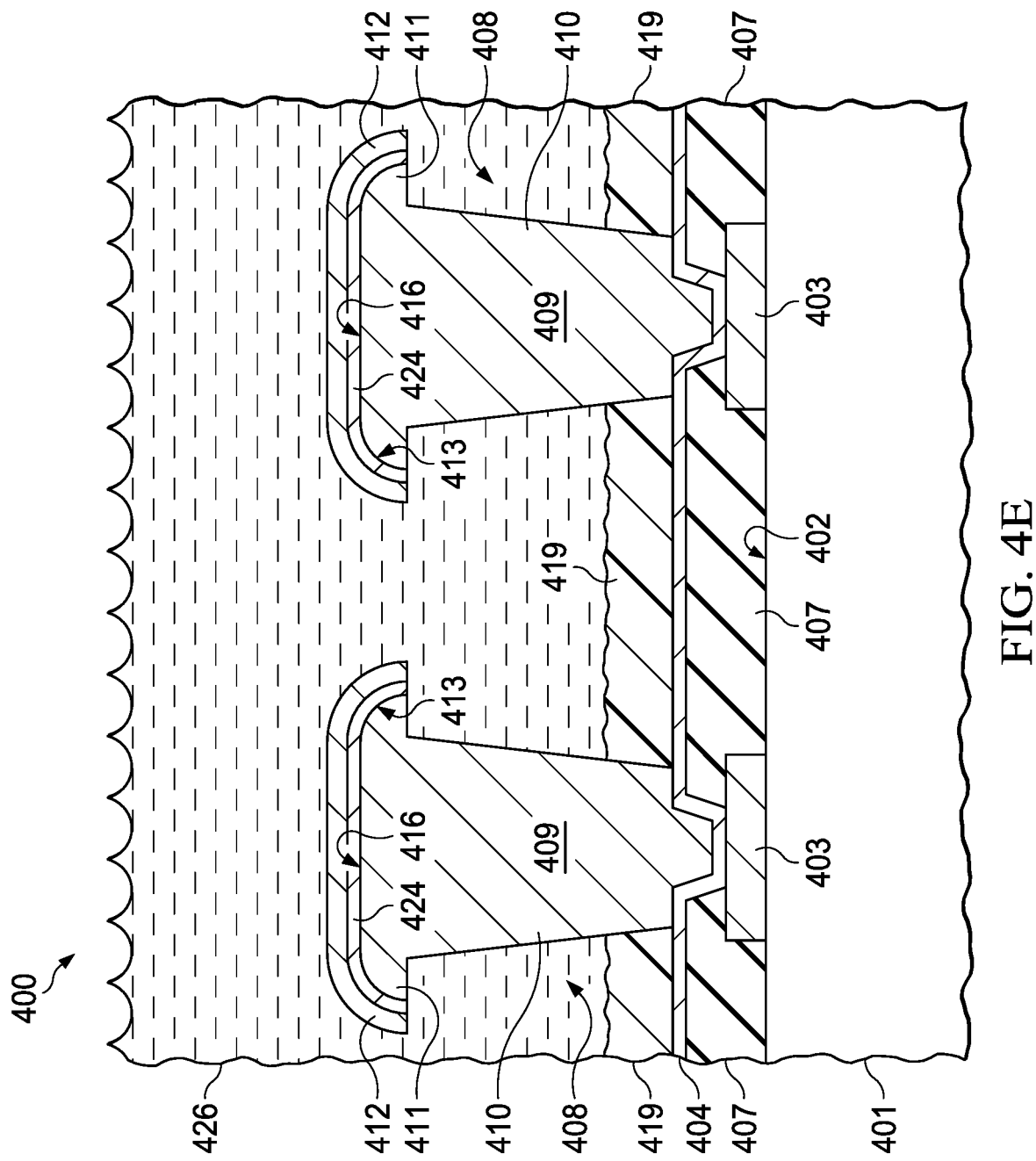

Referring to FIG. 4E, the column plating mask 419 is removed after the solder 412 is formed on the expanded heads 411. The column plating mask 419 may be removed using a wet clean solution 426. The wet clean solution 426 may include solvents such as n-methyl-2-pyrrolidine (NMP) or dimethyl sulfoxide (DMSO). Proprietary formulations of resist removal chemicals for the wet clean solution 426 are commercially available from several suppliers. FIG. 4E shows removal of the column plating mask 419 partway to completion. The wet clean solution 426 may be used in combination with other processes such as an asher process to remove the column plating mask 419.

Figure 4F:
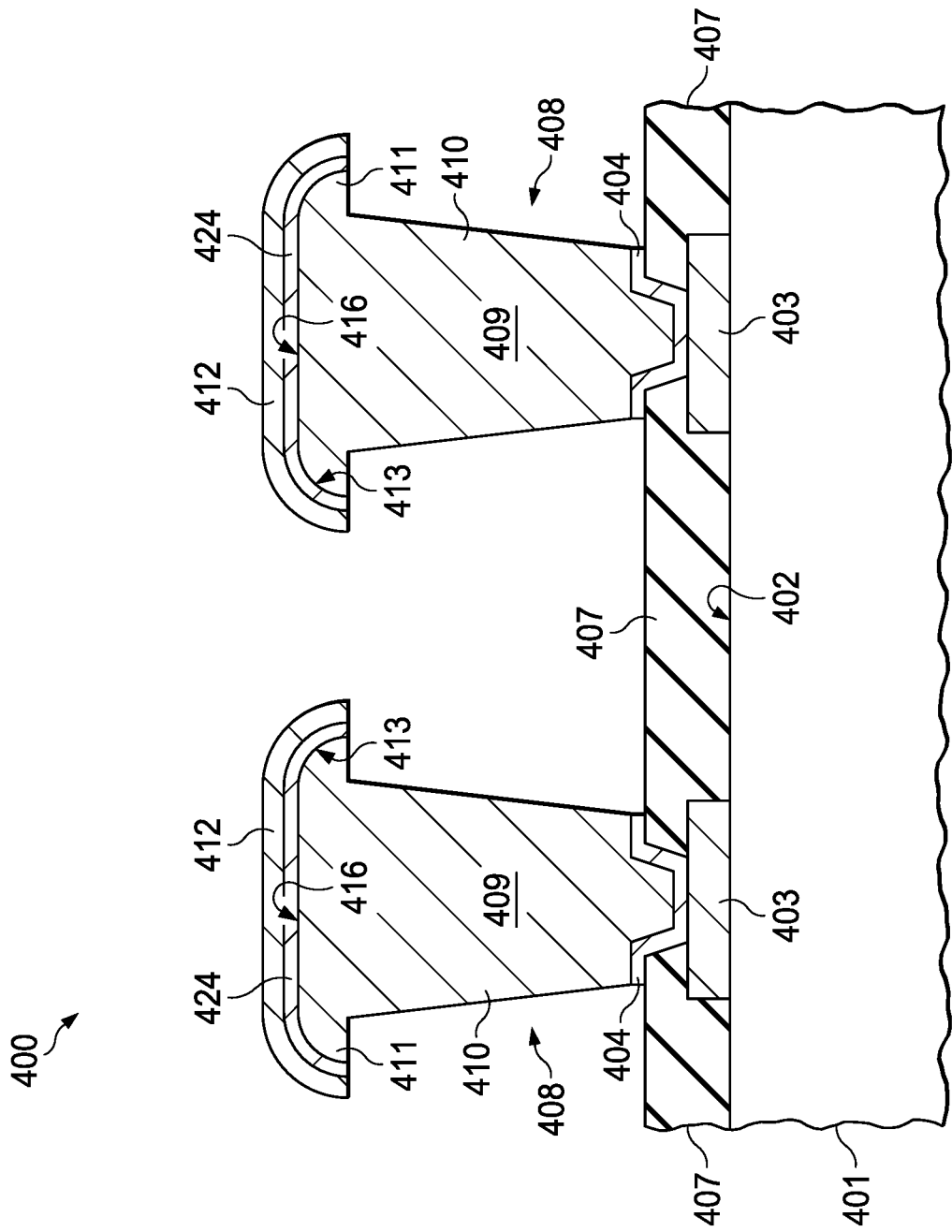

Referring to FIG. 4F, the seed layer 404 is removed where exposed by the electrically conductive pillars 409, leaving the seed layer 404 between the columns 410 and the I/O pads 403. The seed layer 404 may be removed as disclosed in reference to FIG. 2F.

Figure 5A:
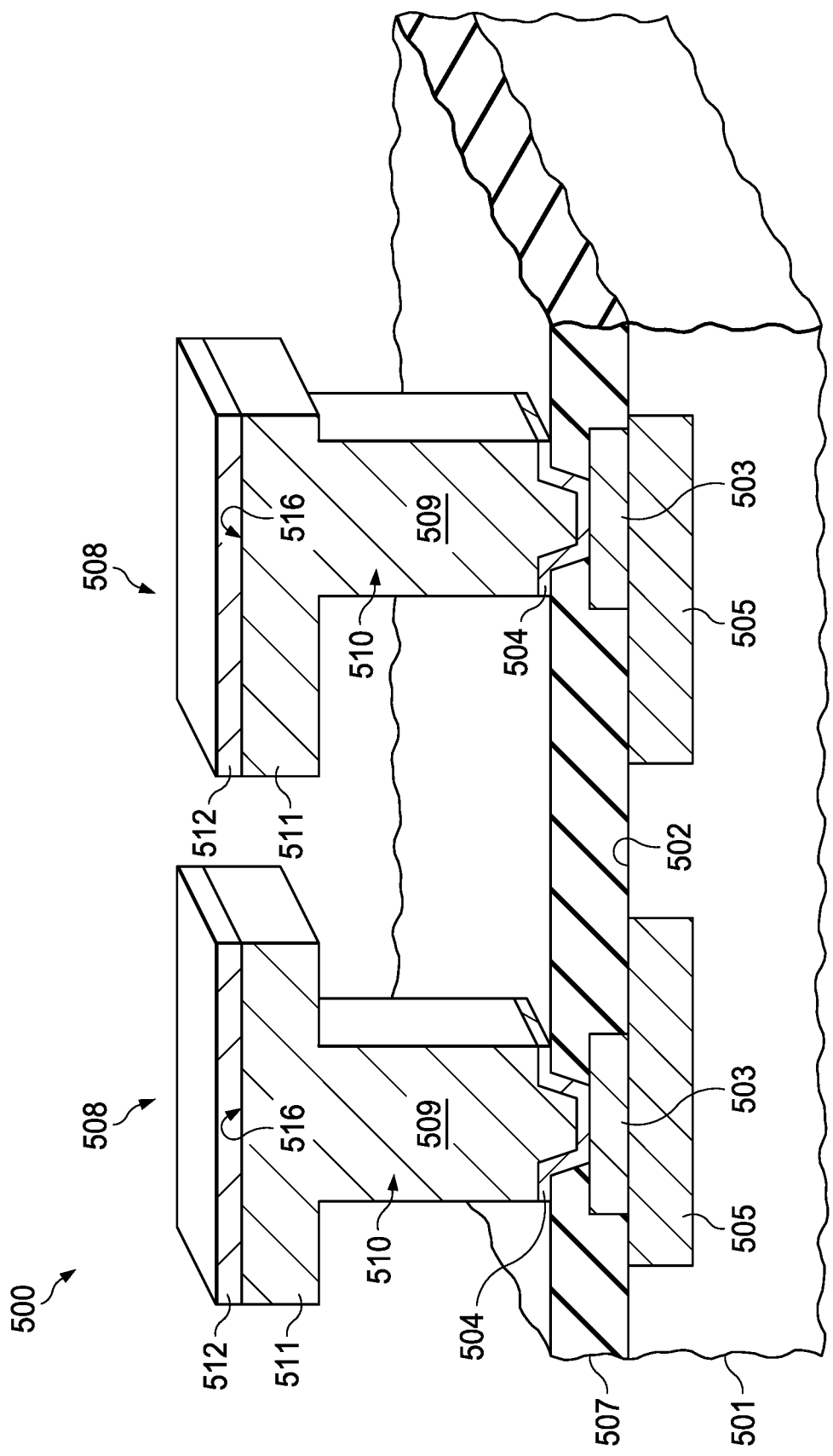
FIG. 5A through FIG. 5C are cross sections of a further example microelectronic device which includes electrically conductive pillars with expanded heads.
Figure 5B:
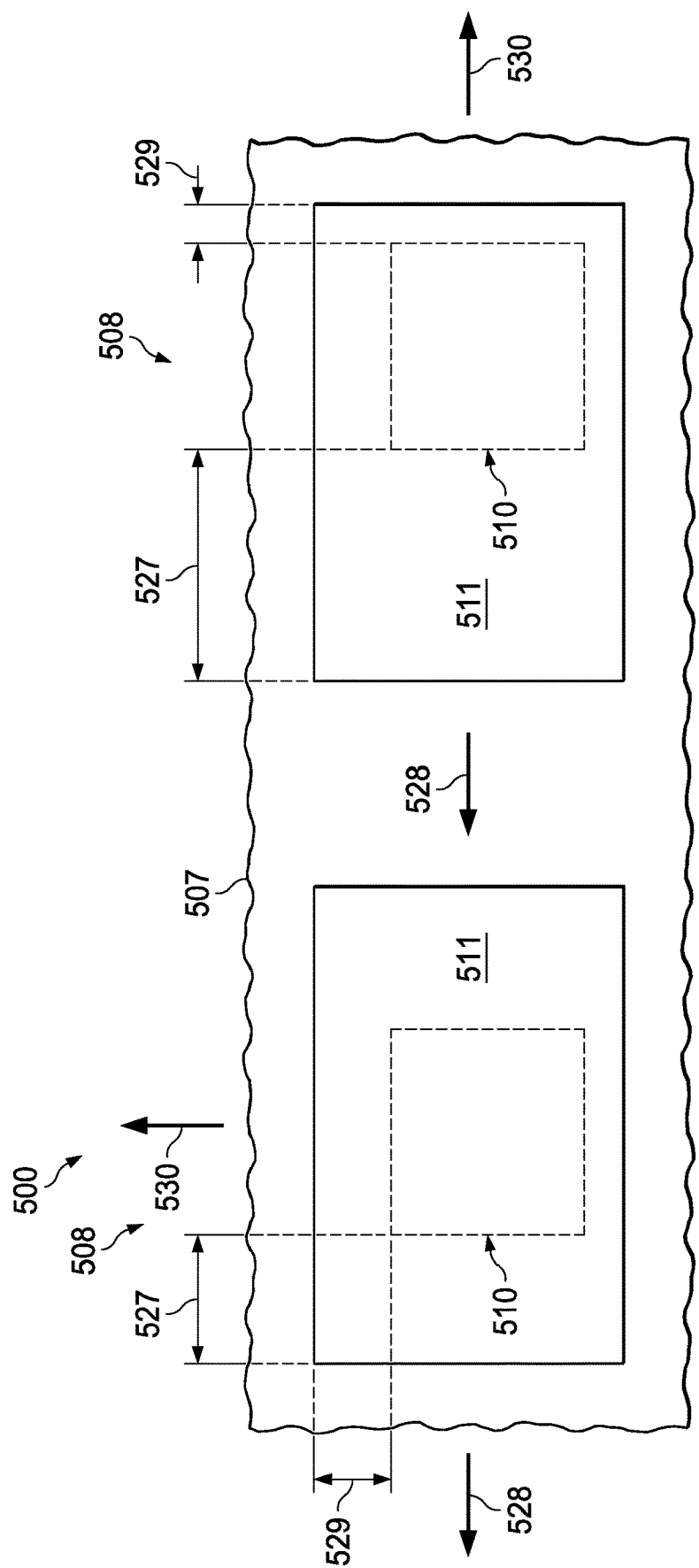
Figure 5C:
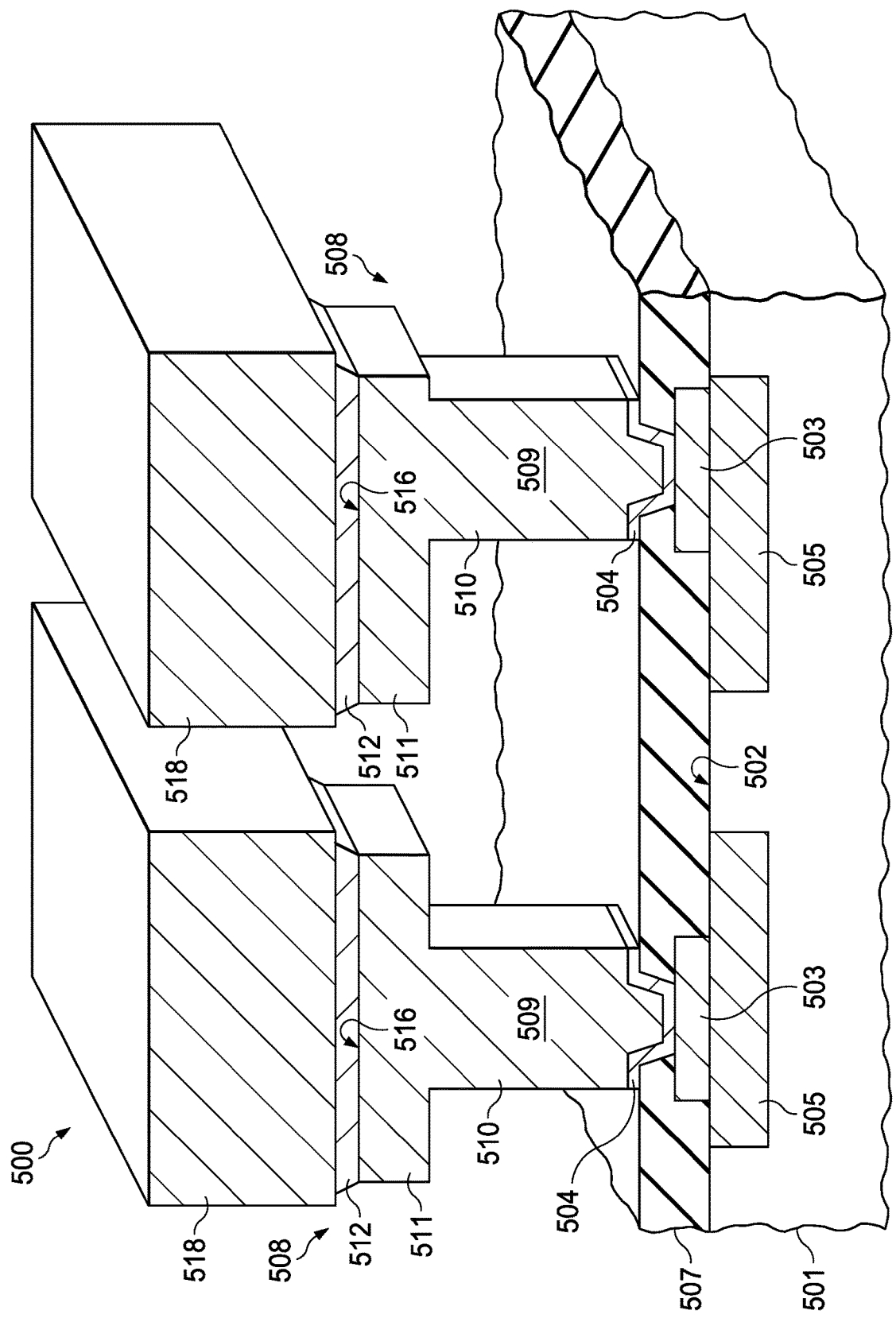

FIG. 5A through FIG. 5C are cross sections of a further example microelectronic device which includes electrically conductive pillars with expanded heads. The microelectronic device 500 has a substrate 501 with an I/O surface 502, and I/O pads 503 on the I/O surface 502. The substrate 501 may be, for example, a semiconductor wafer containing integrated circuits or discrete semiconductor components, or a MEMS wafer containing MEMS devices. A PO layer 507 may optionally be disposed over the I/O surface 502, with openings that expose the I/O pads 503. A seed layer 504 may be disposed on each I/O pad 503. The seed layer 504 may have a composition similar to the seed layer 104 of FIG. 1A.

The microelectronic device 500 includes bump bond structures 508 on the I/O pads 503. Each bump bond structure 508 includes an electrically conductive pillar 509 having a column 510 and an expanded head 511. The column 510 extends from the corresponding I/O pad 503 to the expanded head 511. The expanded head 511 is located on the column 510, opposite from the I/O pad 503. The column 510 may be continuous with the expanded head 511. The column 510 and the expanded head 511 may include any of the electrically conductive materials disclosed in reference to FIG. 1A. In one version of the instant example, the column 510 and the expanded head 511 may include primarily copper. Each bump bond structure 508 further includes solder 512 disposed on the expanded head 511.

Each expanded head 511 has a flat contact surface 516. In the instant example, the flat contact surface 516 may extend to a lateral perimeter of the expanded head 511, as depicted in FIG. 5A. The solder 512 may similarly extend to the lateral perimeter of the expanded head 511.

FIG. 5B is a top view of the bump bond structures 508. Each expanded head 511 of the instant example extends laterally past the corresponding column 510 by a first lateral distance 527 in a first lateral direction 528, and by a second lateral distance 529 in a second lateral direction 530, wherein the first lateral distance 527 is greater than the second lateral distance 529. The second lateral distance 529 may optionally be close to, or approximately, zero, in some cases, so that a lateral surface of the expanded head 511 in the second lateral direction 530 is substantially even with a lateral surface of the column 510 in the second lateral direction 530. The second lateral direction 530 extends in a different direction from the first lateral direction 528. In one example, the first lateral direction 528 and the second lateral direction 530 may be oriented at right angles to each other. In another example, the first lateral direction 528 and the second lateral direction 530 may be of the oriented in opposite directions. Relative orientations of the first lateral direction 528 and the second lateral direction 530 may vary among instances of the bump bond structures 508 of the same microelectronic device 500.

FIG. 5C depicts the microelectronic device 500 assembled into a package structure, such as a lead frame or chip carrier. The bump bond structures 508 are soldered to package electrodes 518 of the package structure, which may be manifested as leads 518. The solder 512 couples each electrically conductive pillar 509 to the corresponding lead 518. Having the configurations of the expanded heads 511 relative to the corresponding columns 510 may provide a more space-efficient arrangement of the I/O pads 503 with respect to the leads 518, thus advantageously enabling a smaller package structure for a given size of the microelectronic device 500.

Figure 6A:
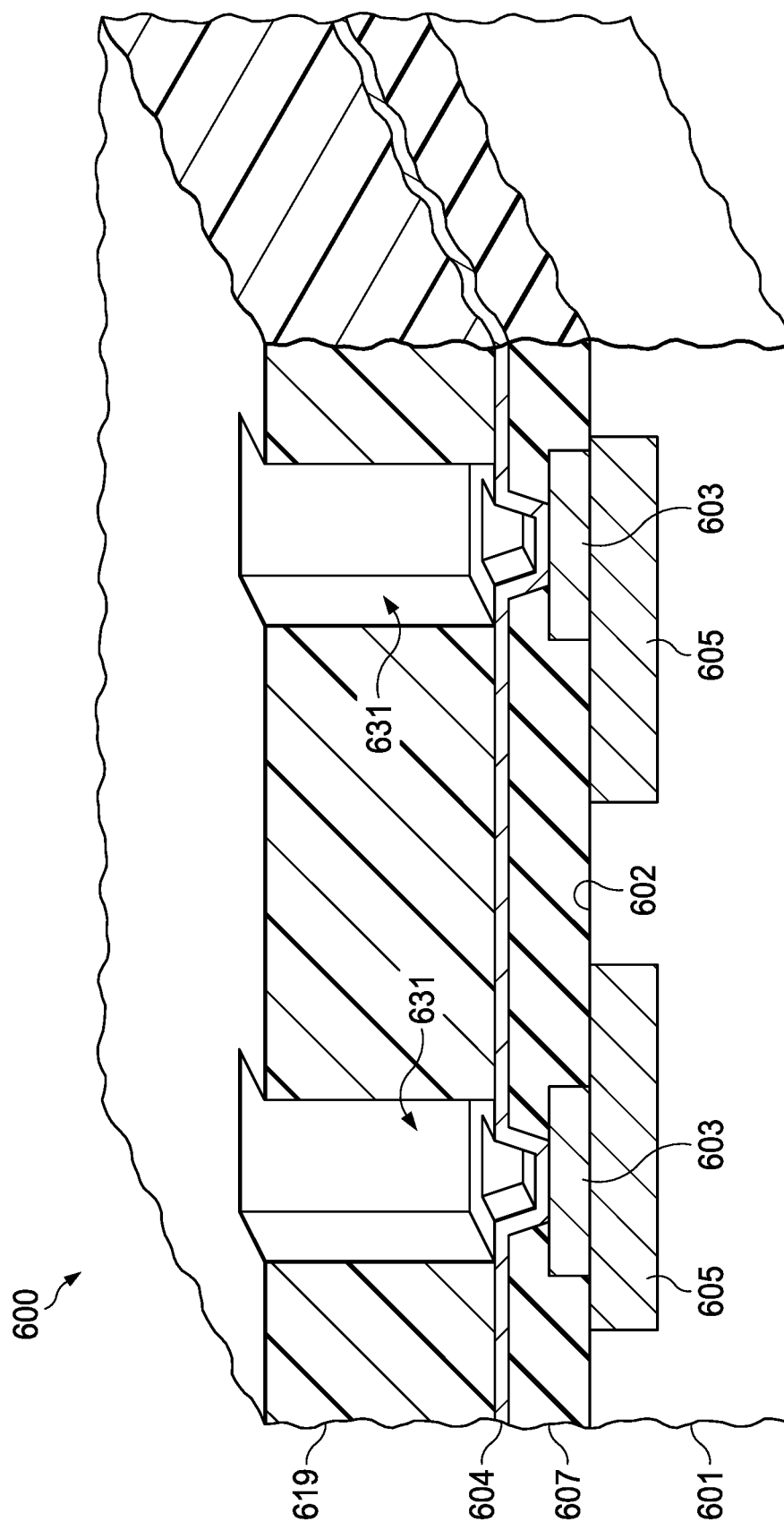
FIG. 6A through FIG. 6E are cross sections of a microelectronic device which includes electrically conductive pillars with expanded heads, depicted in stages of another example method of formation.

FIG. 6A through FIG. 6E are cross sections of a microelectronic device which includes electrically conductive pillars with expanded heads, depicted in stages of another example method of formation. Referring to FIG. 6A, the microelectronic device 600 has a substrate 601 with an I/O surface 602, and I/O pads 603 on the I/O surface 602. The substrate 601 may be similar to the substrate 101 of FIG. 1A. A PO layer 607 may optionally be disposed over the I/O surface 602, with openings that expose the I/O pads 603.

A seed layer 604 is formed over the I/O surface 602, on the PO layer 607, if present. The seed layer 604 contacts the I/O pads 603, through the openings in the PO layer 607. The seed layer 604 provides an electrically conductive layer for a subsequent electroplating process, and may include any of the metals disclosed in reference to the seed layer 104 of FIG. 1A. The seed layer 604 may be formed as disclosed in reference to the seed layer 204 of FIG. 2A.

A column plating mask 619 is formed over the seed layer 604. The column plating mask 619 has column openings 631 which expose the seed layer 604 in areas over the I/O pads 603. The column plating mask 619 may include a first photoresist, and may be formed by a first photolithographic process. In one case, the first photoresist may be a negative photoresist, which becomes insoluble in a developer solution after being exposed to ultraviolet (UV) light, and thus is not sensitive to a second exposure of UV light. In another case, the first photoresist may be a positive photoresist, which becomes soluble in a developer solution after being exposed to UV light; in such a case, the column plating mask 619 may be desensitized to UV light, for example by blanket exposure to UV light followed by a bake operation.

Figure 6B:
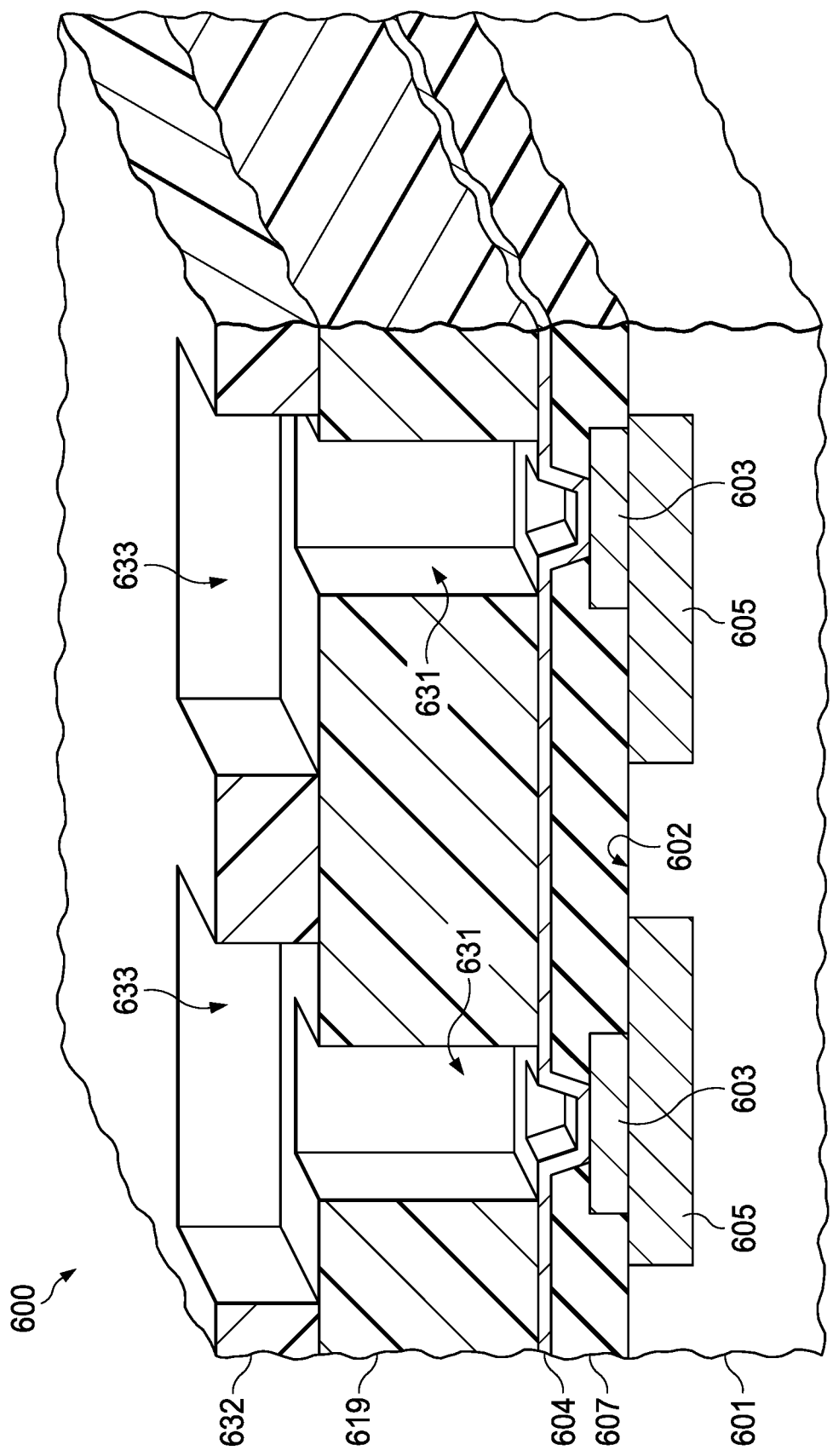

Referring to FIG. 6B, a head plating mask 632 is formed over the column plating mask 619. The head plating mask 632 has head openings 633 which expose the column openings 631 in the column plating mask 619 and expose areas on a top surface of the column plating mask 619 around each column opening 631, as shown in FIG. 6B. The head plating mask 632 may include a second photoresist and may be formed by a second photolithographic process. The first photoresist and the first photolithographic process may be selected for compatibility with the second photoresist and the second photolithographic process. For example, the first photoresist and the second photoresist may both be negative photoresists, or may both be positive photoresists. Forming the head plating mask 632 and the column plating mask 619 using photolithographic processes may advantageously be compatible with existing electrically conductive pillar processes in a fabrication facility making the microelectronic device 600.

Figure 6C:
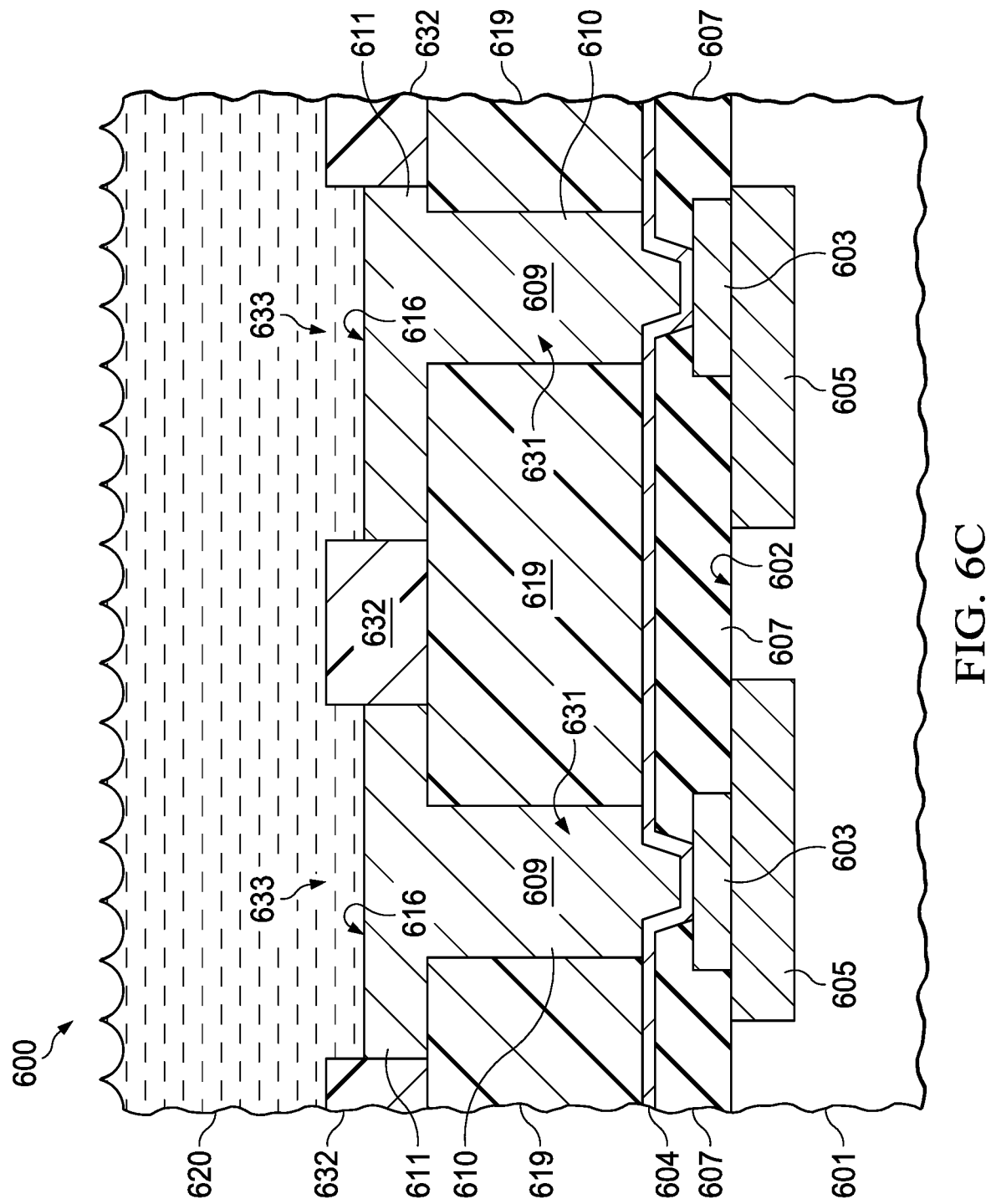

Referring to FIG. 6C, a column electroplating process using a metal electroplating bath 620 forms electrically conductive pillars 609 on the seed layer 604 in the column openings 631 of the column plating mask 619 and the head openings 633 of the head plating mask 632. The metal electroplating bath 620 may have a formulation similar to the metal electroplating bath 220 of FIG. 2B. The electrically conductive pillars 609 include columns 610 which extend from the seed layer 604 to a top surface of the column plating mask 619, and include expanded heads 611 on the columns 610 in the head openings 633 of the head plating mask 632. The top surface of the column plating mask 619 is located opposite from the seed layer 604. The column electroplating process may be configured to provide contact surfaces 616 that are flat on the expanded heads 611. The expanded heads 611 extend laterally past the columns 610, with the configurations disclosed in reference to FIG. 5B. FIG. 6C shows the completed electrically conductive pillars 609.

Figure 6D:
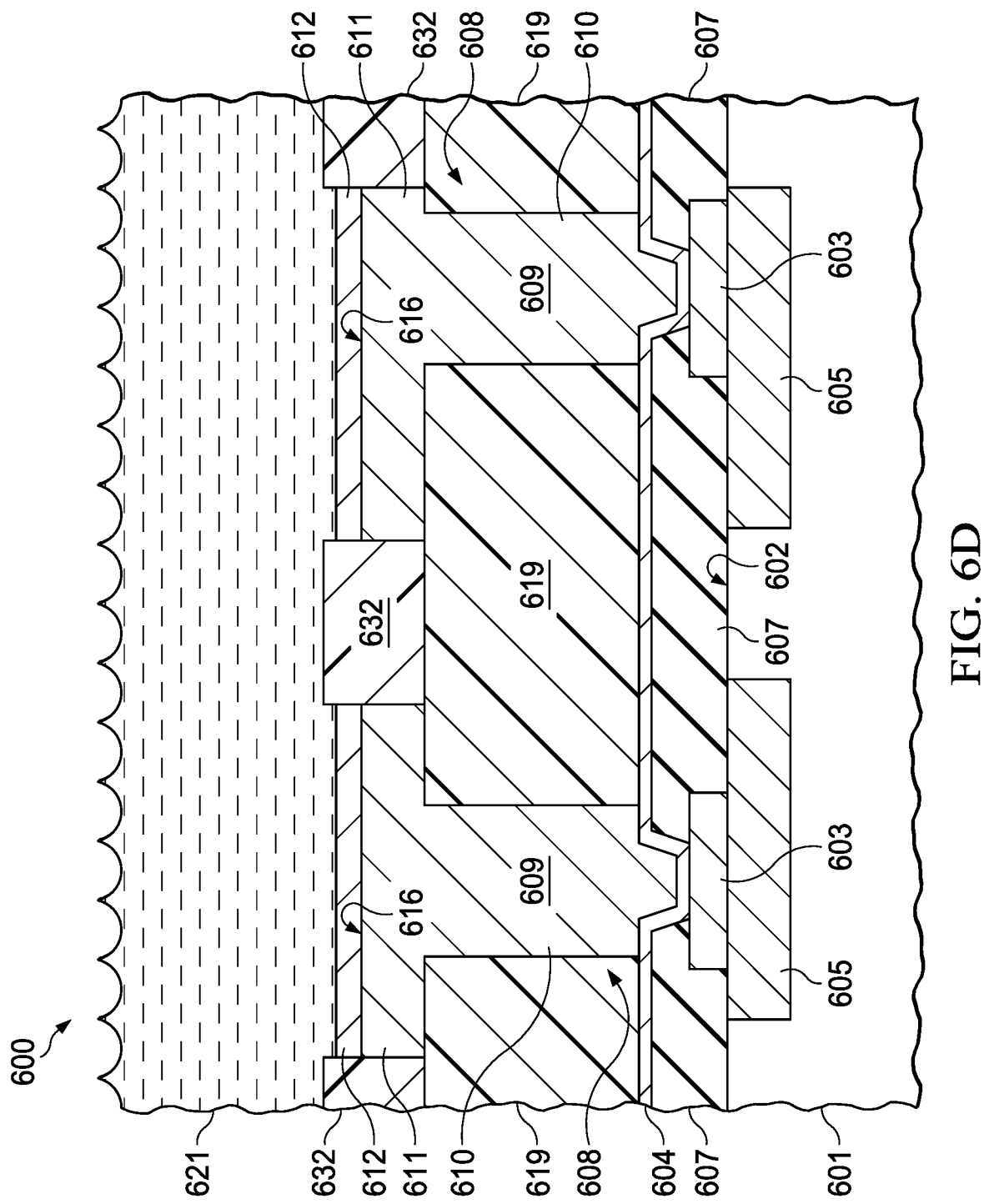

Referring to FIG. 6D, a solder electroplating process using a solder electroplating bath 621 forms solder 612 on the contact surfaces 616. The solder 612 may include the metals disclosed in reference to the solder 112 of FIG. 1A. The column plating mask 619 and the head plating mask 632 may be left in place during the solder electroplating process, so that the solder 612 extends to lateral perimeters of the expanded heads 611. The solder 612 and the electrically conductive pillars 609 together provide bump bond structures 608.

Figure 6E:
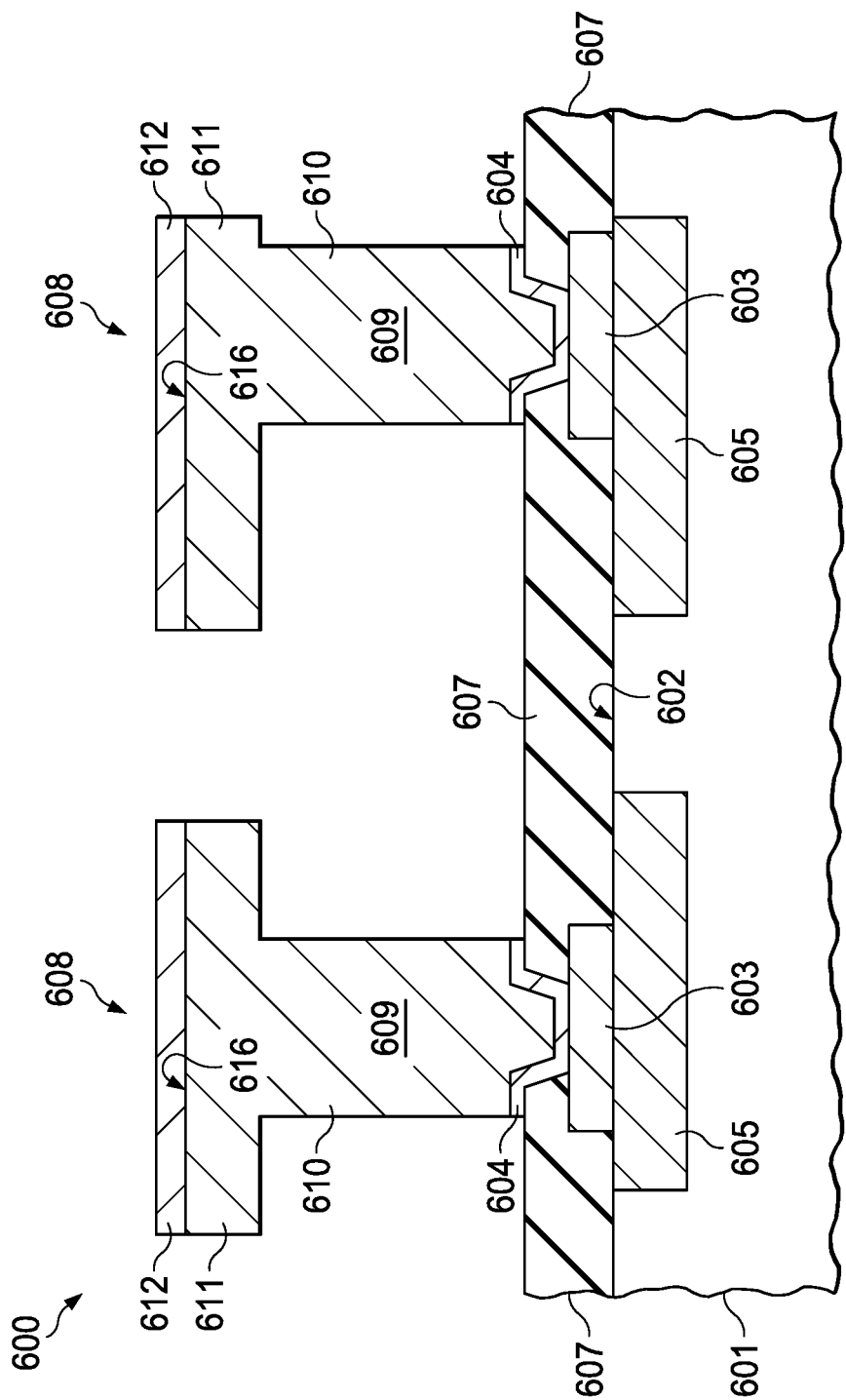

Referring to FIG. 6E, the column plating mask 619 and the head plating mask 632 of FIG. 6D are removed after the solder 612 is formed on the expanded heads 611. The column plating mask 619 and the head plating mask 632 may be removed, for example, using any of the methods disclosed in reference to FIG. 2E or FIG. 4E. Subsequently, the seed layer 604 is removed where exposed by the electrically conductive pillars 609, leaving the seed layer 604 between the columns 610 and the I/O pads 603. The seed layer 604 may be removed as disclosed in reference to FIG. 2F.

Figure 7A:
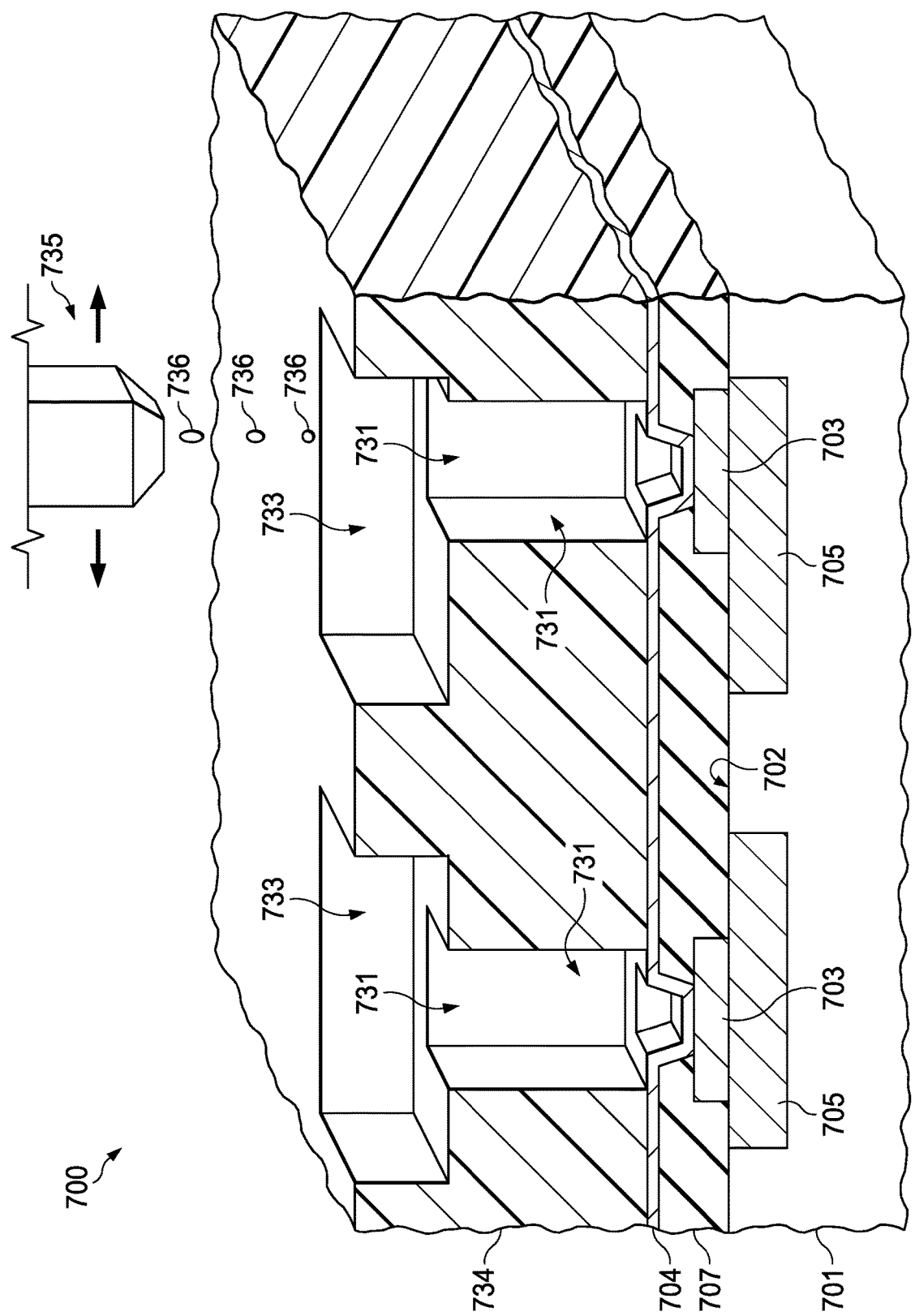
FIG. 7A through FIG. 7D are cross sections of a microelectronic device which includes electrically conductive pillars with expanded heads, depicted in stages of a further example method of formation.

FIG. 7A through FIG. 7D are cross sections of a microelectronic device which includes electrically conductive pillars with expanded heads, depicted in stages of a further example method of formation. Referring to FIG. 7A, the microelectronic device 700 has a substrate 701 with an I/O surface 702, and I/O pads 703 on the I/O surface 702. The substrate 701 may be similar to the substrate 101 of FIG. 1A. The I/O pads 703 may be disposed on top level interconnects 705 as depicted in FIG. 7A. A PO layer 707 may optionally be disposed over the I/O surface 702, with openings that expose the I/O pads 703. A seed layer 704 is formed over the I/O surface 702, on the PO layer 707, if present. The seed layer 704 contacts the I/O pads 703, through the openings in the PO layer 707. The seed layer 704 provides an electrically conductive layer for a subsequent electroplating process, and may include any of the metals disclosed in reference to the seed layer 104 of FIG. 1A. The seed layer 704 may be formed as disclosed in reference to the seed layer 204 of FIG. 2A.

A pillar plating mask 734 is formed over the seed layer 704. The pillar plating mask 734 has column openings 731 which expose the seed layer 704 in areas over the 110 pads 703, and has head openings 733 which expose the column openings 731 and expose areas around each column opening 731, as shown in FIG. 7A. The pillar plating mask 734 may be formed by an additive process, such as a material jetting process using an ink jet apparatus 735, which dispenses mask material 736. The mask material may include an organic polymer, such as a novolac resin, with a solvent to improve flow characteristics, for example. The pillar plating mask 734 may be baked after the additive process is completed, to remove volatile material such as solvent, or to cross-link the mask material 736. Forming the pillar plating mask 734 using the additive process may advantageously reduce fabrication costs compared to using two photolithographic processes.

Figure 7B:
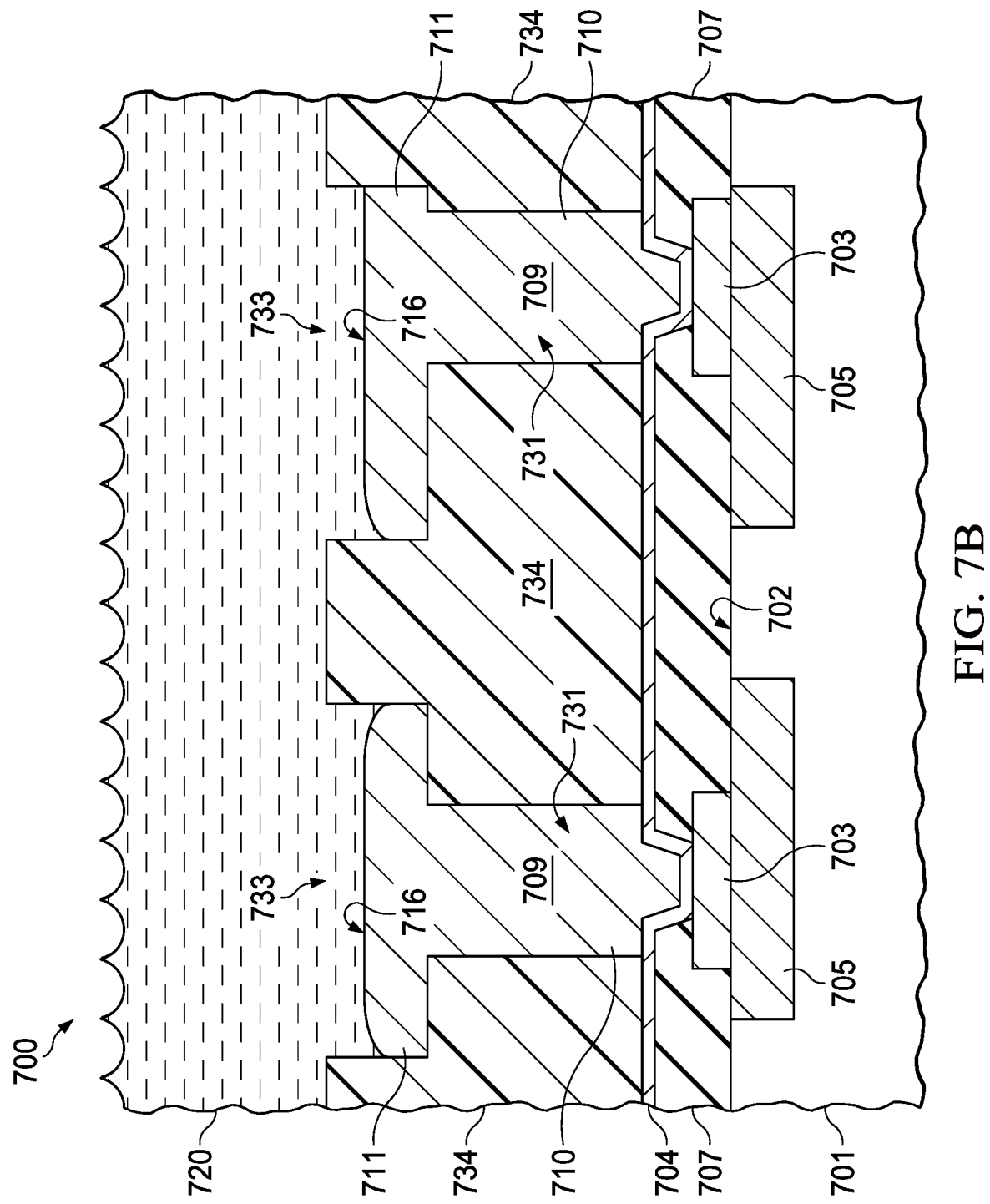

Referring to FIG. 7B, a pillar electroplating process using a metal electroplating bath 720 forms electrically conductive pillars 709 on the seed layer 704 in the column openings 731 and head openings 733 of the pillar plating mask 734. The metal electroplating bath 720 may have a formulation similar to the metal electroplating bath 220 of FIG. 2B. The electrically conductive pillars 709 include columns 710 in the column openings 731, and include expanded heads 711 on the columns 710 in the head openings 733. In the instant example, the pillar electroplating process may be configured to provide contact surfaces 716, which are flat, on the expanded heads 711 with rounded edges, as depicted in FIG. 7B. The expanded heads 711 may extend laterally past the columns 710, with the configurations disclosed in reference to FIG. 5B. FIG. 7B shows the completed electrically conductive pillars 709.

Figure 7C:
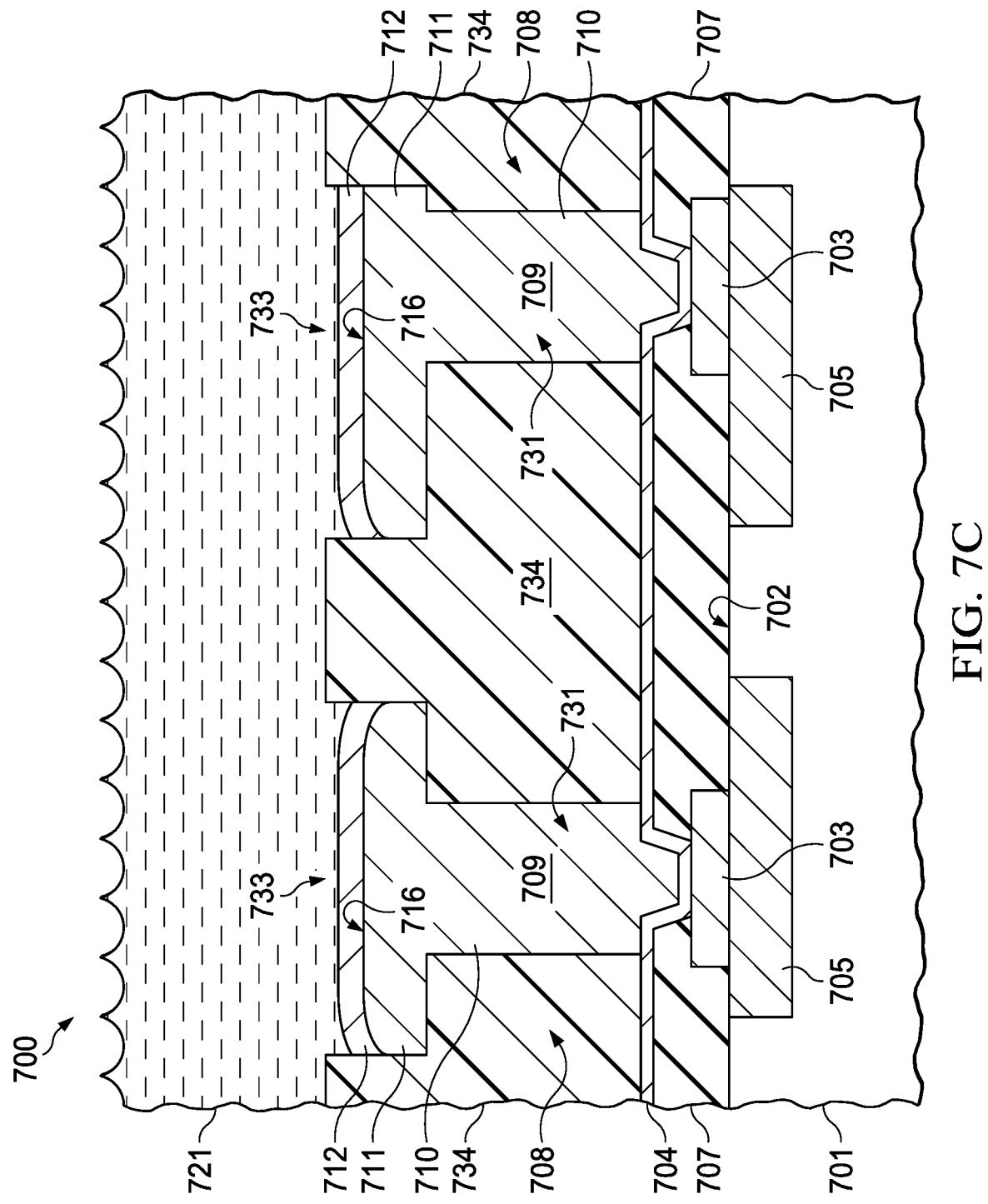

Referring to FIG. 7C, a solder electroplating process using a solder electroplating bath 721 forms solder 712 on the contact surfaces 716. The solder 712 may include the metals disclosed in reference to the solder 112 of FIG. 1A. The pillar plating mask 734 may be left in place during the solder electroplating process, so that the solder 712 extends to lateral perimeters of the expanded heads 711. The solder 712 and the electrically conductive pillars 709 together provide bump bond structures 708.

Figure 7D:
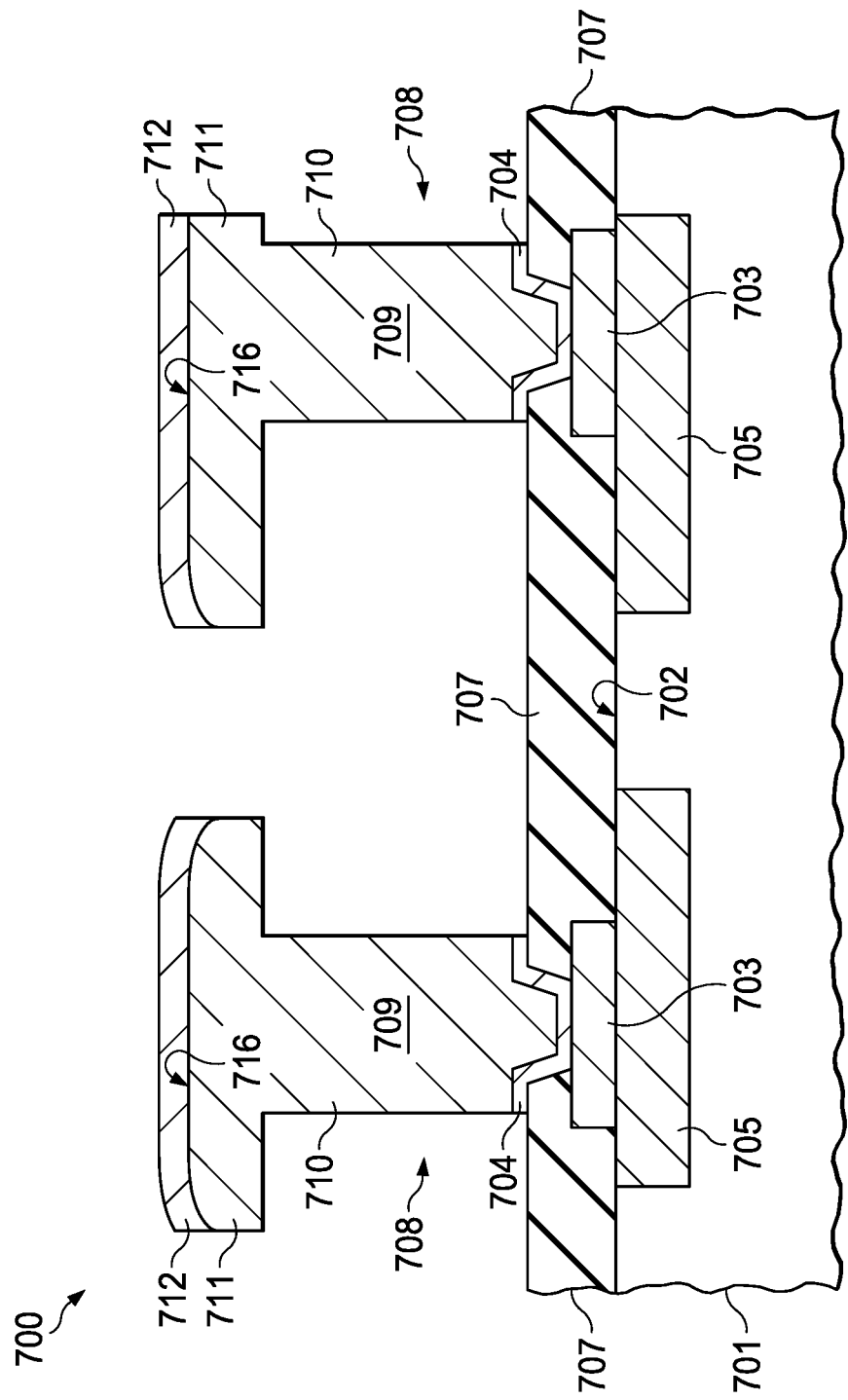

Referring to FIG. 7D, the pillar plating mask 734 of FIG. 7C is removed after the solder 712 is formed on the expanded heads 711. The pillar plating mask 734 may be removed, for example, using any of the methods disclosed in reference to FIG. 2E or FIG. 4E. Subsequently, the seed layer 704 is removed where exposed by the electrically conductive pillars 709, leaving the seed layer 704 between the columns 710 and the I/O pads 703. The seed layer 704 may be removed as disclosed in reference to FIG. 2F.

Figure 8:
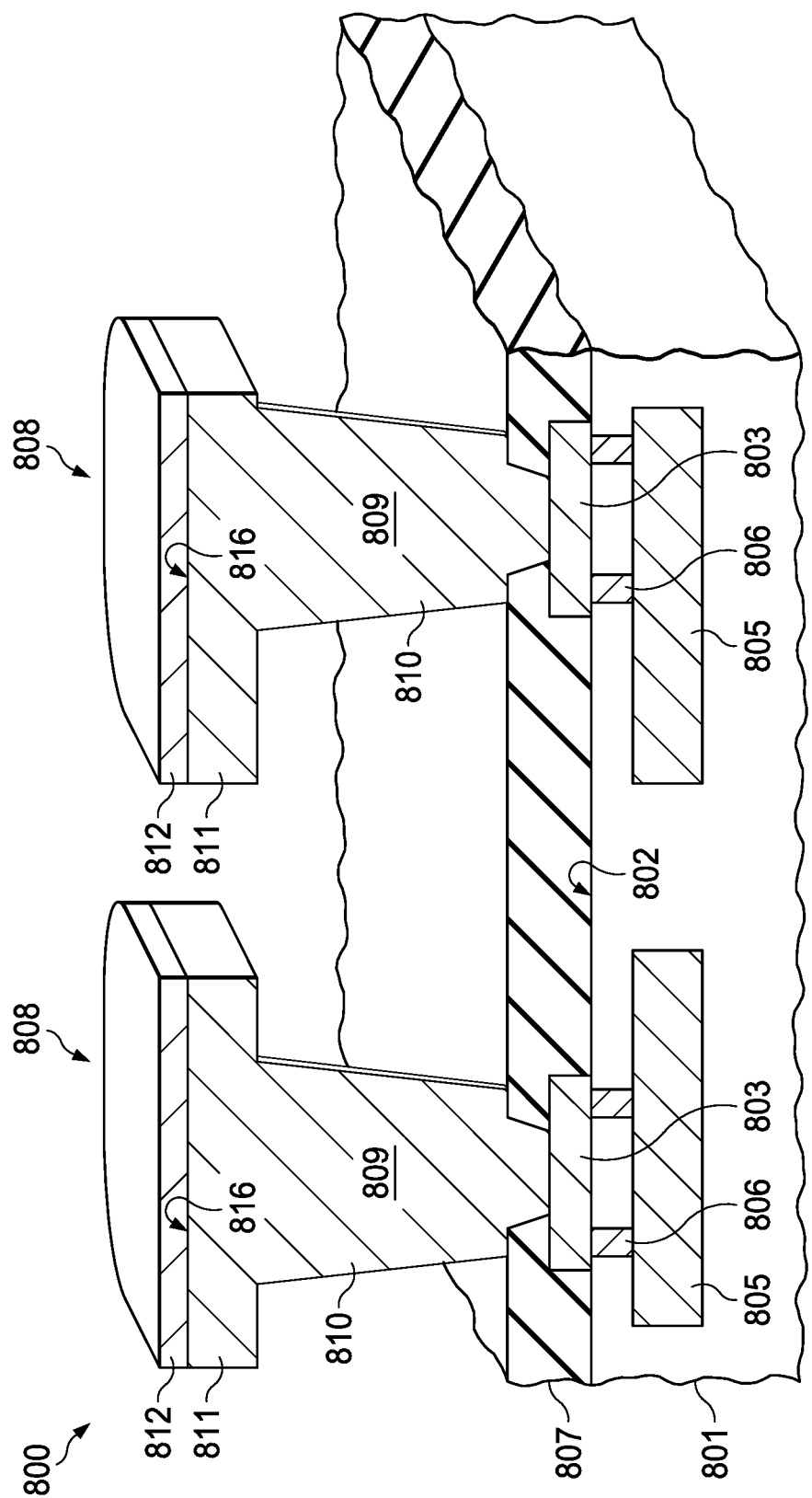
FIG. 8 is a cross section of another example microelectronic device which includes electrically conductive pillars with expanded heads.

FIG. 8 is a cross section of another example microelectronic device which includes electrically conductive pillars with expanded heads. The microelectronic device 800 has a substrate 801 with an I/O surface 802, and I/O pads 803 on the I/O surface 802. The substrate 801 may be similar to the substrate 101 disclosed in reference to FIG. 1A. The I/O pads 803 may be electrically coupled to interconnects 805 through vias 806. A PO layer 807 may optionally be disposed over the I/O surface 802, with openings that expose the I/O pads 803. In the instant example, the I/O pads 803 may include a base pad of aluminum or copper, with a cap layer of protective metal such as nickel, palladium, platinum, or gold.

The microelectronic device 800 includes bump bond structures 808 on the I/O pads 803. Each bump bond structure 808 includes an electrically conductive pillar 809 having a column 810 and an expanded head 811. In the instant example, the electrically conductive pillar 809 may be disposed directly on the corresponding I/O pad 803 without an intervening seed layer. The column 810 extends from the corresponding I/O pad 803 to the expanded head 811. The expanded head 811 is located on the column 810, opposite from the I/O pad 803. The column 810 may be continuous with the expanded head 811. The column 810 and the expanded head 811 may include may include any of the electrically conductive materials disclosed in reference to FIG. 1A. In one version of the instant example, the column 810 and the expanded head 811 may include primarily copper.

The expanded heads 811 have flat contact surfaces 816 located opposite from the columns 810. The columns 810 may have tapered vertical profiles, as depicted in FIG. 8. Alternatively, the columns 810 may have constant-width vertical profiles.

The expanded heads 811 may have the configurations disclosed in reference to the expanded heads 511 of FIG. 5A and FIG. 5B. Alternatively, the expanded heads 811 may have the configurations disclosed in reference to the expanded heads 111 of FIG. 1A and FIG. 1B.

In the instant example, the electrically conductive pillars 809 may include electrically conductive nanoparticles, which are adhered together. The nanoparticles may be fused together, so that electrically conductive pillars 809 are substantially free of voids.

Each bump bond structure 808 further includes solder 812 disposed on the expanded head 811. The bump bond structures 808 may further include a barrier layer, not shown in FIG. 8, disposed between the solder 812 and the electrically conductive pillars 809. The barrier layer may have the properties disclosed in reference to the barrier layer 324 of FIG. 3.

Figure 9A:
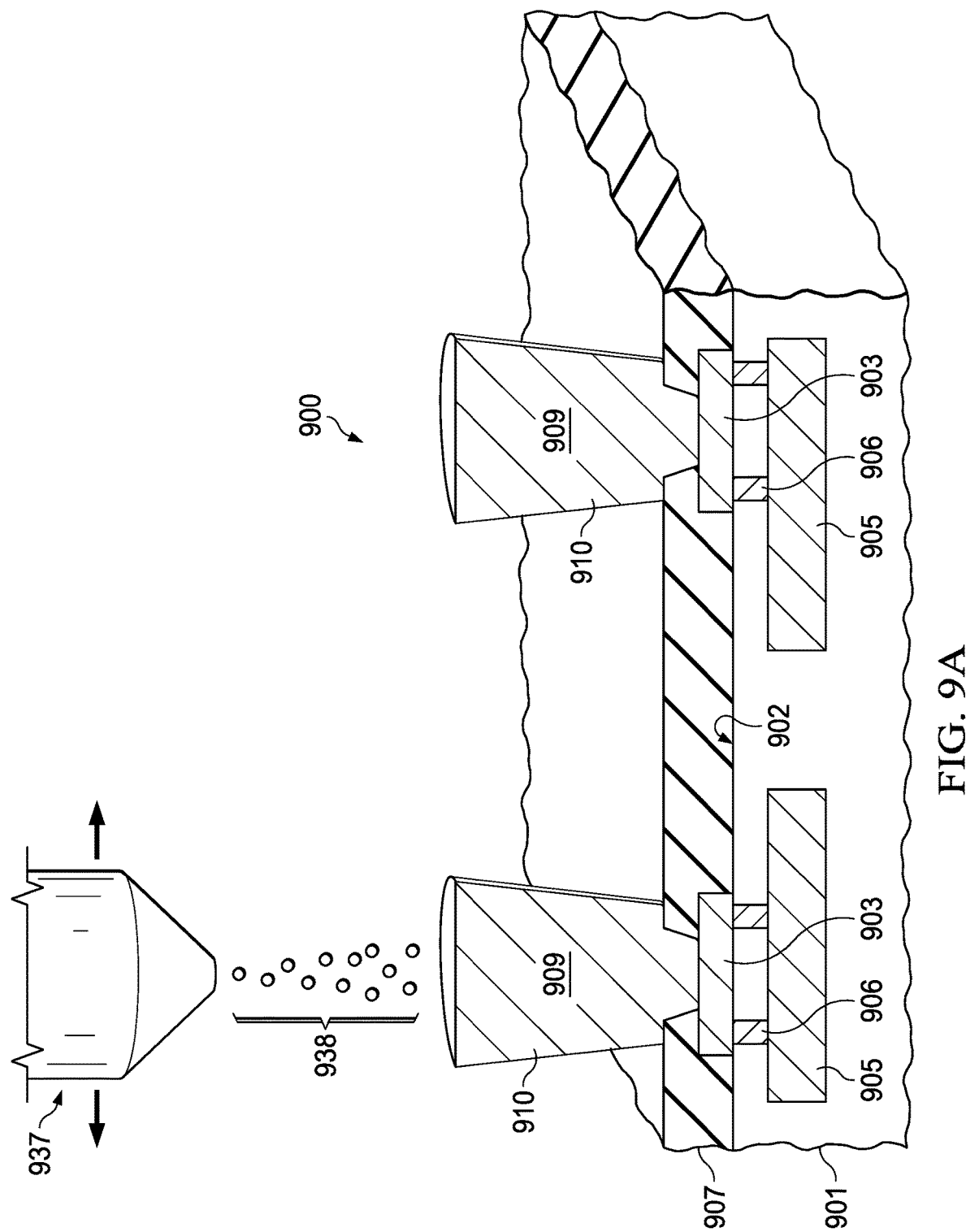
FIG. 9A through FIG. 9D are cross sections of a microelectronic device which includes electrically conductive pillars with expanded heads, depicted in stages of another example method of formation.

FIG. 9A through FIG. 9D are cross sections of a microelectronic device which includes electrically conductive pillars with expanded heads, depicted in stages of another example method of formation. Referring to FIG. 9A, the microelectronic device 900 has a substrate 901 with an I/O surface 902, and I/O pads 903 on the I/O surface 902. The substrate 901 may be similar to the substrate 101 disclosed in reference to FIG. 1A. The I/O pads 903 may be electrically coupled to interconnects 905 through vias 906. A PO layer 907 may optionally be disposed over the I/O surface 902, with openings that expose the I/O pads 903. In the instant example, the I/O pads 903 may include a base pad of aluminum or copper, with a cap layer of protective metal, for example as disclosed in reference to FIG. 8.

Columns 910 of electrically conductive pillars 909 are formed directly on the I/O pads 903 by a first additive process. The first additive process may include an electrostatic deposition process using an electrostatic dispense apparatus 937 which dispenses electrically conductive nanoparticles 938, as depicted in FIG. 9A. The electrically conductive nanoparticles 938 may include, for example, metal nanoparticles, carbon nanoparticles, graphene nanoparticles, or carbon nanotube nanoparticles. Alternatively, the first additive process may include, for example, a material jetting process, a laser sintering process, or an electrochemical deposition process. FIG. 9A shows the columns 910 partway to completion. Forming the columns 910 using the first additive process may reduce fabrication cost and complexity of the microelectronic device 900, compared to electroplating using a plating mask.

Figure 9B:
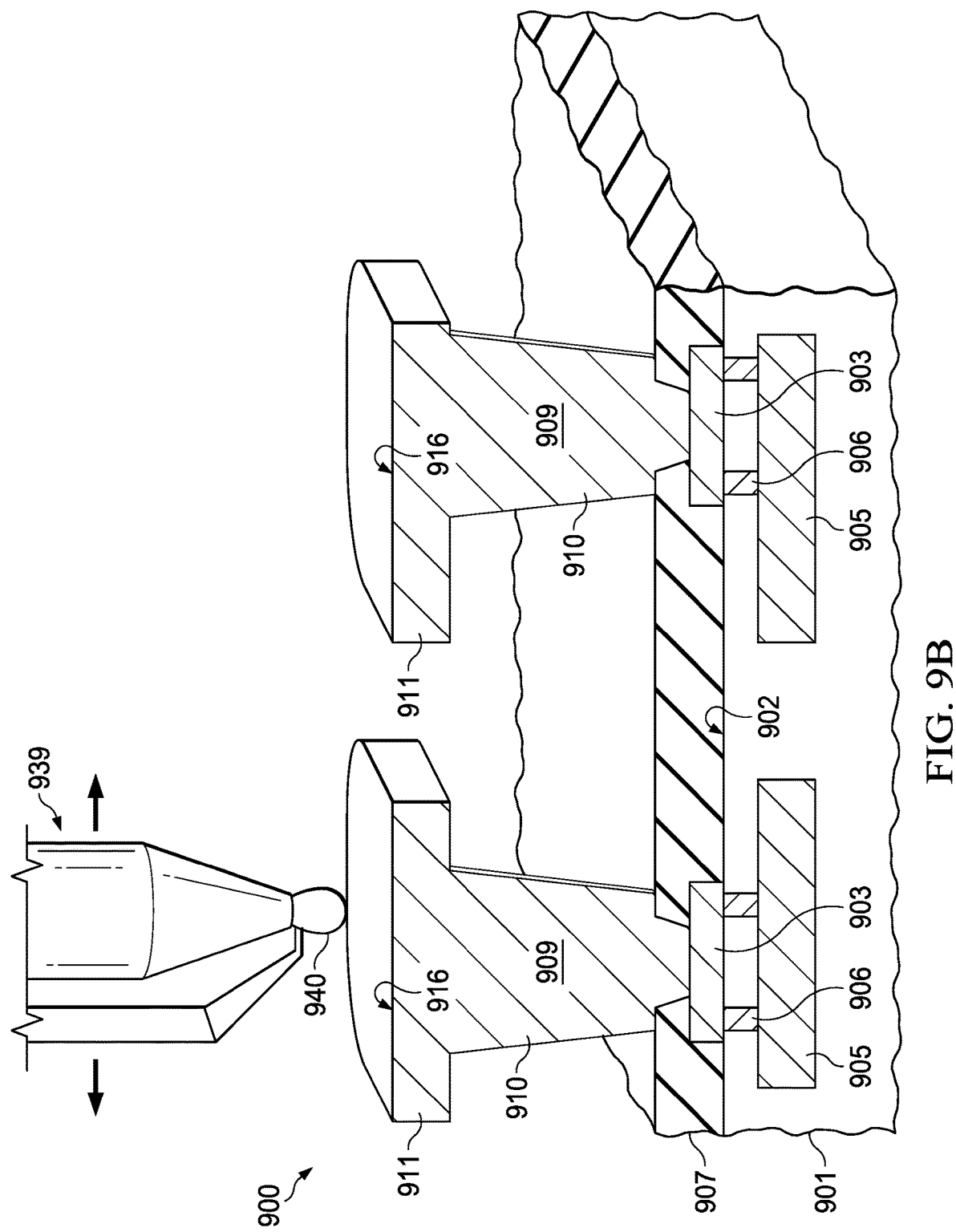

Referring to FIG. 9B, expanded heads 911 of the electrically conductive pillars 909 are formed on the columns 910 by a second additive process. The expanded heads 911 are formed to have contact surfaces 916 which are flat. The flat contact surfaces 916 may extend to lateral perimeters of the expanded heads 911, as depicted in FIG. 9B. Alternatively, the flat contact surfaces 916 may be recessed from the lateral perimeters of the expanded heads 911, and the expanded heads 911 may be formed with rounded or polygonal profiles around the lateral perimeters. The second additive process may include an electrochemical deposition process using an electrochemical deposition apparatus 939 which plates a metal such as copper through an electrolytic fluid 940 onto the electrically conductive pillars 909, as depicted in FIG. 9B. Alternatively, the second additive process may include, for example, a material jetting process, a laser sintering process, or an electrostatic deposition process. The second additive process may be a continuation of the first additive process, described in reference to FIG. 9A. The expanded heads 911 may include any of the electrically conductive materials disclosed in reference to the electrically conductive pillars 109 of FIG. 1A. Forming the expanded heads 911 using the second additive process may further reduce fabrication cost and complexity of the microelectronic device 900.

Figure 9C:
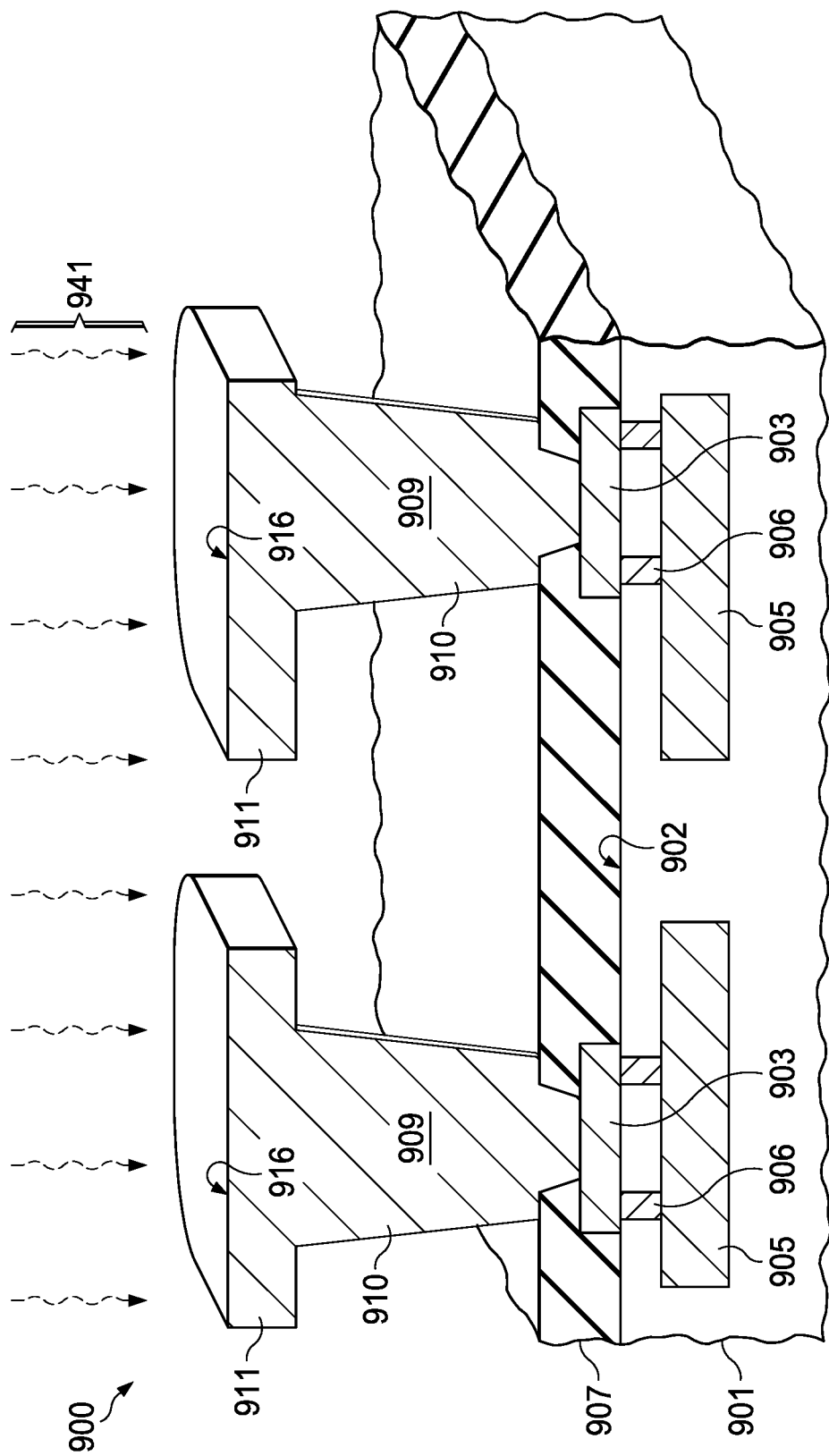

Referring to FIG. 9C, the electrically conductive pillars 909 may optionally be heated, for example by a radiant heating process 941. The electrically conductive pillars 909 may be heated to remove volatile material from the electrically conductive pillars 909, to fuse the nanoparticles in the electrically conductive pillars 909, or to densify the electrically conductive pillars 909. As an alternative to the radiant heating process 941, the electrically conductive pillars 909 may be heated by a hot plate process, a forced air heating process, or a furnace process. Use of the nanoparticles to form the electrically conductive pillars 909 may enable fusing the nanoparticles at a lower temperature than the melting point of the corresponding bulk metal. For example, it has been reported that copper nanoparticles smaller than 30 nanometers may be fused at less than 500° C.

Figure 9D:
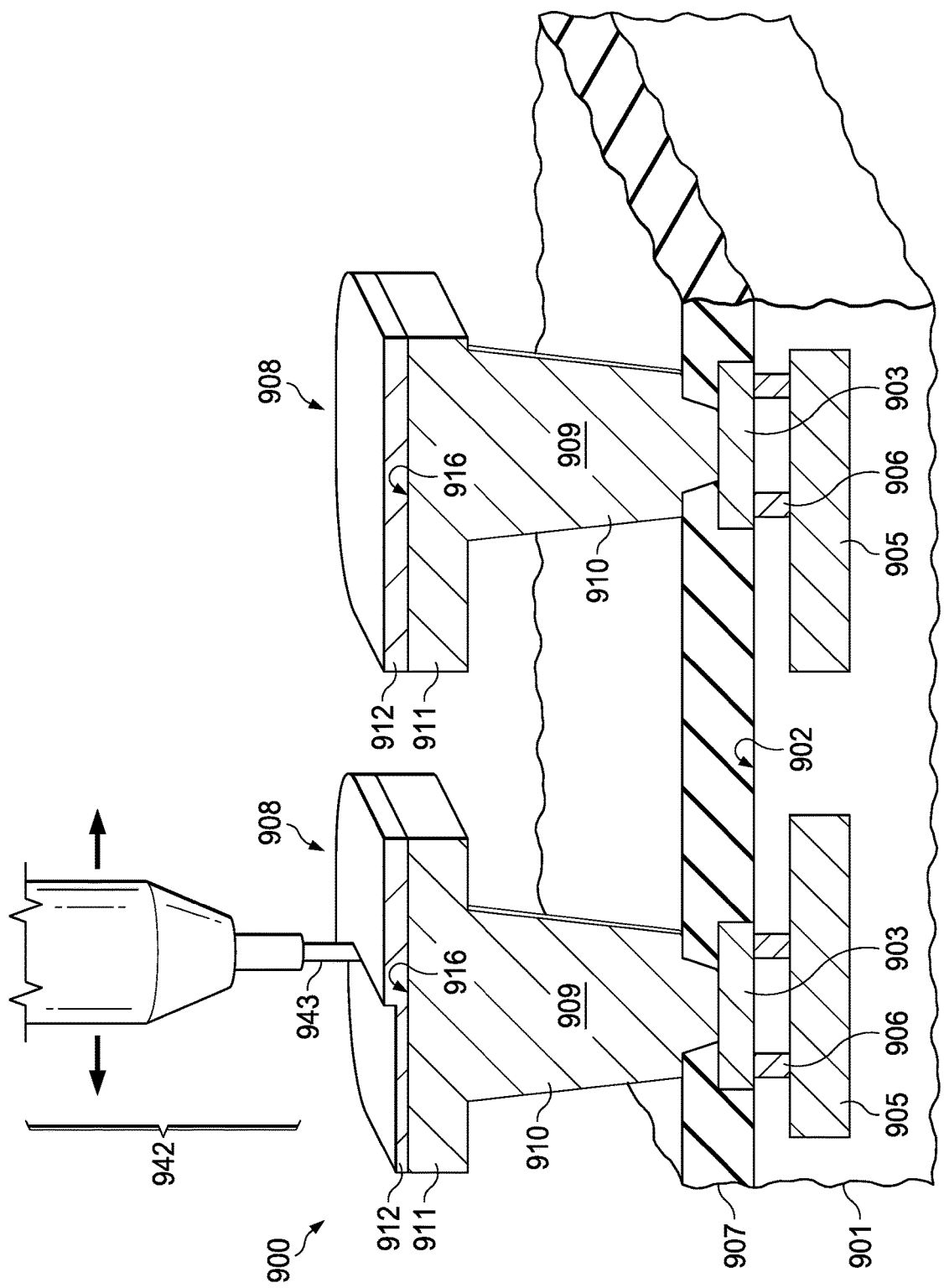

Referring to FIG. 9D, solder 912 is formed on the expanded heads 911, covering the flat contact surfaces 916. The solder 912 may be formed by a third additive process. The third additive process may include a material extrusion process using a material extrusion apparatus 942 which dispenses solder paste 943 onto the expanded heads 911, as depicted in FIG. 9D. Alternatively, the third additive process may include, for example, a binder jetting process, a material jetting process, material extrusion, an electrostatic deposition process, or an electrochemical deposition process. The solder 912 may subsequently be heated to remove volatile material, if needed. The solder 912 may be heated at a lower temperature, for example 100° C. to 300° C., than the temperature needed to fuse the nanoparticles in the electrically conductive pillars 909.

The electrically conductive pillars 909 and the solder 912 provide bump bond structures 908 of the microelectronic device 900. The columns 910 and the expanded heads 911 may have other shapes than those depicted in FIG. 9A through FIG. 9D. For example, the columns 910 and the expanded heads 911 may have the shapes depicted in FIG. 1A and FIG. 1B.

Figure 10A:
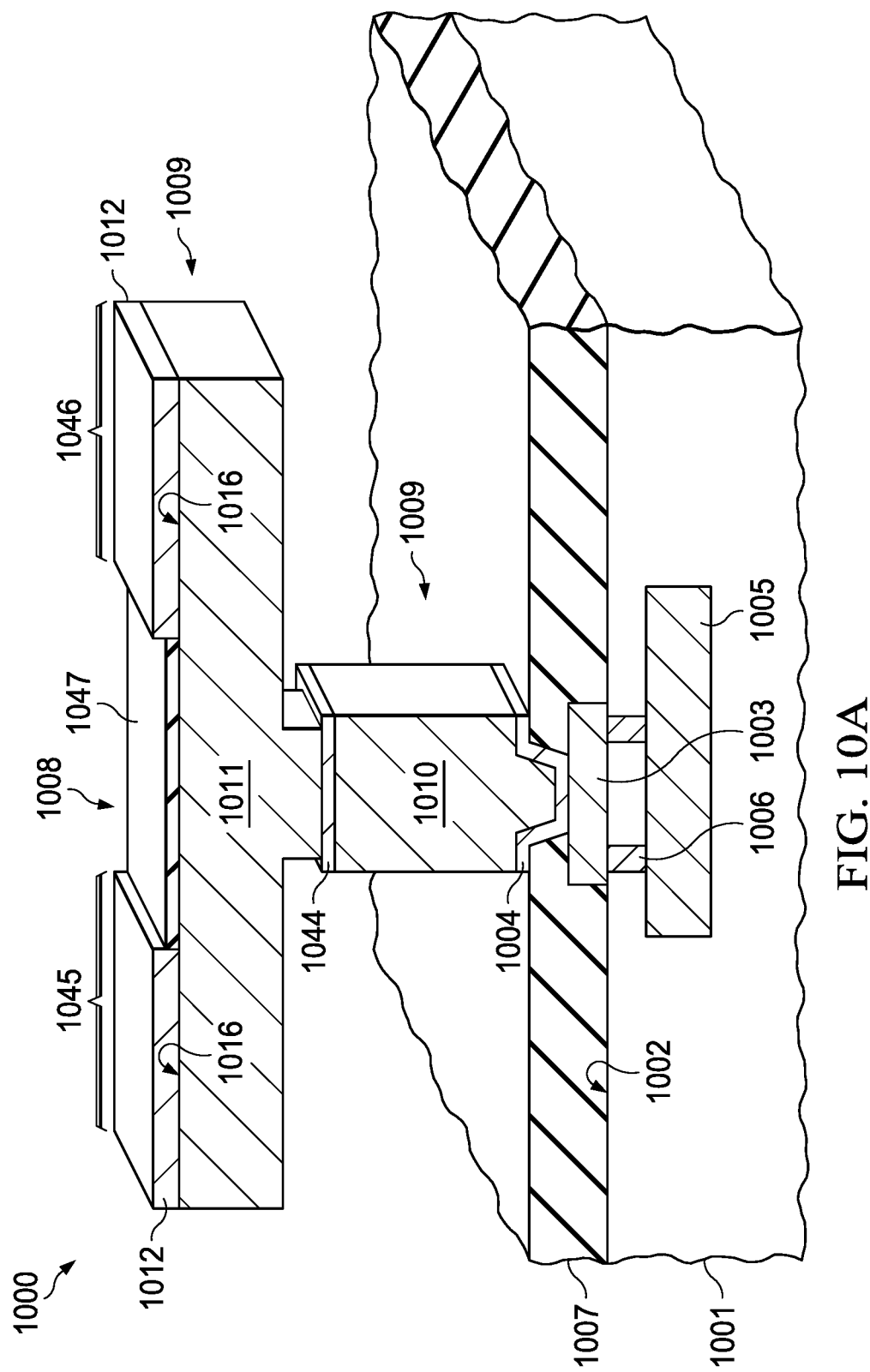
FIG. 10A and FIG. 10B are cross sections of a further example microelectronic device which includes an electrically conductive pillar with an expanded head.
Figure 10B:
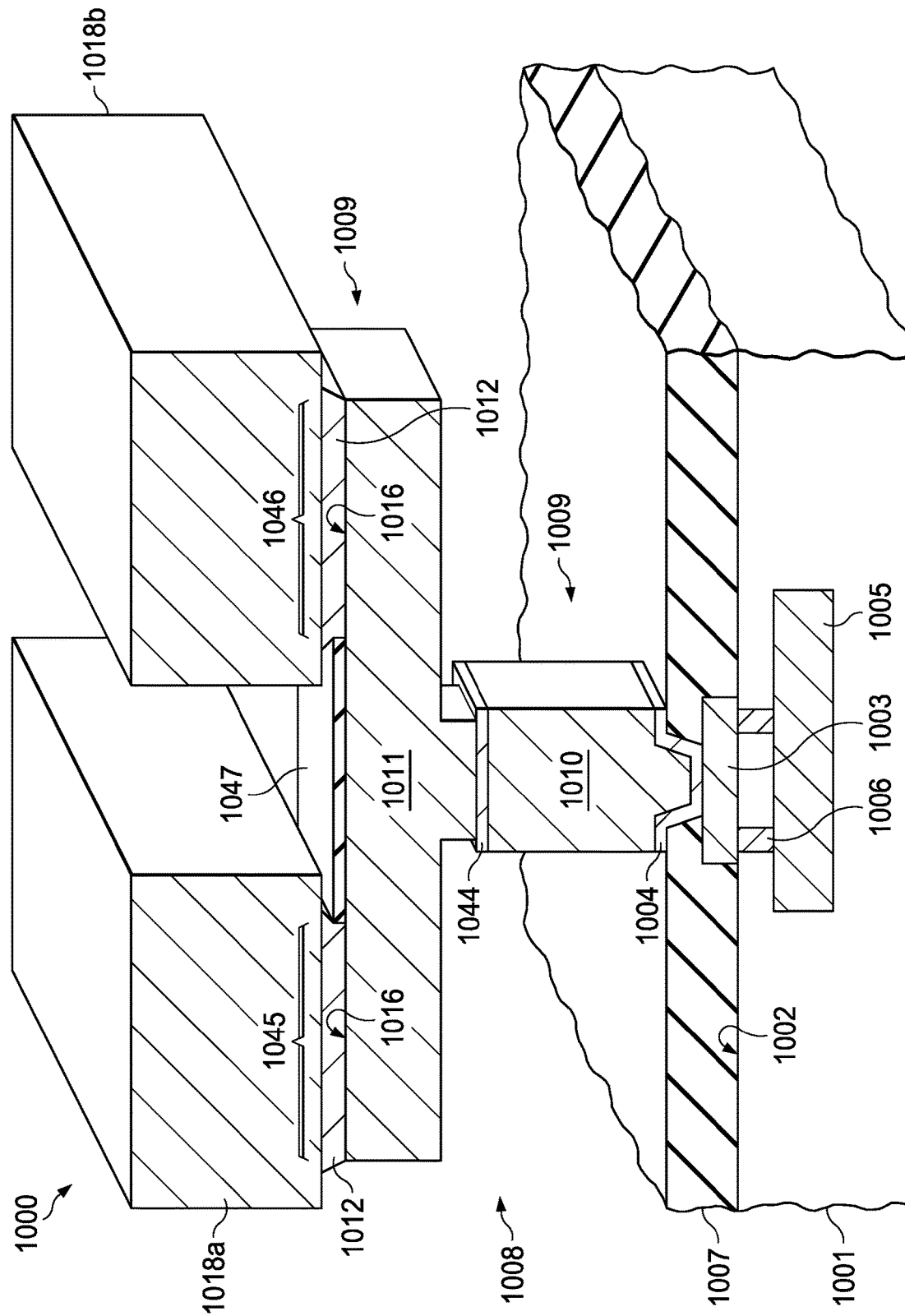

FIG. 10A and FIG. 10B are cross sections of a further example microelectronic device which includes an electrically conductive pillar with an expanded head. Referring to FIG. 10A, the microelectronic device 1000 has a substrate 1001 with an I/O surface 1002, and an I/O pad 1003 on the I/O surface 1002. The substrate 1001 may be similar to the substrate 101 disclosed in reference to FIG. 1A. The I/O pad 1003 may be electrically coupled to an interconnect 1005 through vias 1006. A PO layer 1007 may optionally be disposed over the I/O surface 1002, with an opening that exposes the I/O pad 1003. A first seed layer 1004 may be disposed on the I/O pad 1003. The first seed layer 1004 may have a composition similar to the seed layer 104 of FIG. 1A.

The microelectronic device 1000 includes a bump bond structure 1008 on the I/O pad 1003. The bump bond structure 1008 includes an electrically conductive pillar 1009 having a column 1010 and an expanded head 1011. In the instant example, the bump bond structure 1008 may include a second seed layer 1044 between the column 1010 and the expanded head 1011. The second seed layer 1044 may have a composition of electrically conductive material suitable for an electroplating process. The column 1010 and the expanded head 1011 may include may include any of the electrically conductive materials disclosed in reference to FIG. 1A. In one version of the instant example, the column 1010 and the expanded head 1011 may include primarily copper. In one case, the expanded head 1011 may have a same composition as the column 1010. In another case, the expanded head 1011 may have different composition than the column 1010. The column 1010 extends from the first seed layer 1004 to the second seed layer 1044. The expanded head 1011 is located on the second seed layer 1044, opposite from the column 1010. The expanded head 1011 extends laterally past the column 1010 in at least one lateral direction. The expanded head 1011 has a contact surface 1016 which is flat. The contact surface 1016 is located opposite from the column 1010.

The bump bond structure 1008 of the instant example has a first connection area 1045 on the contact surface 1016, and a second connection area 1046 on the contact surface 1016. The bump bond structure 1008 includes solder 1012 on the expanded head 1011 in the first connection area 1045 and in the second connection area 1046. The bump bond structure 1008 may optionally include an insulator layer 1047 on the expanded head 1011 between the first connection area 1045 and the second connection area 1046.

Referring to FIG. 10B, the microelectronic device 1000 is assembled into a package structure, such as a lead frame or chip carrier. The bump bond structure 1008 is connected to a first package electrode 1018a and a second package electrode 1018b of the package structure, which may be a first lead 1018a and a second lead 1018b. The solder 1012 couples the electrically conductive pillar 1009 in the first connection area 1045 to the first lead 1018a, and couples the electrically conductive pillar 1009 in the second connection area 1046 to the second lead 1018b. Having the expanded head 1011 connected to the first lead 1018a and the second lead 1018b may advantageously enable a smaller package structure for a given size of the microelectronic device 1000.

Figure 11A:
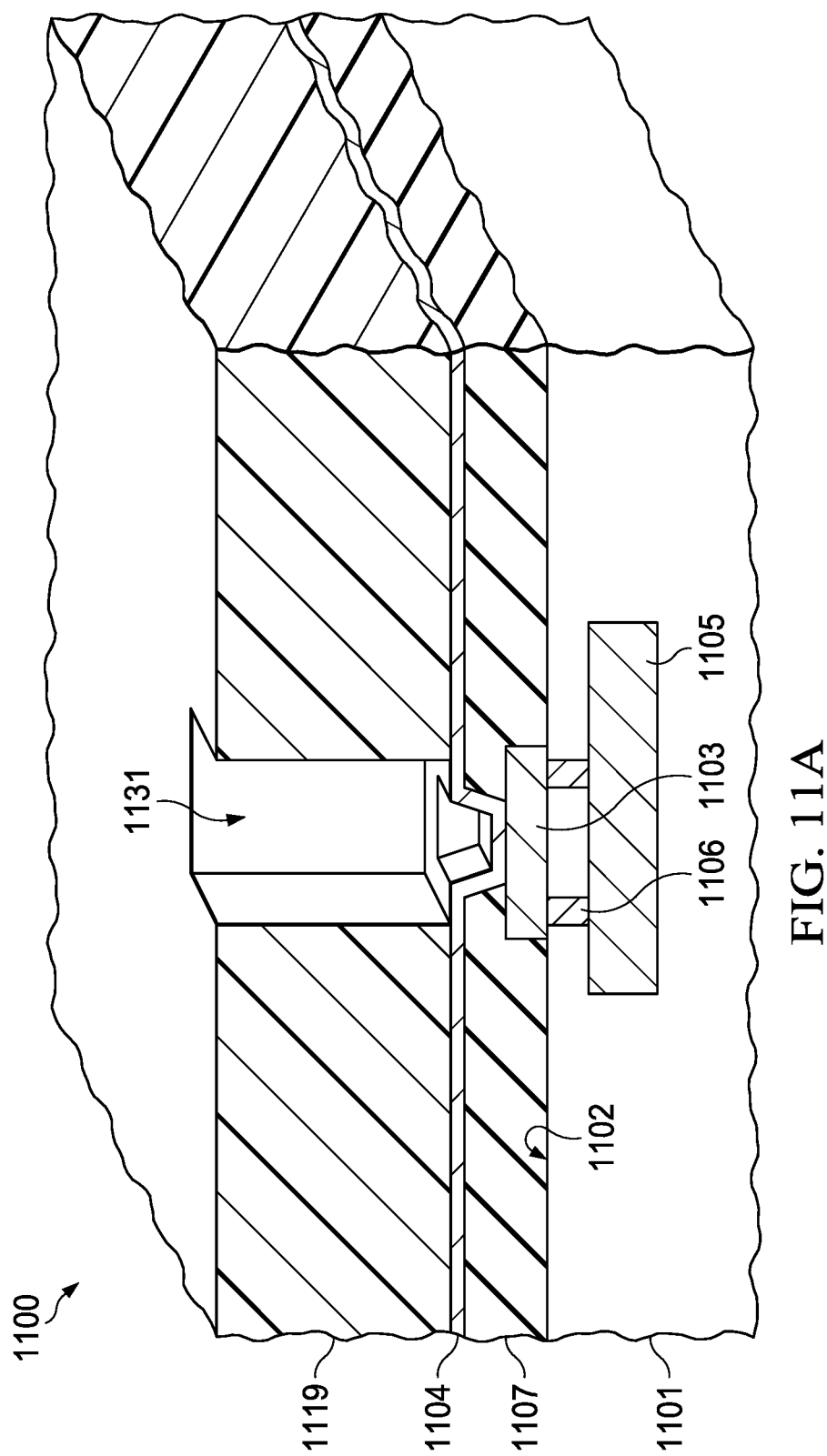
FIG. 11A through FIG. 11K are cross sections of a microelectronic device which includes electrically conductive pillars with expanded heads, depicted in stages of a further example method of formation.

FIG. 11A through FIG. 11K are cross sections of a microelectronic device which includes electrically conductive pillars with expanded heads, depicted in stages of a further example method of formation. Referring to FIG. 11A, the microelectronic device 1100 has a substrate 1101 with an I/O surface 1102, and an I/O pad 1103 on the I/O surface 1102. The substrate 1101 may be similar to the substrate 101 disclosed in reference to FIG. 1A. The I/O pad 1103 may be electrically coupled to an interconnect 1105 through one or more vias 1106. A PO layer 1107 may optionally be disposed over the I/O surface 1102, with an opening that exposes the I/O pad 1103.

A first seed layer 1104 is formed over the I/O surface 1102, on the PO layer 1107, if present. The first seed layer 1104 contacts the I/O pad 1103, through the opening in the PO layer 1107. The first seed layer 1104 provides an electrically conductive layer for a subsequent first electroplating process, and may include any of the metals disclosed in reference to the seed layer 104 of FIG. 1A. The first seed layer 1104 may be formed as disclosed in reference to the seed layer 204 of FIG. 2A.

A column plating mask 1119 is formed over the first seed layer 1104. The column plating mask 1119 has a column opening 1131 which exposes the first seed layer 1104 in an area over the I/O pad 1103. The column plating mask 1119 may be formed, for example, by a photolithographic process as disclosed in reference to FIG. 6A, or may be formed by an additive process as disclosed in reference to FIG. 7A. Other methods of forming the column plating mask 1119 are within the scope of the instant example.

Figure 11B:
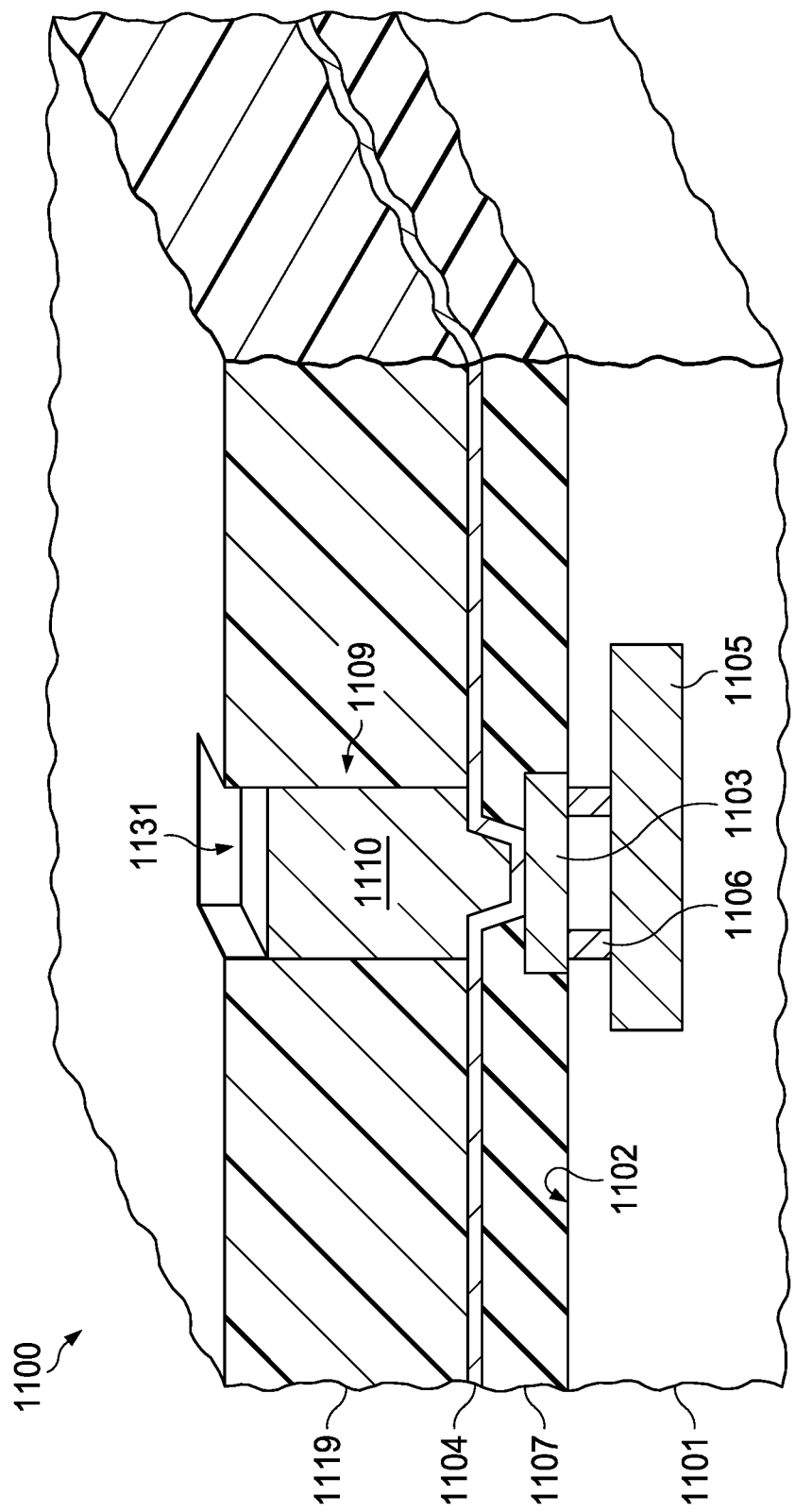

Referring to FIG. 11B, a column electroplating process forms a column 1110 on the first seed layer 1104 in the column opening 1131, that is, where exposed by the column plating mask 1119. The column electroplating process may have be similar to the column electroplating process disclosed in reference to FIG. 2B. The column 1110 extends from the first seed layer 1104 to proximate to a top surface of the column plating mask 1119. The top surface of the column plating mask 1119 is located opposite from the first seed layer 1104. In one version of the instant example, the column 1110 may extend to a few microns below the top surface of the column plating mask 1119, as depicted in FIG. 11B. In another version, the column 1110 may extend to the top surface of the column plating mask 1119. In a further version, the column 1110 may extend a few microns above the top surface of the column plating mask 1119. The column 1110 is part of an electrically conductive pillar 1109.

Figure 11C:
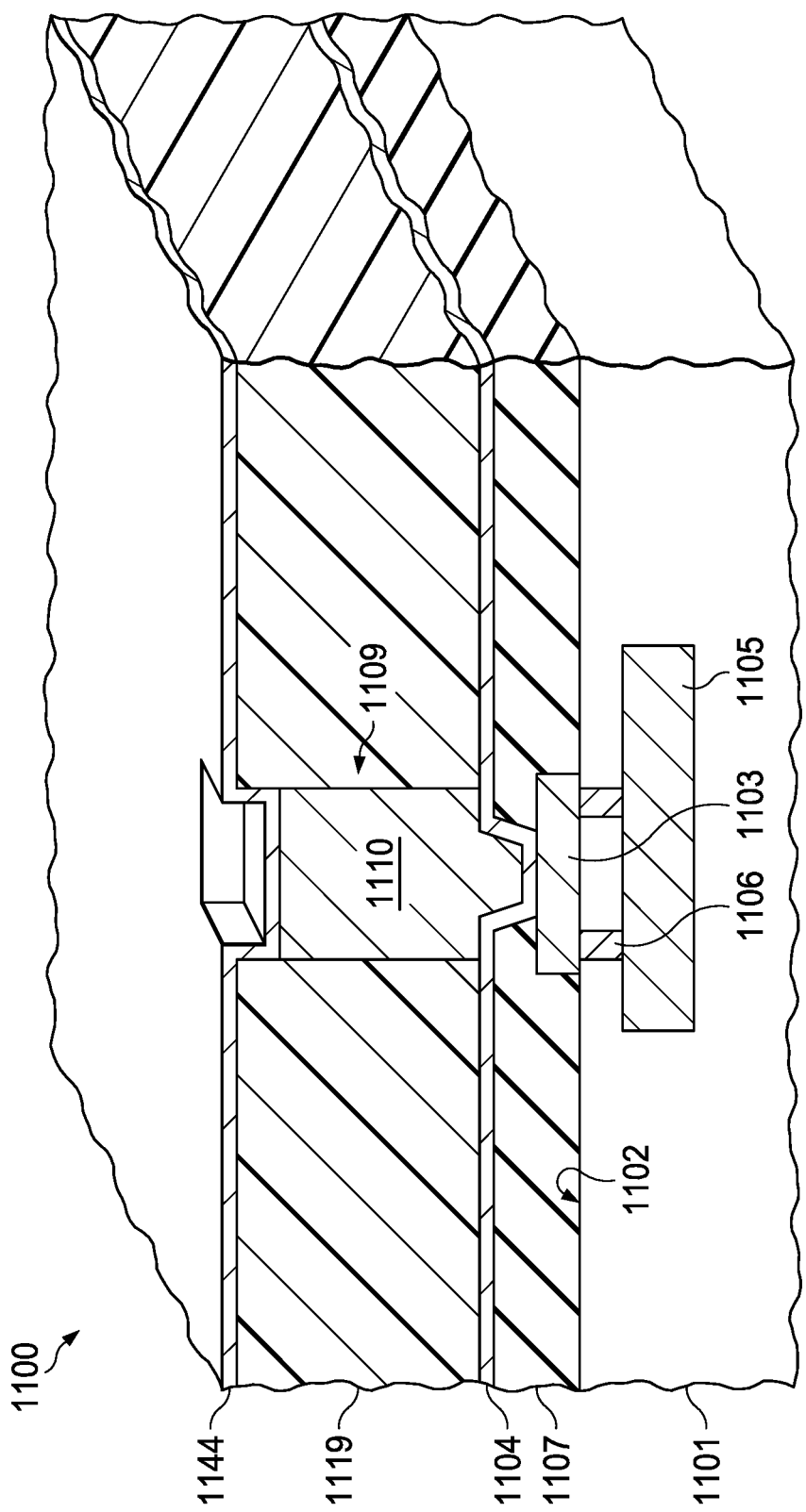

Referring to FIG. 11C, a second seed layer 1144 is formed on the column 1110 and over the column plating mask 1119. The second seed layer 1144 provides an electrically conductive layer for a subsequent second electroplating process. The second seed layer 1144 may include any of the metals disclosed in reference to the seed layer 104 of FIG. 1A. The second seed layer 1144 may be formed as disclosed in reference to the seed layer 204 of FIG. 2A.

Figure 11D:
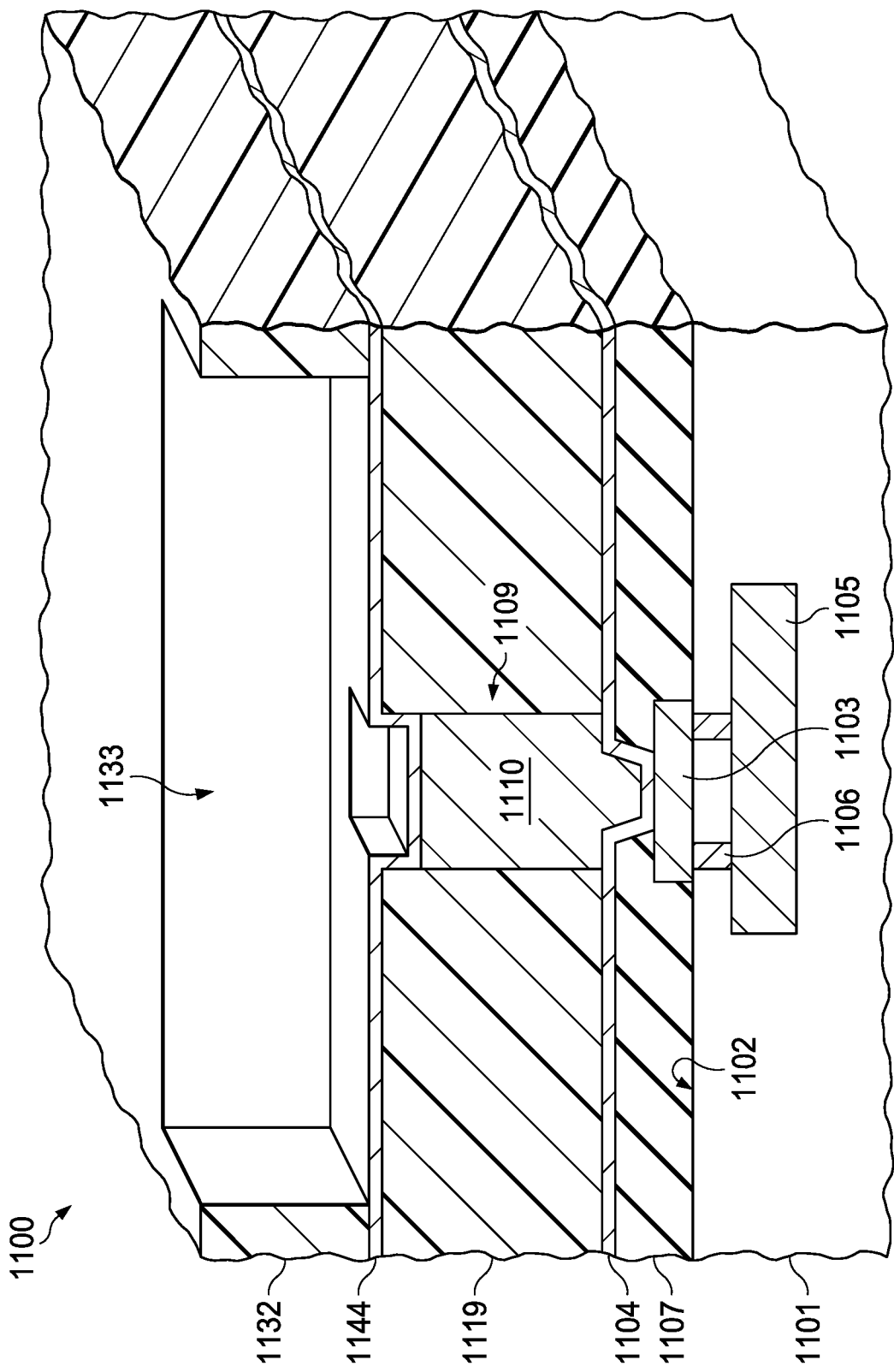

Referring to FIG. 11D, a head plating mask 1132 is formed over the second seed layer 1144. The head plating mask 1132 has a head opening 1133 which exposes the second seed layer 1144 around the column 1110, as shown in FIG. 11D. The head plating mask 1132 may be formed, for example, by a process similar to that used to form the column plating mask 1119. Other methods of forming the head plating mask 1132 are within the scope of the instant example.

Figure 11E:
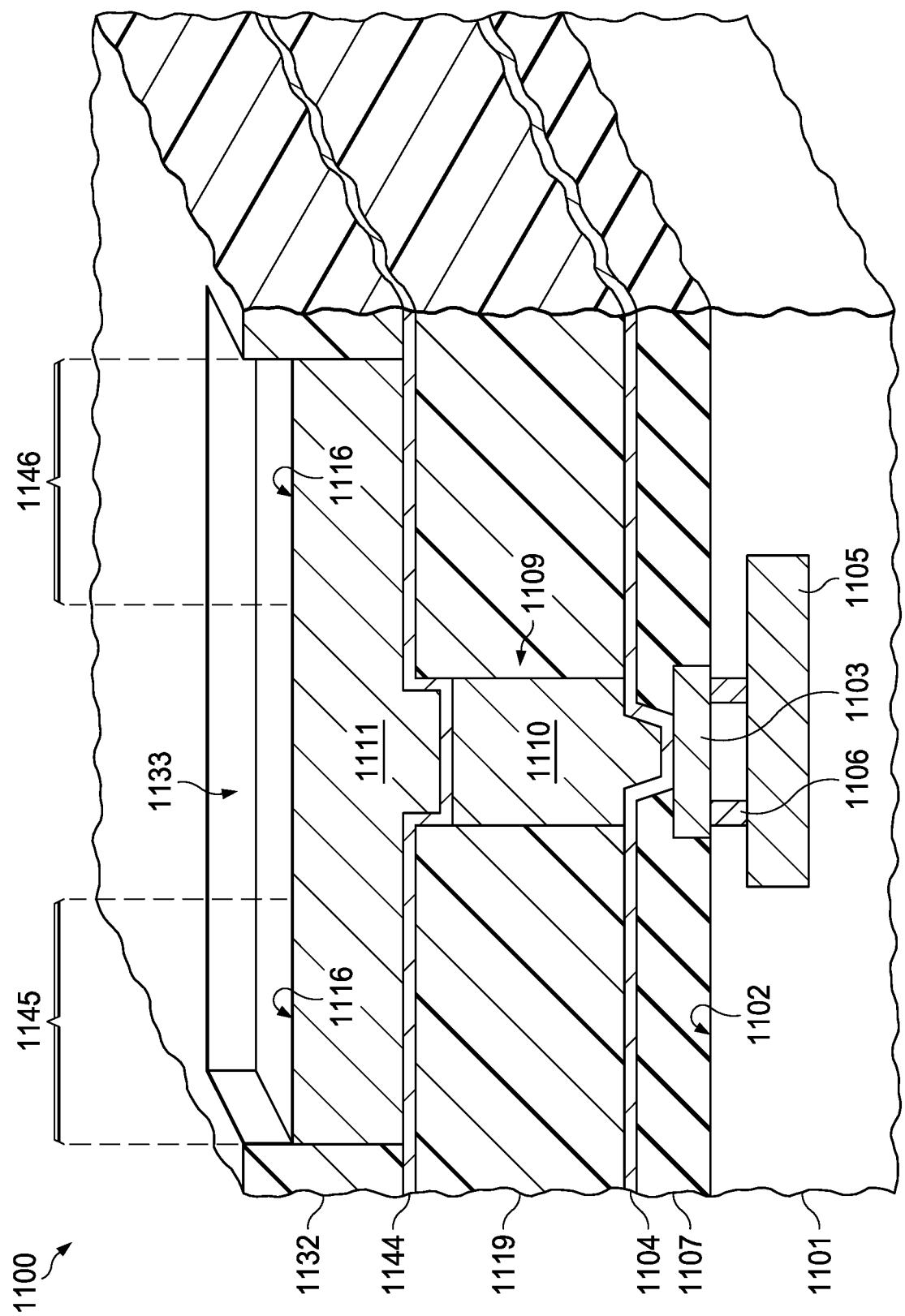

Referring to FIG. 11E, a head electroplating process forms an expanded head 1111 on the second seed layer 1144 in the head opening 1133, that is, where exposed by the head plating mask 1132. The head electroplating process may have be similar to the metal electroplating process disclosed in reference to FIG. 2B. The expanded head 1111 extends from the second seed layer 1144 to proximate to a top surface of the head plating mask 1132. The top surface of the head plating mask 1132 is located opposite from the second seed layer 1144. In one version of the instant example, the expanded head 1111 may extend to a few microns below the top surface of the head plating mask 1132, as depicted in FIG. 11E. In another version, the expanded head 1111 may extend to the top surface of the expanded head 1111. In a further version, the expanded head 1111 may extend above the top surface of the head plating mask 1132. The expanded head 1111 is part of the electrically conductive pillar 1109. The expanded head 1111 has a contact surface 1116, located opposite from the second seed layer 1144. The expanded head 1111 of the instant example has a first connection area 1145 on the contact surface 1116, and a second connection area 1146 on the contact surface 1116.

Figure 11F:
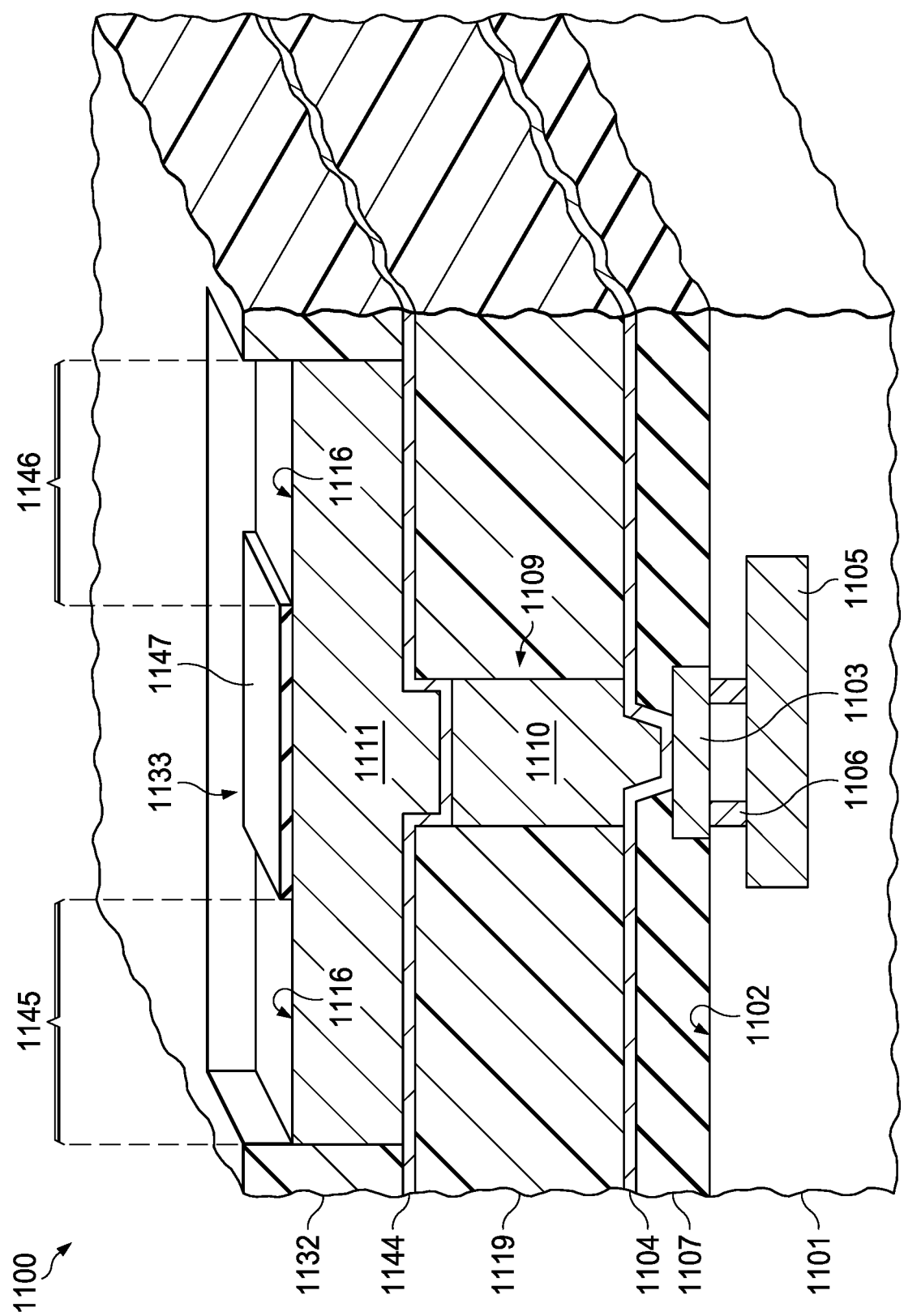

Referring to FIG. 11F, an insulator layer 1147 may be formed on the expanded head 1111. The insulator layer 1147 may be located on the contact surface 1116, between the first connection area 1145 and the second connection area 1146.

Insulator layer 1147 may include organic dielectric material such as a polymer material, a silicone material, or an inorganic dielectric material such as silicon dioxide or aluminum oxide. The insulator layer 1147 may be formed by a photolithographic process using a photo-sensitive polymer material such as photo-sensitive polyimide. Alternatively, the insulator layer 1147 may be formed by depositing a layer of dielectric material, followed by a mask and etch process. In a further example, the insulator layer 1147 may be formed by an additive process.

Figure 11G:
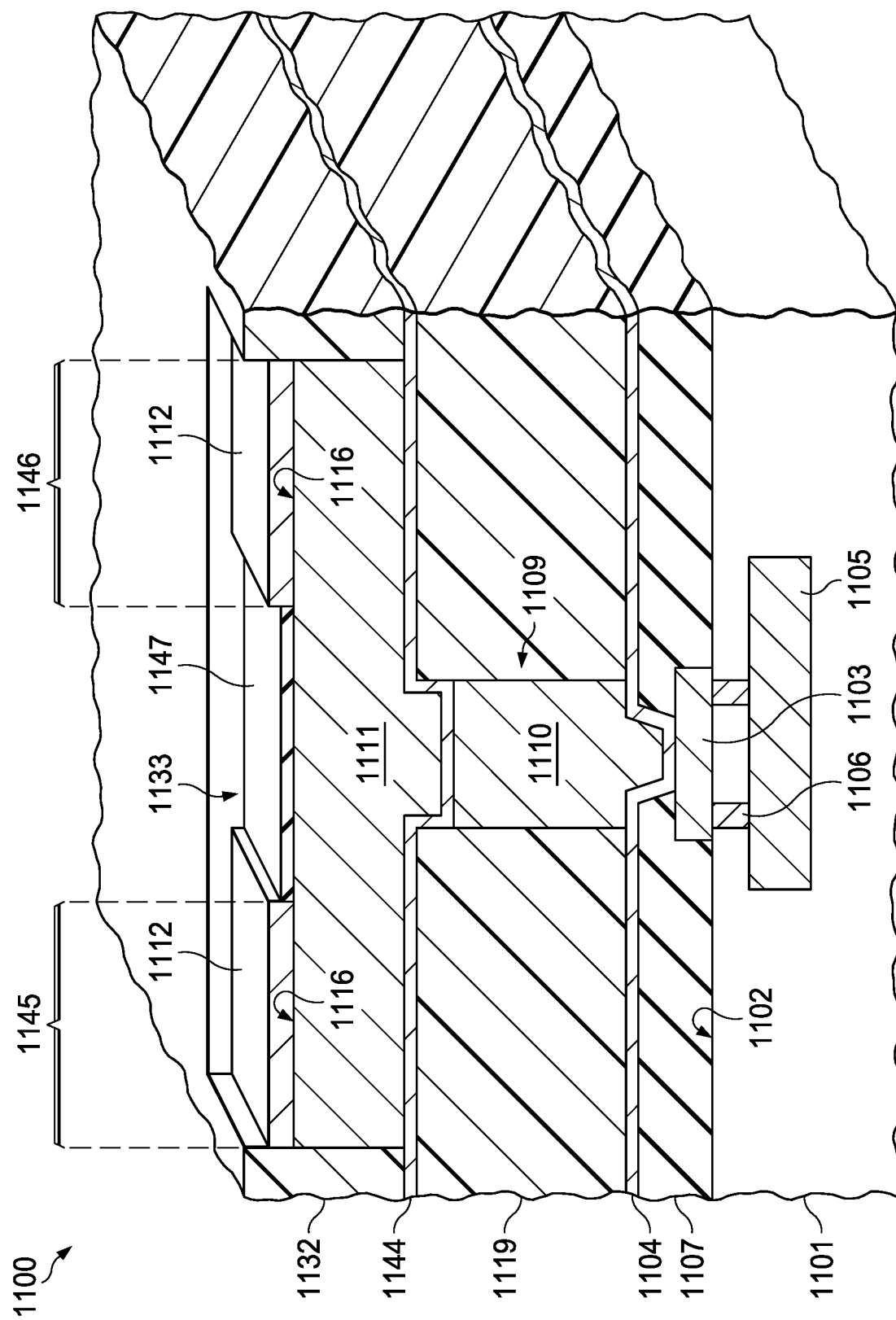

Referring to FIG. 11G, solder 1112 is formed on the contact surface 1116 in the first connection area 1145 and the second connection area 1146. The solder 1112 may be formed, for example, by an electroplating process, or by an additive process. The solder 1112 may include any of the metals disclosed in reference to the solder 112 of FIG. 1A.

Figure 11H:
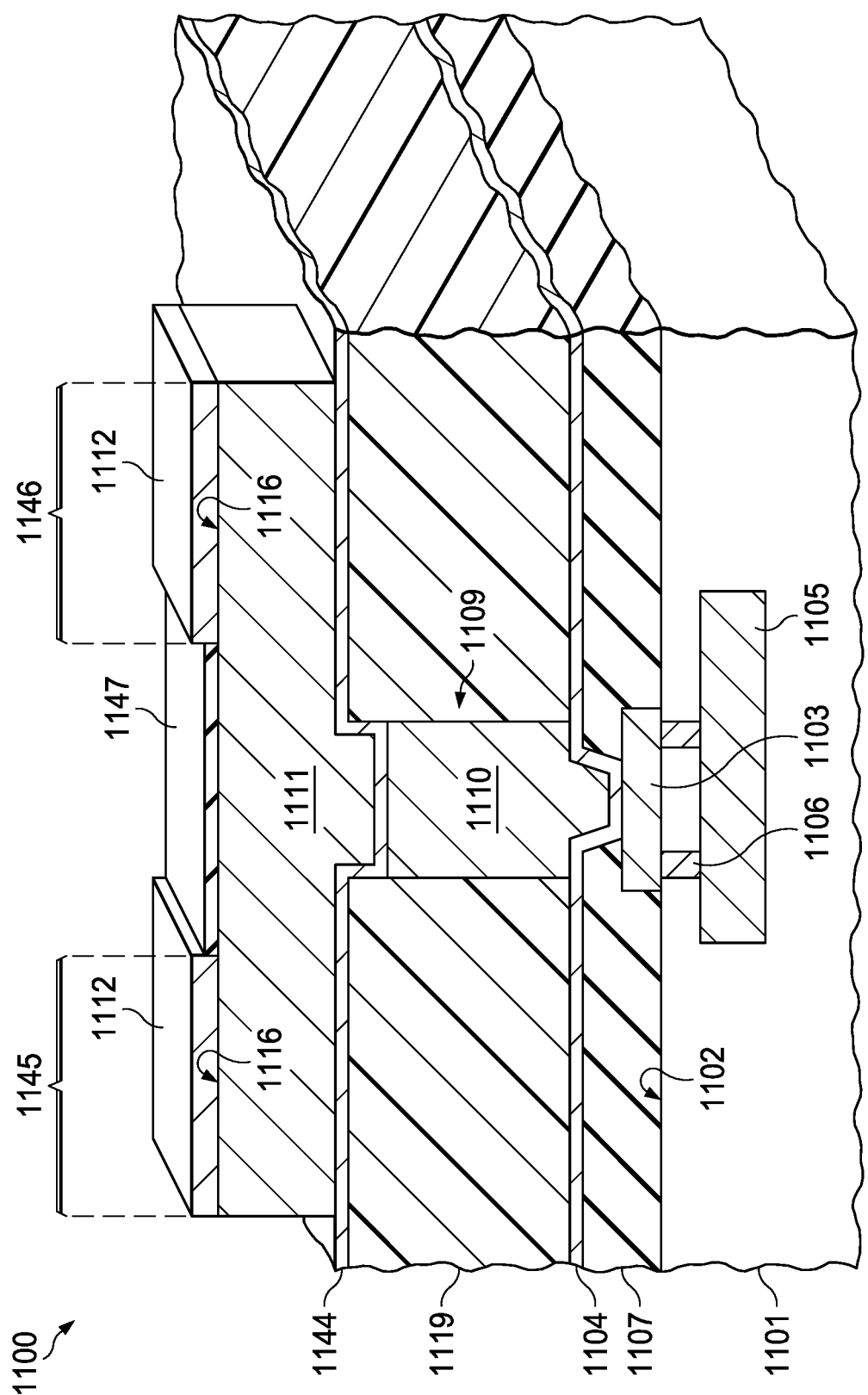

Referring to FIG. 11H, the head plating mask 1132 of FIG. 11G is removed. The head plating mask 1132 may be removed, for example, using any of the methods disclosed in reference to FIG. 2E or FIG. 4E. In the instant example, the second seed layer 1144 may prevent removal of the column plating mask 1119, as indicated in FIG. 11H.

Figure 11I:
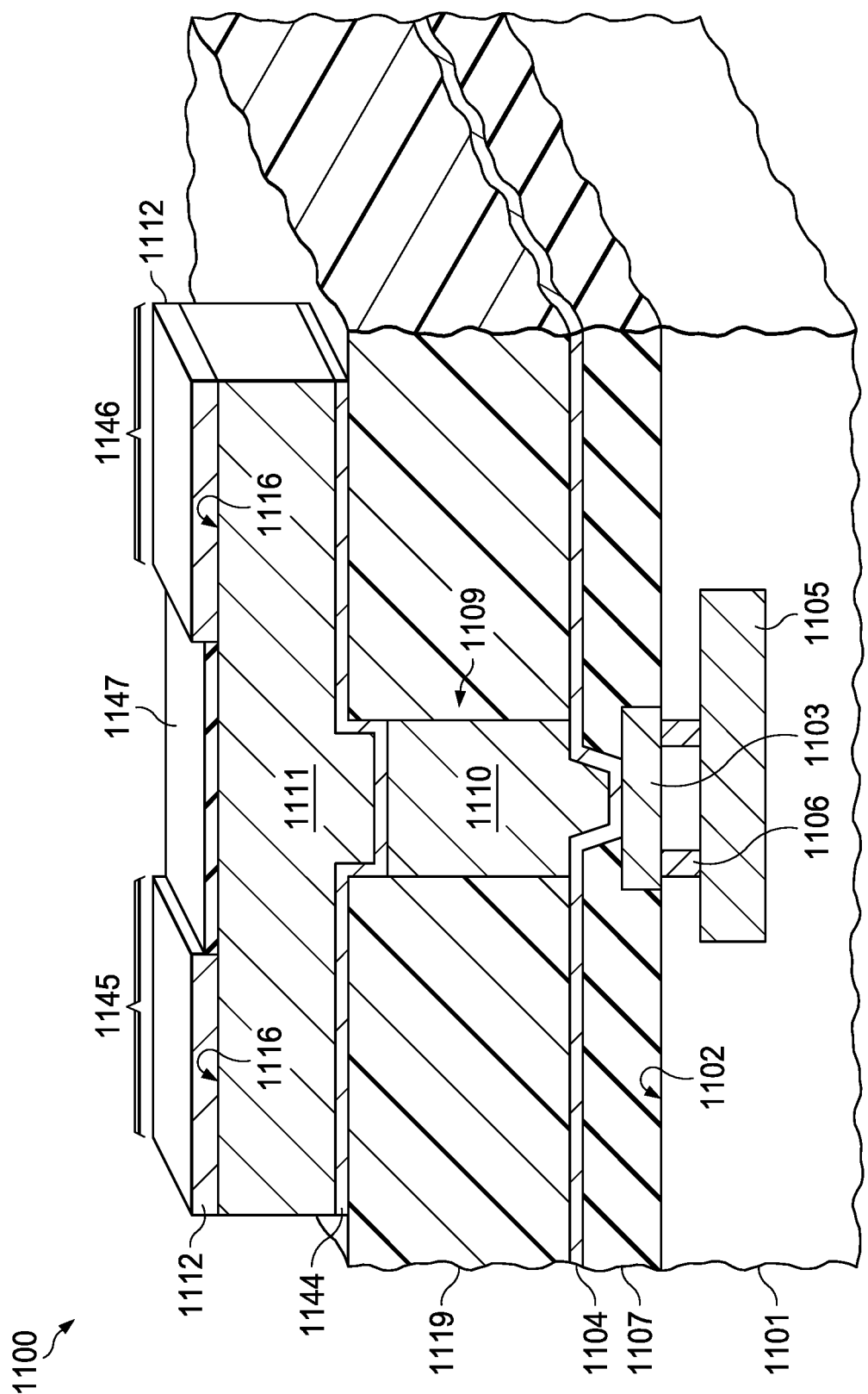

Referring to FIG. 11I, the second seed layer 1144 is removed where exposed by the expanded head 1111, leaving the second seed layer 1144 in place at least between the column 1110 and the expanded head 1111. The second seed layer 1144 may be removed, for example, by a wet etch process or a plasma process. Removal of the second seed layer 1144 may leave the column plating mask 1119 substantially intact, as indicated in FIG. 11I.

Figure 11J:
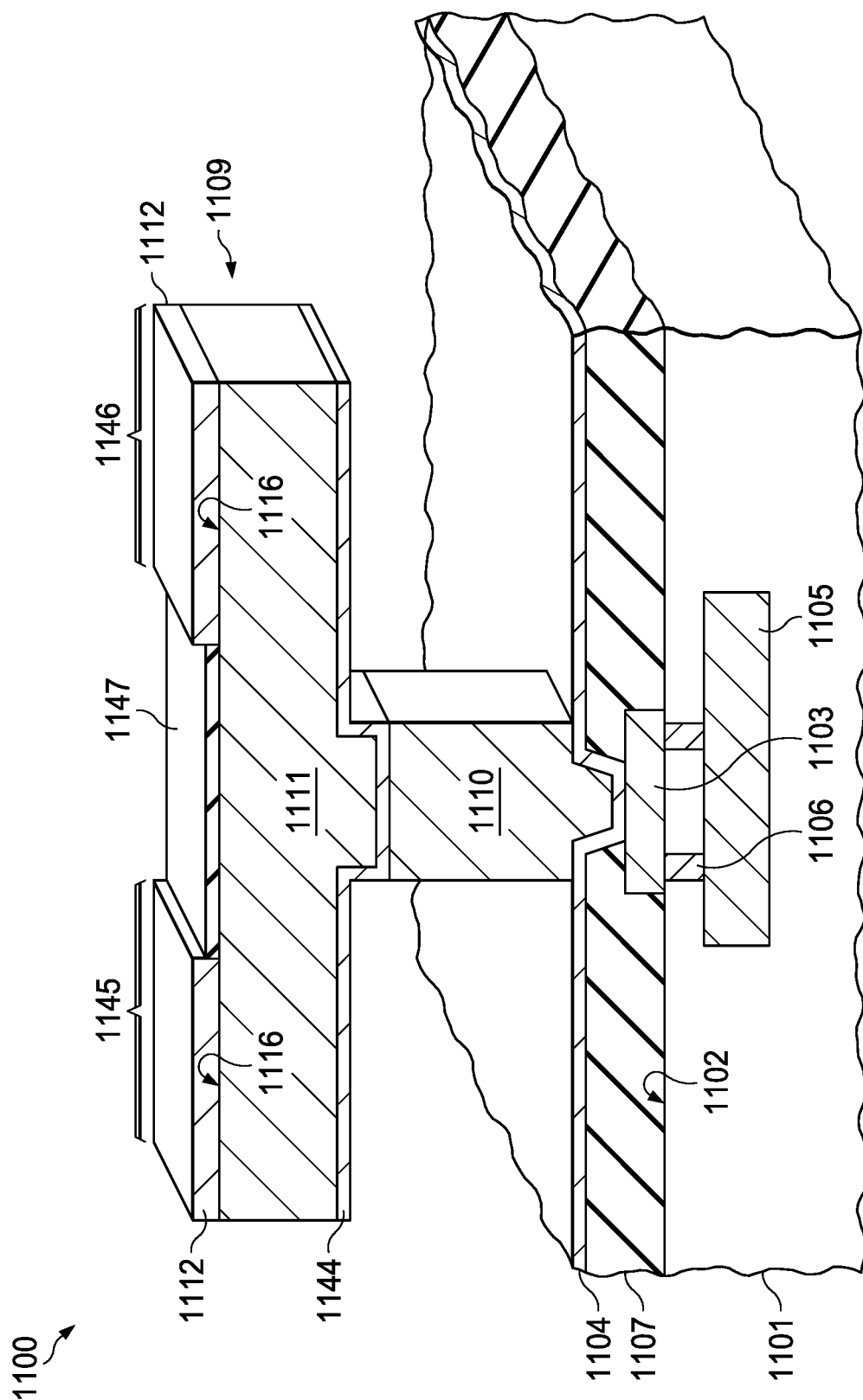

Referring to FIG. 11J, the column plating mask 1119 of FIG. 11I is removed. The column plating mask 1119 may be removed, for example, using any of the methods disclosed in reference to FIG. 2E or FIG. 4E. In the instant example, removal of the column plating mask 1119 may leave the first seed layer 1104 and the second seed layer 1144 substantially intact, as indicated in FIG. 11J.

Figure 11K:
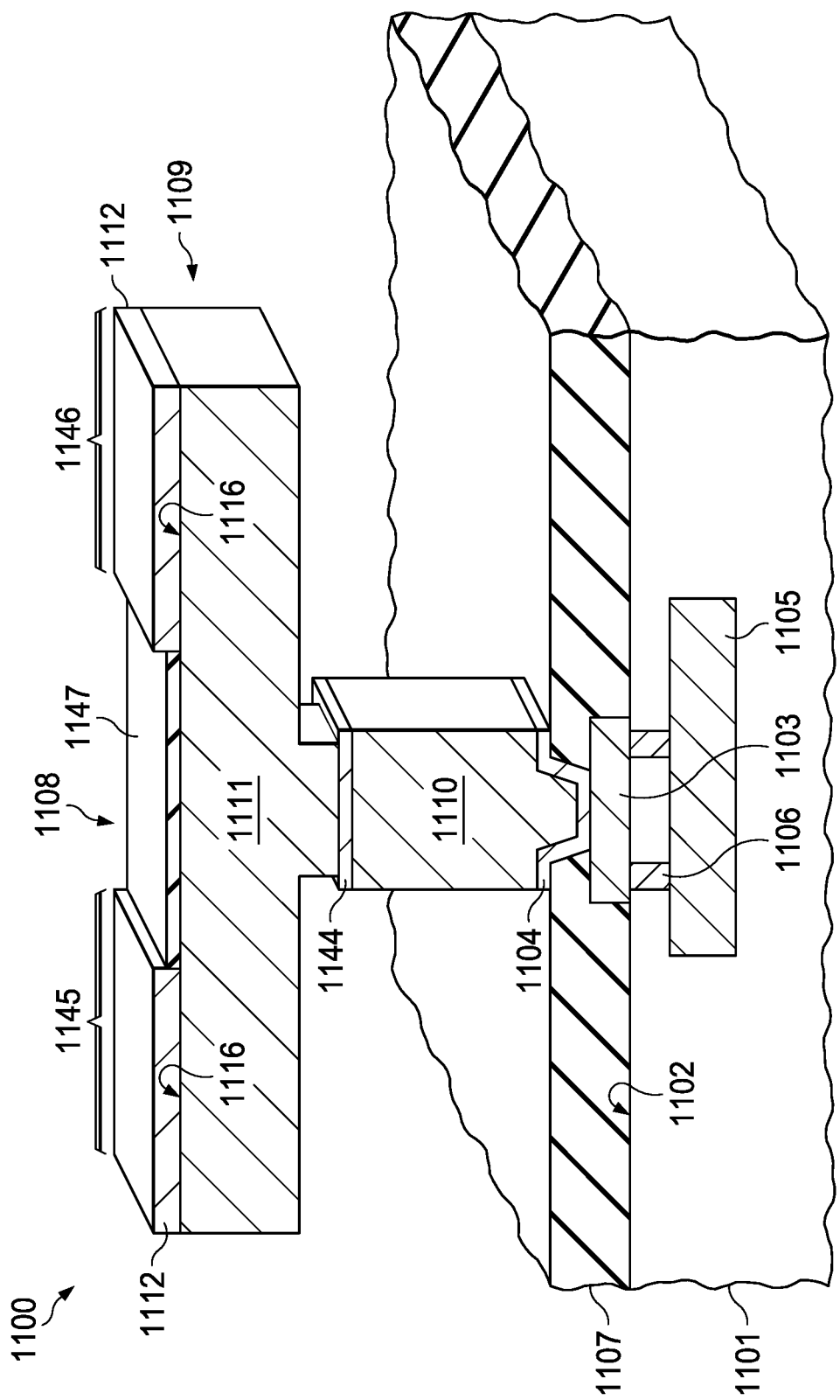

Referring to FIG. 11K, the first seed layer 1104 is removed where exposed by the column 1110, leaving the first seed layer 1104 between the column 1110 and the I/O pad 1103. The first seed layer 1104 may be removed by a wet etch process or a plasma process, so as to leave at least a portion of the PO layer 1107 in place over the substrate 1101. Removal of the first seed layer 1104 may also remove a portion of the second seed layer 1144 where exposed to the reagents used to remove the first seed layer 1104, leaving the second seed layer 1144 between the column 1110 and the expanded head 1111. The column 1110, the second seed layer 1144, the expanded head 1111, and the solder 1112 provide a bump bond structure 1108 of the microelectronic device 1100.

Figure 12A:
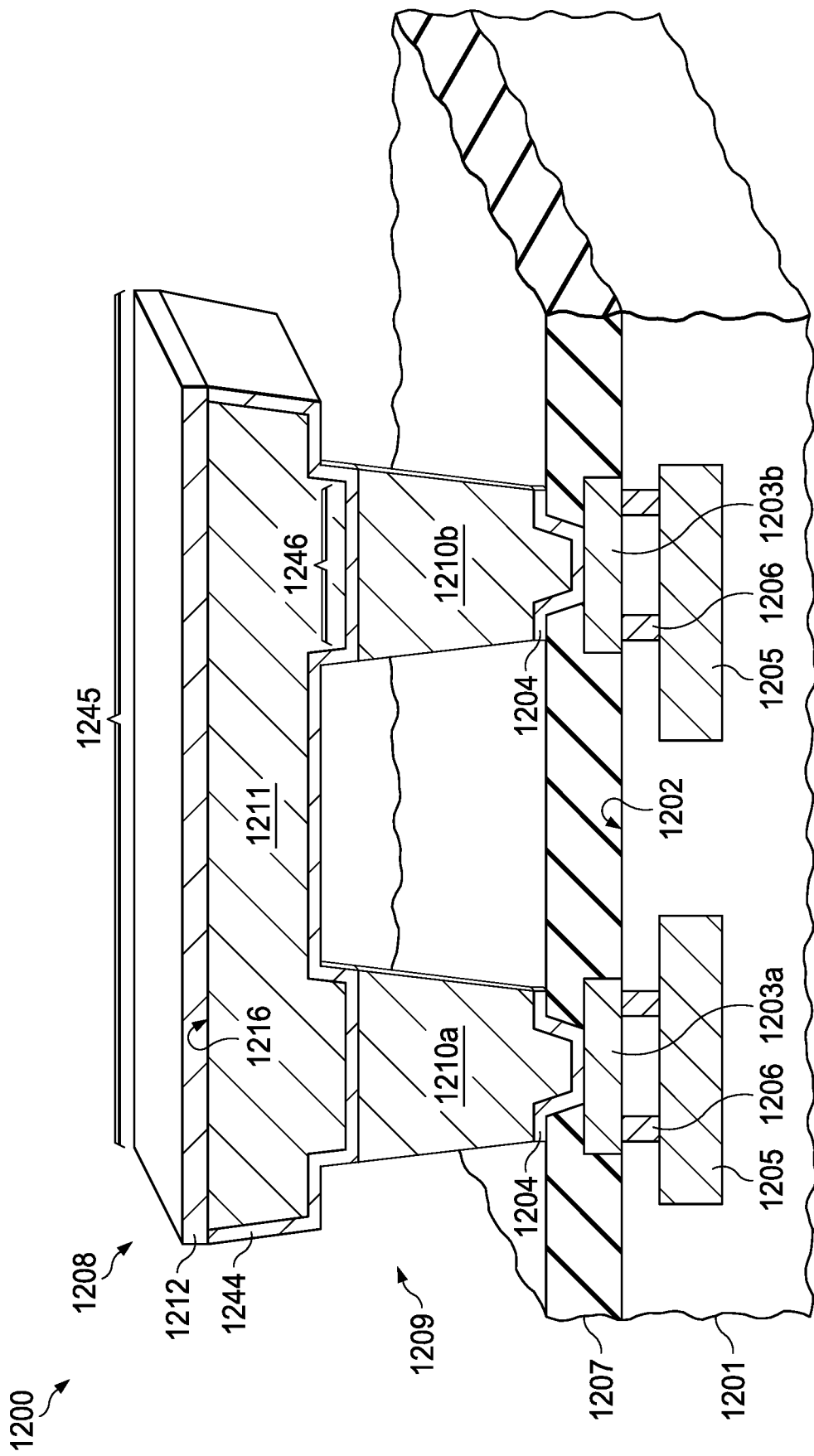
FIG. 12A and FIG. 12B are cross sections of a further example microelectronic device which includes a pair of electrically conductive pillars with an expanded head.
Figure 12B:
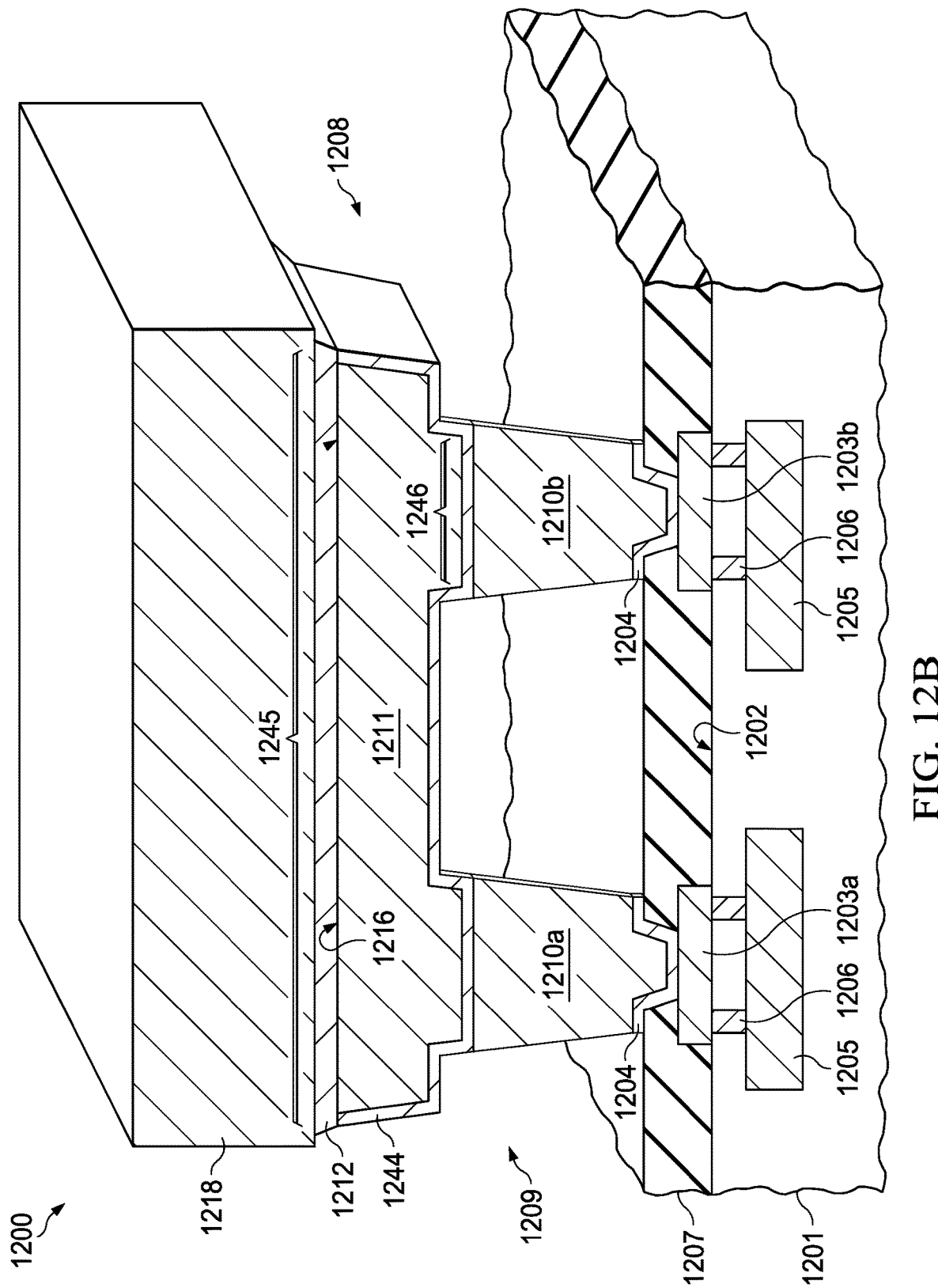

FIG. 12A and FIG. 12B are cross sections of a further example microelectronic device which includes a pair of electrically conductive pillars with an expanded head. Referring to FIG. 12A, the microelectronic device 1200 has a substrate 1201 with an I/O surface 1202. The microelectronic device 1200 includes a first I/O pad 1203*a* and a second I/O pad 1203*b*, on the I/O surface 1202. The substrate 1201 may be similar to the substrate 101 disclosed in reference to FIG. 1A. The I/O pads 1203*a* and 1203*b* may be electrically coupled to interconnects 1205 through vias 1206. A PO layer 1207 may optionally be disposed over the I/O surface 1202, with openings that expose the I/O pads 1203*a* and 1203*b*. A first seed layer 1204 may be disposed on the I/O pads 1203*a* and 1203*b*. The first seed layer 1204 may have a composition similar to the seed layer 104 of FIG. 1A.

The microelectronic device 1200 includes a bump bond structure 1208 on the I/O pads 1203*a* and 1203*b*. The bump bond structure 1208 includes an electrically conductive pillar 1209 having a first column 1210*a* on the first I/O pad 1203*a*, and a second column 1210*b* on the second I/O pad 1203*b*. The bump bond structure 1208 also includes an expanded head 1211 on the first column 1210*a* and the second column 1210*b*. In the instant example, the bump bond structure 1208 may include a second seed layer 1244 between the first column 1210*a* and the expanded head 1211, and between the second column 1210*b* and the expanded head 1211. The second seed layer 1244 may have a composition suitable for an electroplating process. In the instant example, the second seed layer 1244 may extend onto lateral surfaces of the expanded head 1211, as depicted in FIG. 12A. The columns 1210*a* and 1210*b*, and the expanded head 1211 may include may include may include any of the electrically conductive materials disclosed in reference to FIG. 1A. In one version of the instant example, the columns 1210*a* and 1210*b*, and the expanded head 1211 may include primarily copper. The first column 1210*a* extends from the first seed layer 1204 to the second seed layer 1244, and similarly for the second column 1210*b*. The expanded head 1211 is located on the second seed layer 1244, opposite from the first column 1210*a* and the second column 1210*b*. The expanded head 1211 has a contact surface 1216 which is flat. The contact surface 1216 is located opposite from the first column 1210*a* and the second column 1210*b*. The bump bond structure 1208 of the instant example has a first connection area 1245 on the contact surface 1216. The bump bond structure 1208 of the instant example has a second connection area 1246 at a boundary between the expanded head 1211 and the second column 1210*b*, where the expanded head 1211 contacts the second column 1210*b* through the second seed layer 1244. The bump bond structure 1208 includes solder 1212 on the contact surface 1216 of the expanded head 1211. The solder 1212 may have a composition as disclosed in reference to the solder 112 of FIG. 1A.

FIG. 12B depicts the microelectronic device 1200 after being assembled into a package structure, such as a lead frame or chip carrier. The bump bond structure 1208 is connected to a package electrode 1218 of the package structure, which may be a lead 1218. The solder 1212 couples the electrically conductive pillar 1209 to the package electrode 1218 at the first connection area 1245. The bump bond structure 1208 thus electrically connects the first I/O pad 1203*a* to the package electrode 1218 through the first connection area 1245, and to the second I/O pad 1203*b* through the second connection area 1246. The bump bond structure 1208 may advantageously enable a smaller package structure for a given size of the microelectronic device 1200.

Figure 13A:
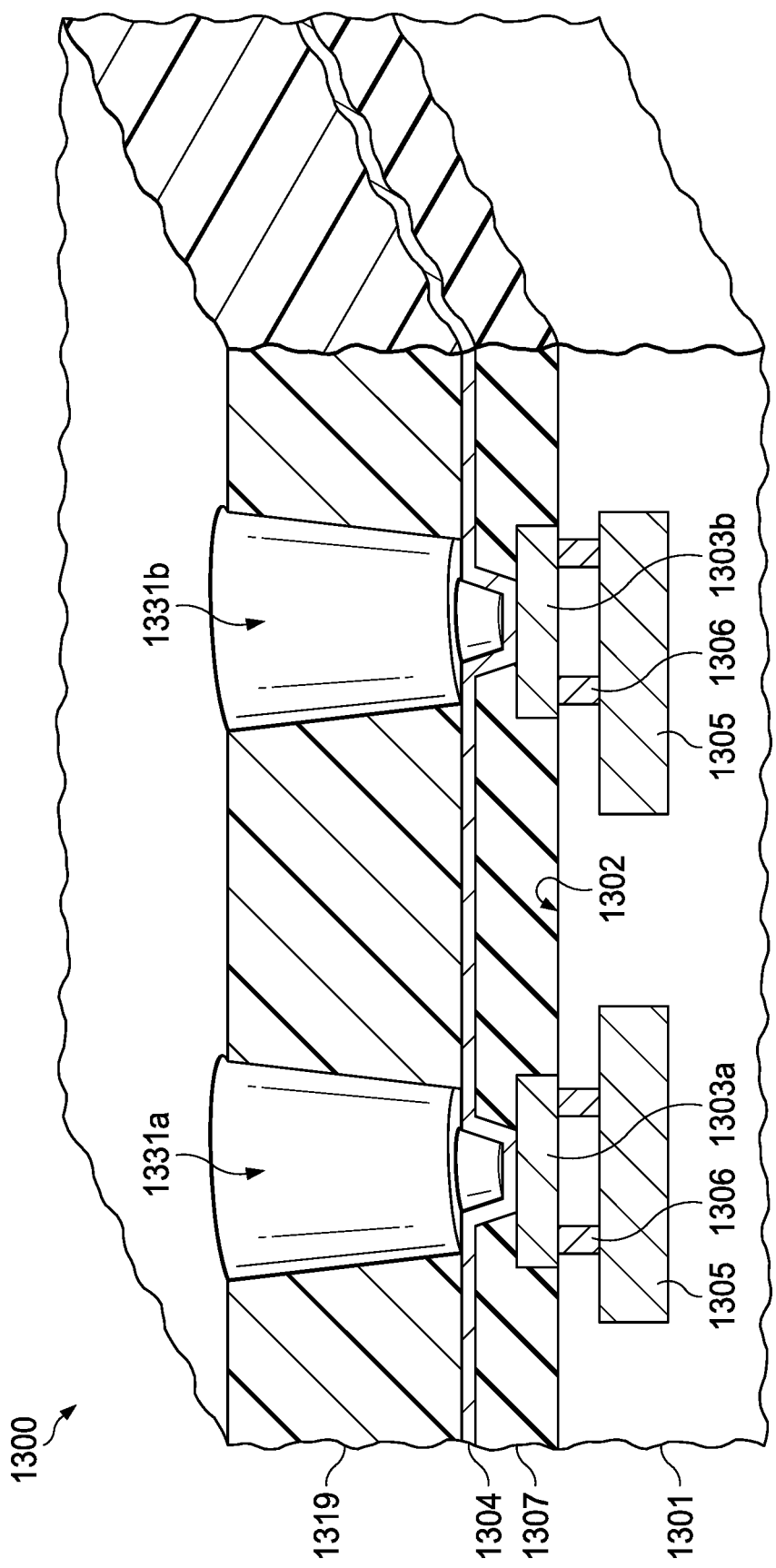
FIG. 13A through FIG. 13I are cross sections of a microelectronic device which includes electrically conductive pillars with expanded heads, depicted in stages of another example method of formation.

FIG. 13A through FIG. 13I are cross sections of a microelectronic device which includes electrically conductive pillars with expanded heads, depicted in stages of another example method of formation. Referring to FIG. 13A, the microelectronic device 1300 has a substrate 1301 with an I/O surface 1302. The microelectronic device 1300 includes a first I/O pad 1303*a* and a second I/O pad 1303*b*, on the I/O surface 1302. The substrate 1301 may be similar to the substrate 101 disclosed in reference to FIG. 1A. The I/O pads 1303*a* and 1303*b* may be electrically coupled to interconnects 1305 through vias 1306. A PO layer 1307 may optionally be disposed over the I/O surface 1302, with openings that expose the I/O pads 1303*a* and 1303*b*.

A first seed layer 1304 is formed over the I/O surface 1302, on the PO layer 1307, if present. The first seed layer 1304 contacts the I/O pads 1303a and 1303b, through the openings in the PO layer 1307. The first seed layer 1304 may have a composition similar to the first seed layer 1104 of FIG. 11A, and may be formed by a similar process.

A column plating mask 1319 is formed over the first seed layer 1304. The column plating mask 1319 has a first column opening 1331a which exposes the first seed layer 1304 in a first area over the first I/O pad 1303a, and has a second column opening 1331b which exposes the first seed layer 1304 in a second area over the second I/O pad 1303b. The first column opening 1331a and the second column opening 1331b may have tapered vertical profiles, as depicted in FIG. 13A. The column plating mask 1319 may be formed by a photolithographic process with relaxed specifications compared to a process which forms a similar plating mask having openings with constant-width vertical profiles. Using a photolithographic process with relaxed specifications may advantageously reduce a fabrication cost of the microelectronic device 1300.

Figure 13B:
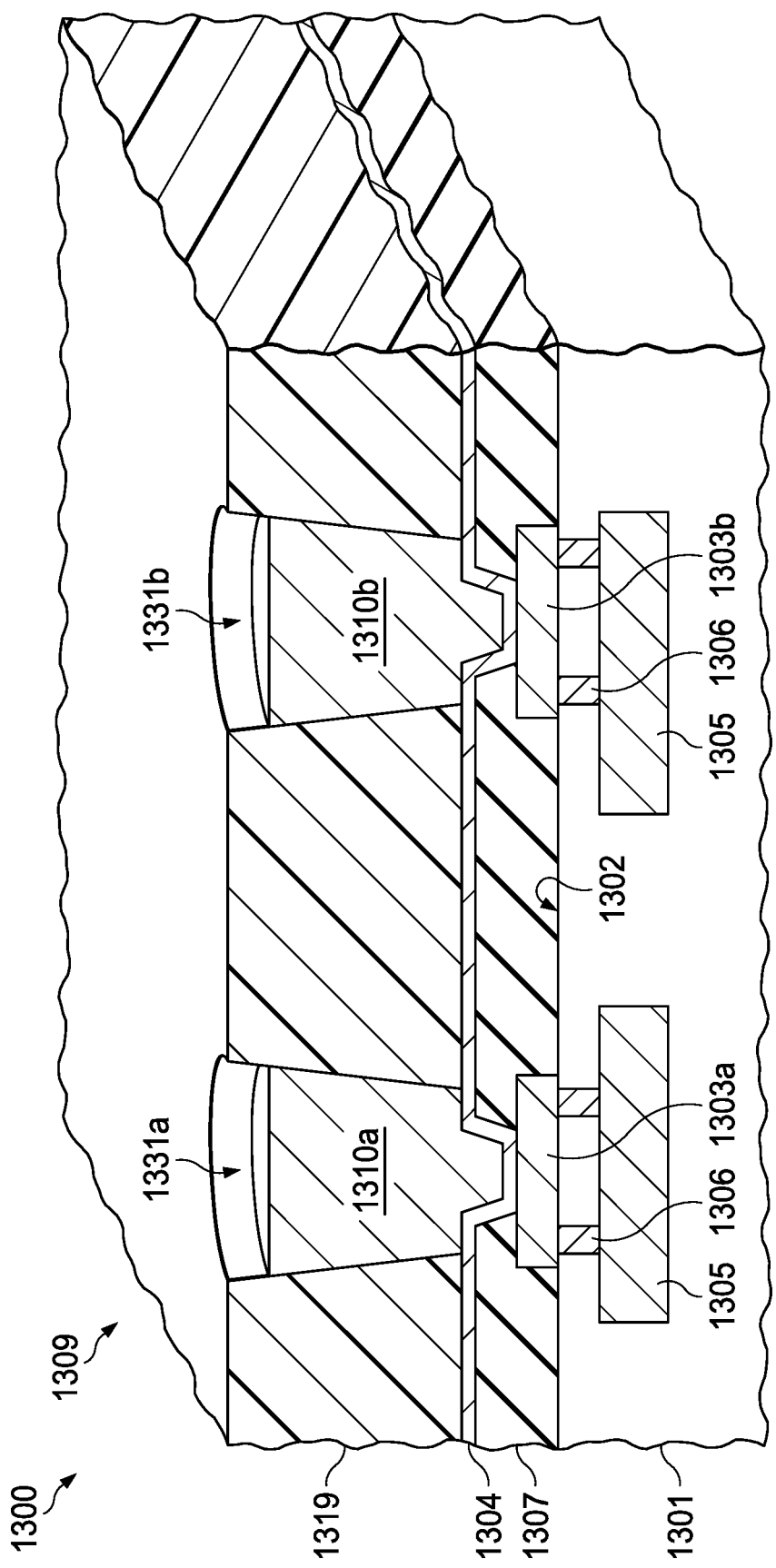

Referring to FIG. 13B, a column electroplating process forms a first column 1310a on the first seed layer 1304 in the first column opening 1331a, and a second column 1310b on the first seed layer 1304 in the second column opening 1331b. The column electroplating process may have be similar to the column electroplating process disclosed in reference to FIG. 2B. The first column 1310a and the second column 1310b are part of an electrically conductive pillar 1309.

Figure 13C:
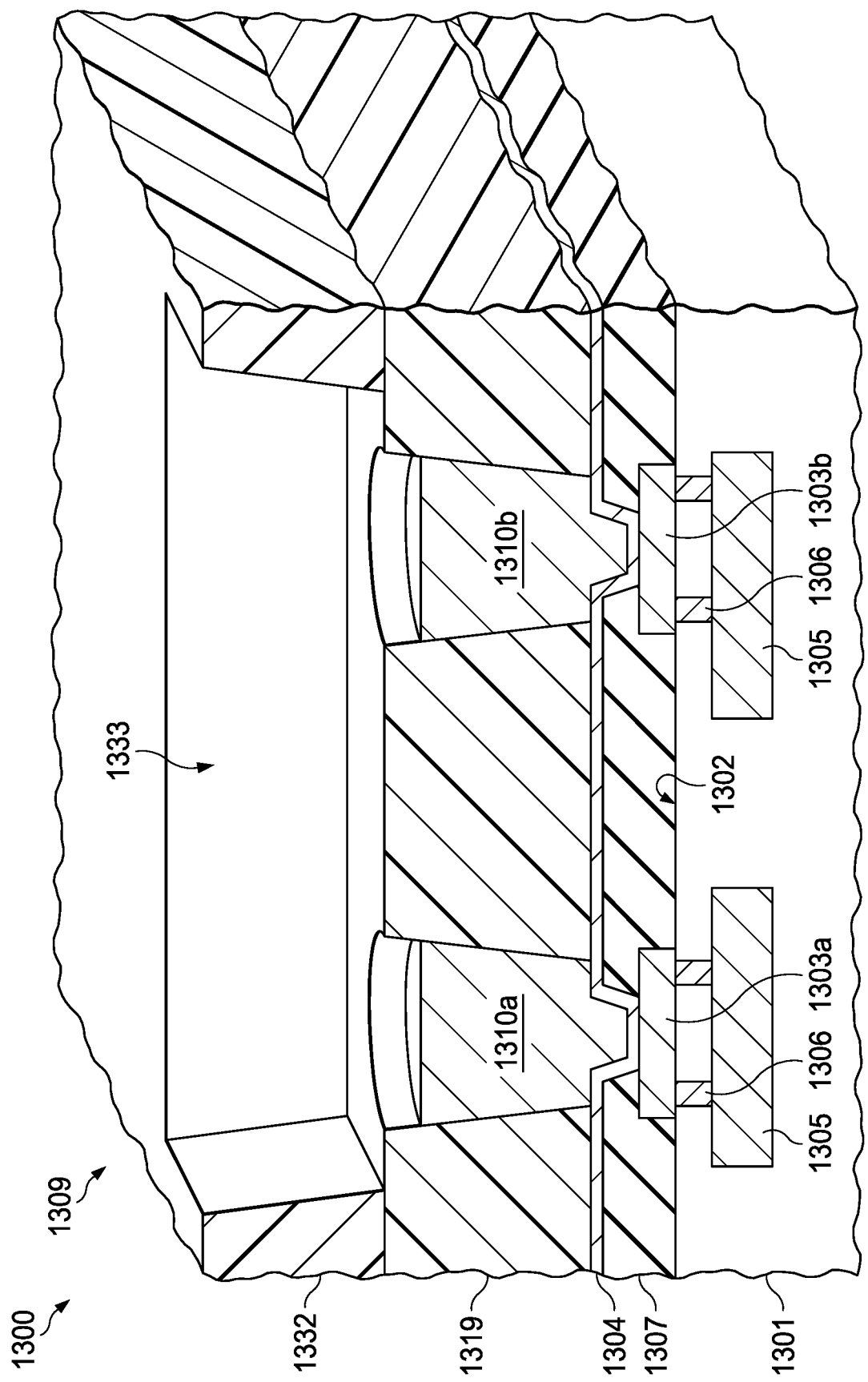

Referring to FIG. 13C, a head trench layer 1332 is formed over the column plating mask 1319. The head trench layer 1332 has a head trench 1333 which exposes the first column 1310a and the second column 1310b, and exposes the column plating mask 1319 around the first column 1310a and around the second column 1310b, as shown in FIG. 13C. The head trench layer 1332 may be formed, for example, by a process compatible with the column plating mask 1319.

Figure 13D:
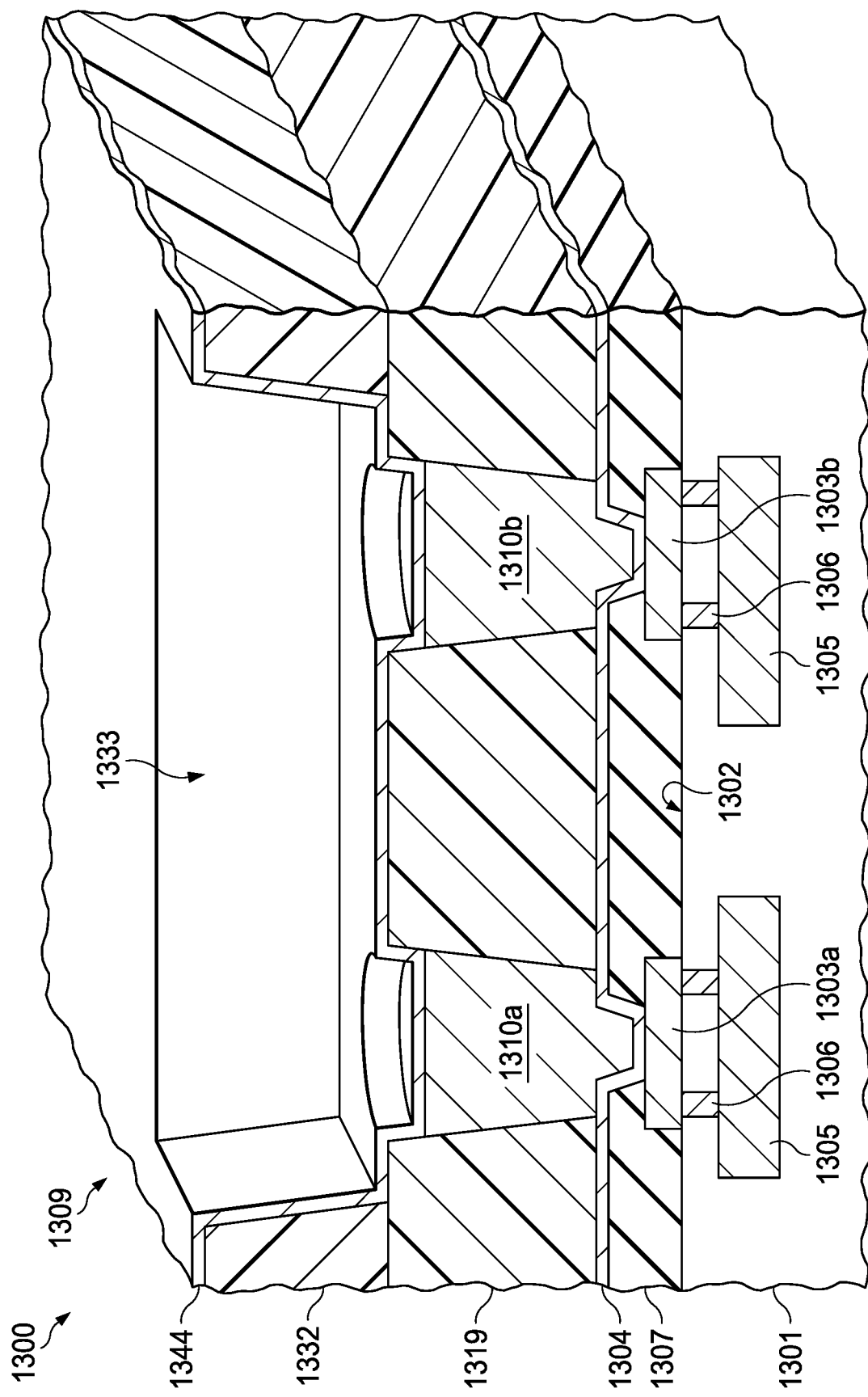

Referring to FIG. 13D, a second seed layer 1344 is formed over the head trench layer 1332, extending into the head trench 1333 and contacting the first column 1310a and the second column 1310b. The second seed layer 1344 provides an electrically conductive layer for a subsequent head electroplating process. The second seed layer 1344 may include any of the metals disclosed in reference to the seed layer 104 of FIG. 1A, and may be formed as disclosed in reference to the seed layer 204 of FIG. 2A.

Figure 13E:
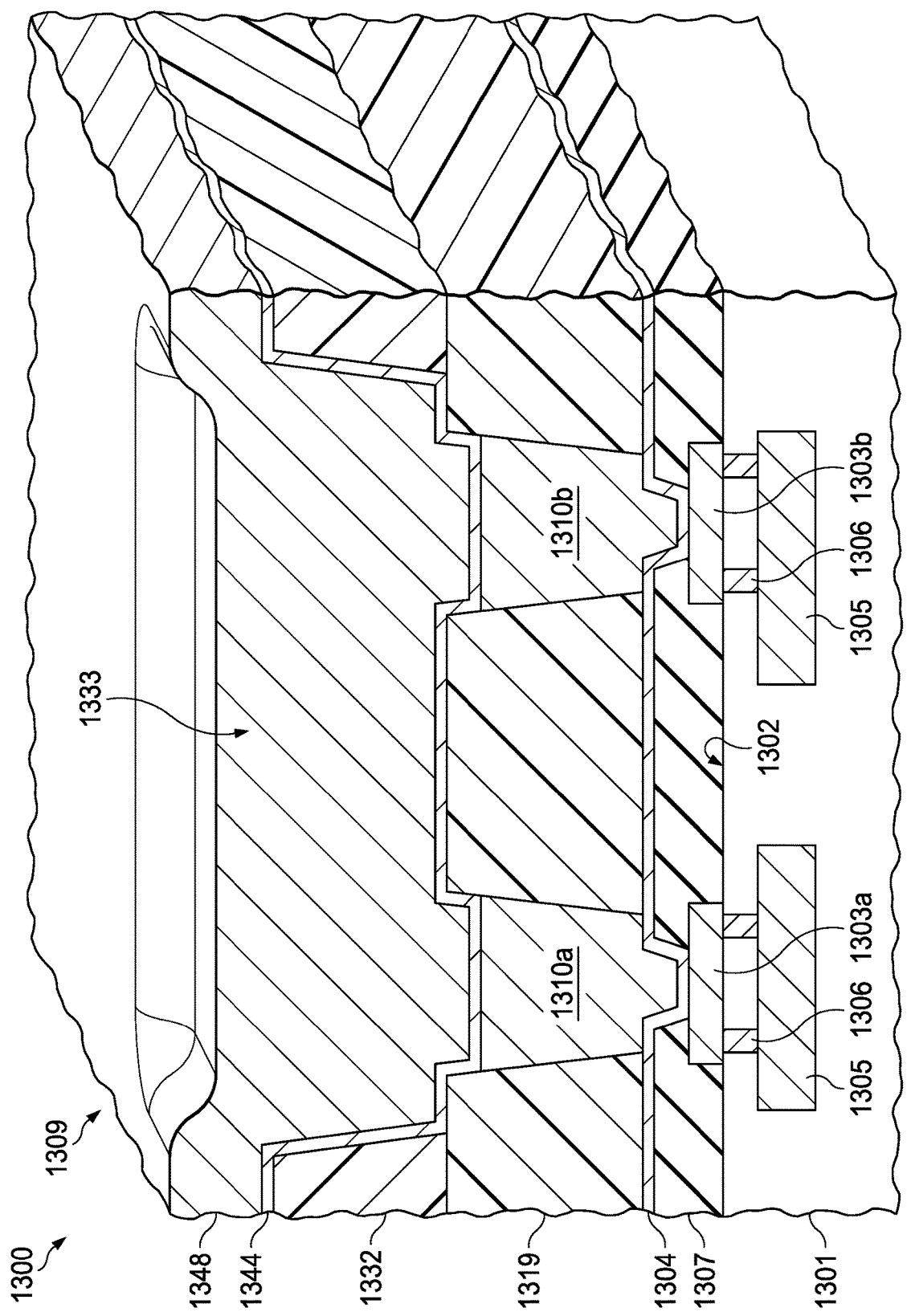

Referring to FIG. 13E, the head electroplating process forms a copper head layer 1348 on the second seed layer 1344. The copper head layer 1348 fills the head trench 1333 and extends over the head trench layer 1332 adjacent to the head trench 1333. The head electroplating process may use additives such as levelers; suppressors, sometimes referred to as inhibitors; and accelerators, sometimes referred to as brighteners, to form the copper head layer 1348 with a greater thickness in the head trench 1333 than over the head trench layer 1332 adjacent to the head trench 1333.

Figure 13F:
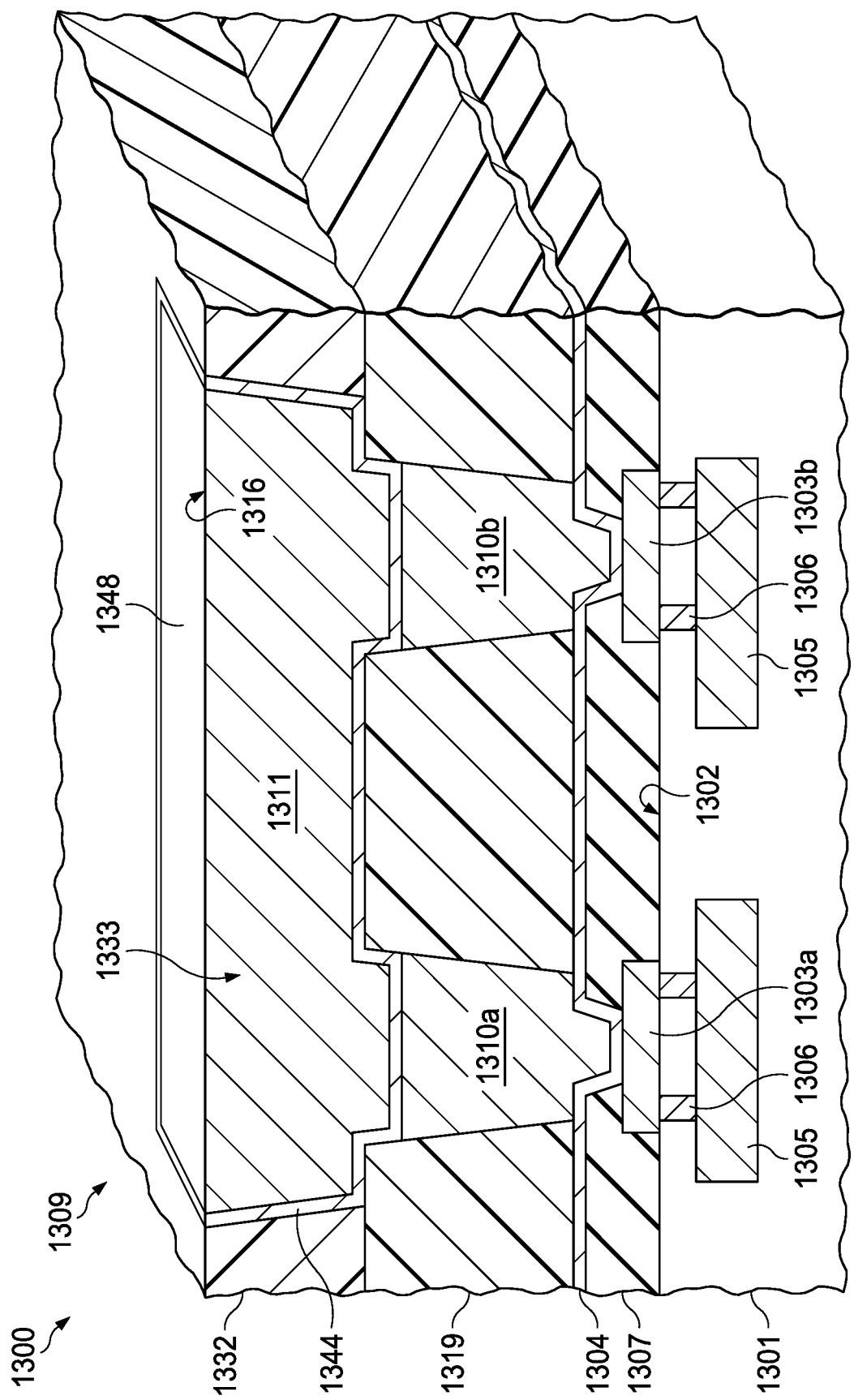

Referring to FIG. 13F, the copper head layer 1348 over the head trench layer 1332 adjacent to the head trench 1333 is removed, leaving the copper head layer 1348 in the head trench 1333, to provide an expanded head 1311 of the electrically conductive pillar 1309. The second seed layer 1344 over the head trench layer 1332 adjacent to the head trench 1333 is also removed. The copper head layer 1348 over the head trench layer 1332 may be removed, for example, by a copper chemical mechanical polishing (CMP) process, which uses a polishing pad and a slurry which removes copper. The second seed layer 1344 over the head trench layer 1332 may also be removed by the copper CMP process, or may be removed by a selective wet etch process. The expanded head 1311 has a contact surface 1316 located opposite from the first column 1310a and the second column 1310b. The method to form the expanded head 1311 as disclosed in reference to FIG. 13C through FIG. 13F is sometimes referred to as a damascene process, specifically a copper damascene process.

Figure 13G:
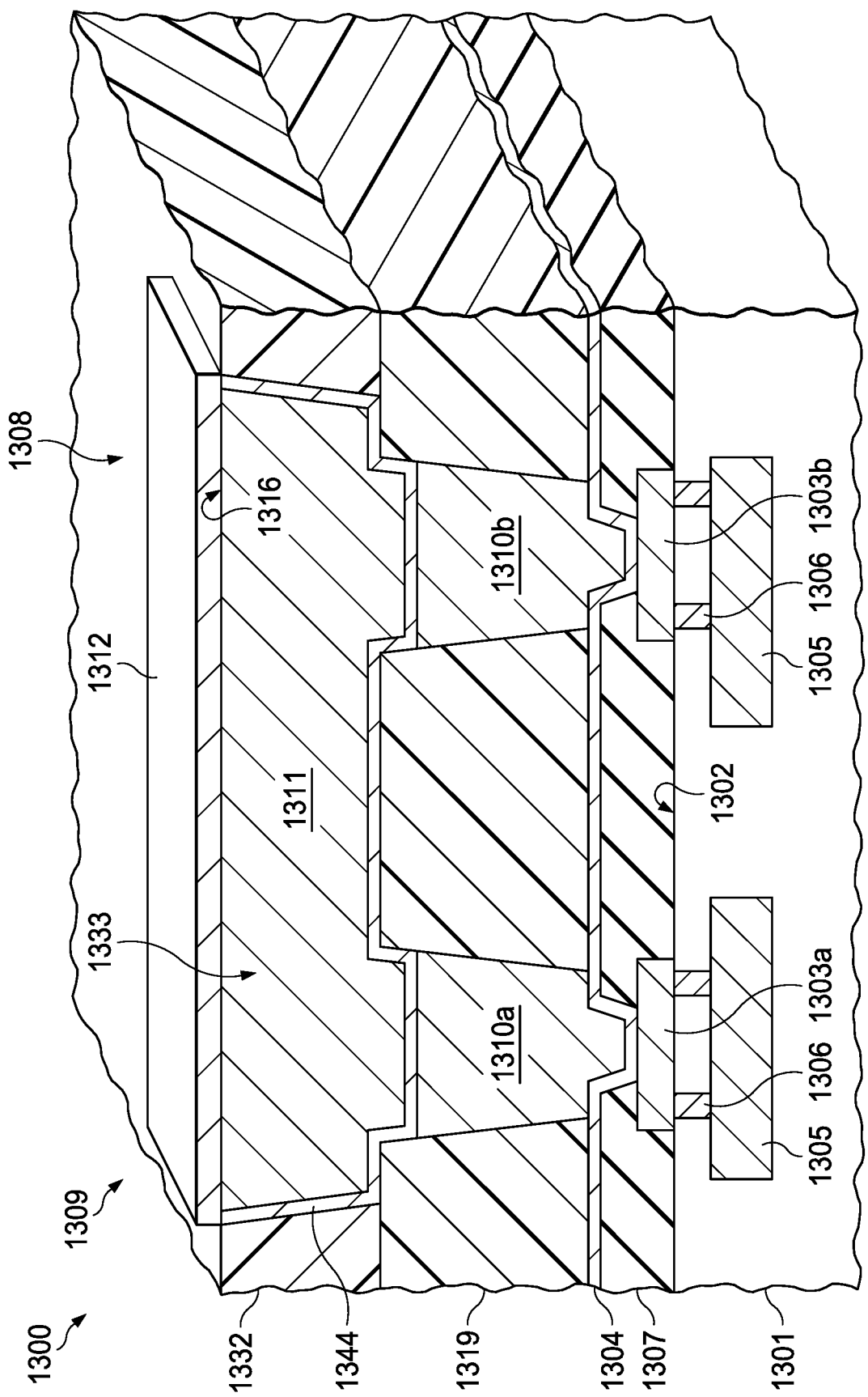

Referring to FIG. 13G, solder 1312 is formed on the contact surface 1316. The solder 1312 may be formed, for example, by an electroplating process, or by an additive process. The solder 1312 may include any of the metals disclosed in reference to the solder 112 of FIG. 1A. The first column 1310a, the second column 1310b, the second seed layer 1344, the expanded head 1311, and the solder 1312 provide a bump bond structure 1308 of the microelectronic device 1300.

Figure 13H:
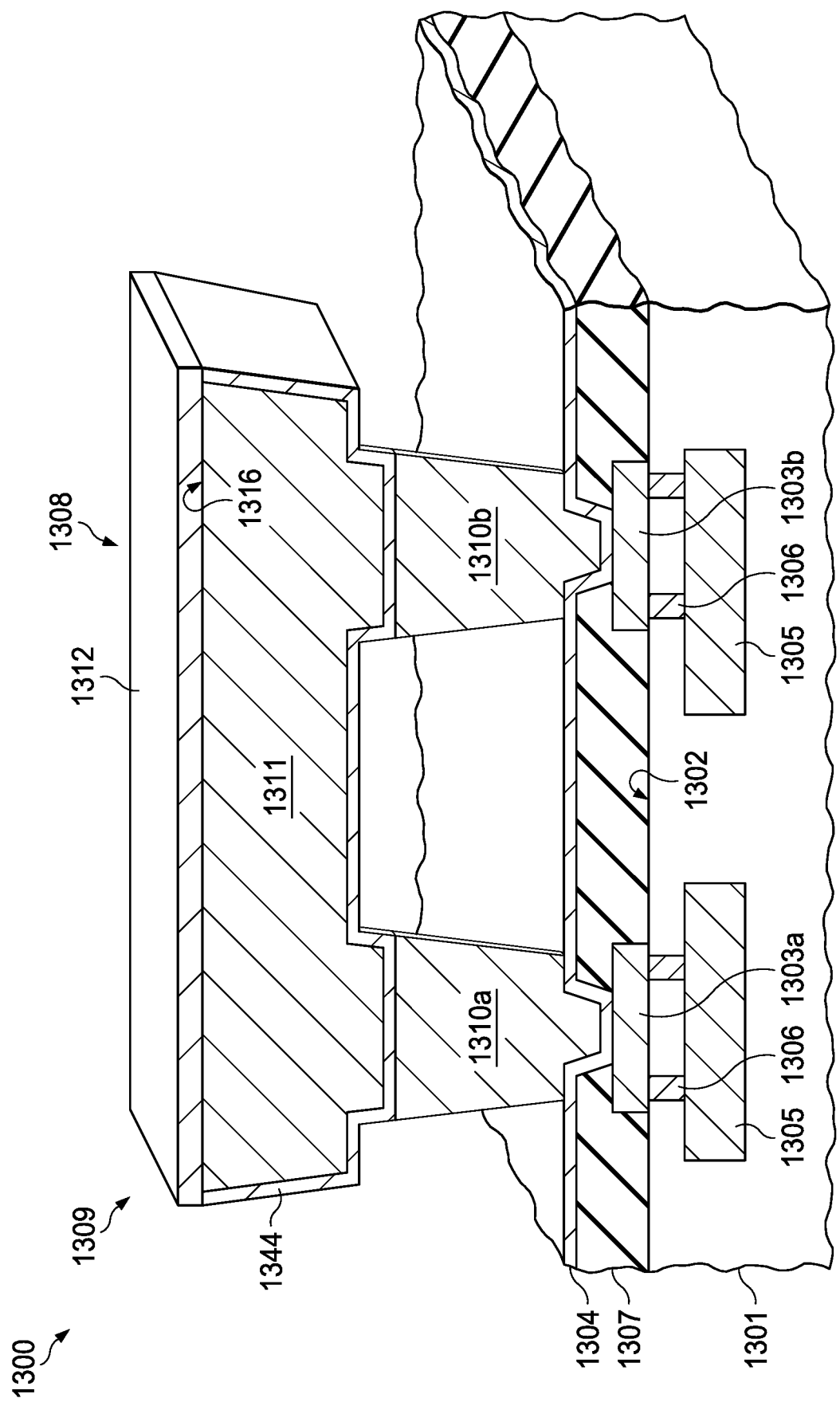

Referring to FIG. 13H, the head trench layer 1332 and the column plating mask 1319 of FIG. 13G are removed, leaving the bump bond structure 1308 in place on the first I/O pad 1303a and the second I/O pad 1303b. The head trench layer 1332 and the column plating mask 1319 may be removed by a single process, such as an oxygen plasma process or a downstream asher process. Alternatively, the head trench layer 1332 may be removed by a first removal process appropriate for material of the head trench layer 1332, and the column plating mask 1319 may be subsequently removed by a second removal process appropriate for material of the column plating mask 1319. For example, the first removal process may include a dry process using oxygen radicals, and the second removal process may include a wet removal process using one or more organic solvents.

Figure 13I:
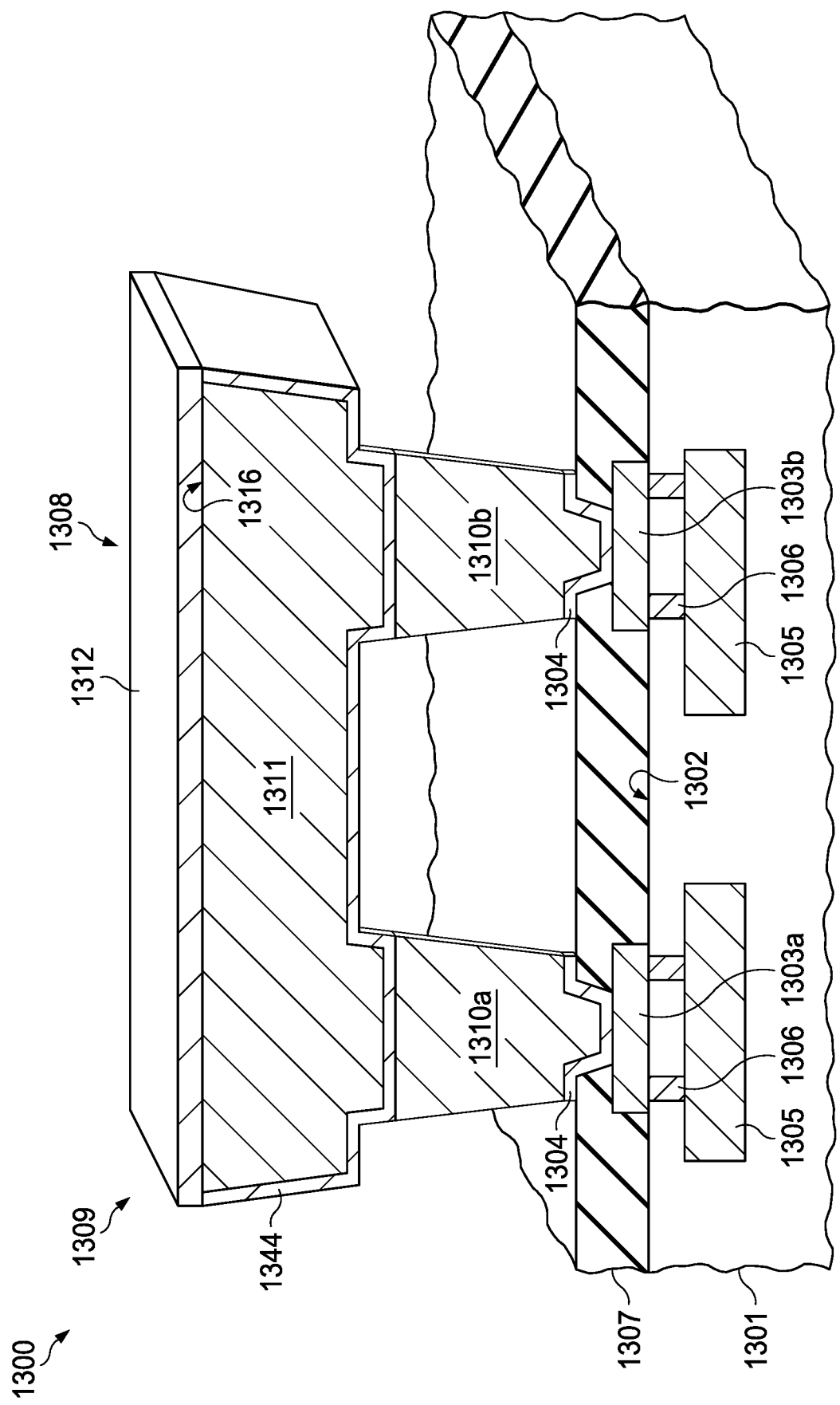

Referring to FIG. 13I, the first seed layer 1304 is removed where exposed by the first column 1310a and the second column 1310b, leaving the first seed layer 1304 between the first column 1310a and the first I/O pad 1303a, and between the second column 1310b and the second I/O pad 1303b. The first seed layer 1304 may be removed by a wet etch process or a plasma process, so as to leave at least a portion of the PO layer 1307 in place over the substrate 1301. In versions of the instant example in which the second seed layer 1344 has a different composition from the first seed layer 1304, removal of the first seed layer 1304 may leave the second seed layer 1344 substantially intact, as indicated in FIG. 13I. The first column 1310a and the second column 1310b, the second seed layer 1344, the expanded head 1311, and the solder 1312 provide a bump bond structure 1308 of the microelectronic device 1300.

Figure 14A:
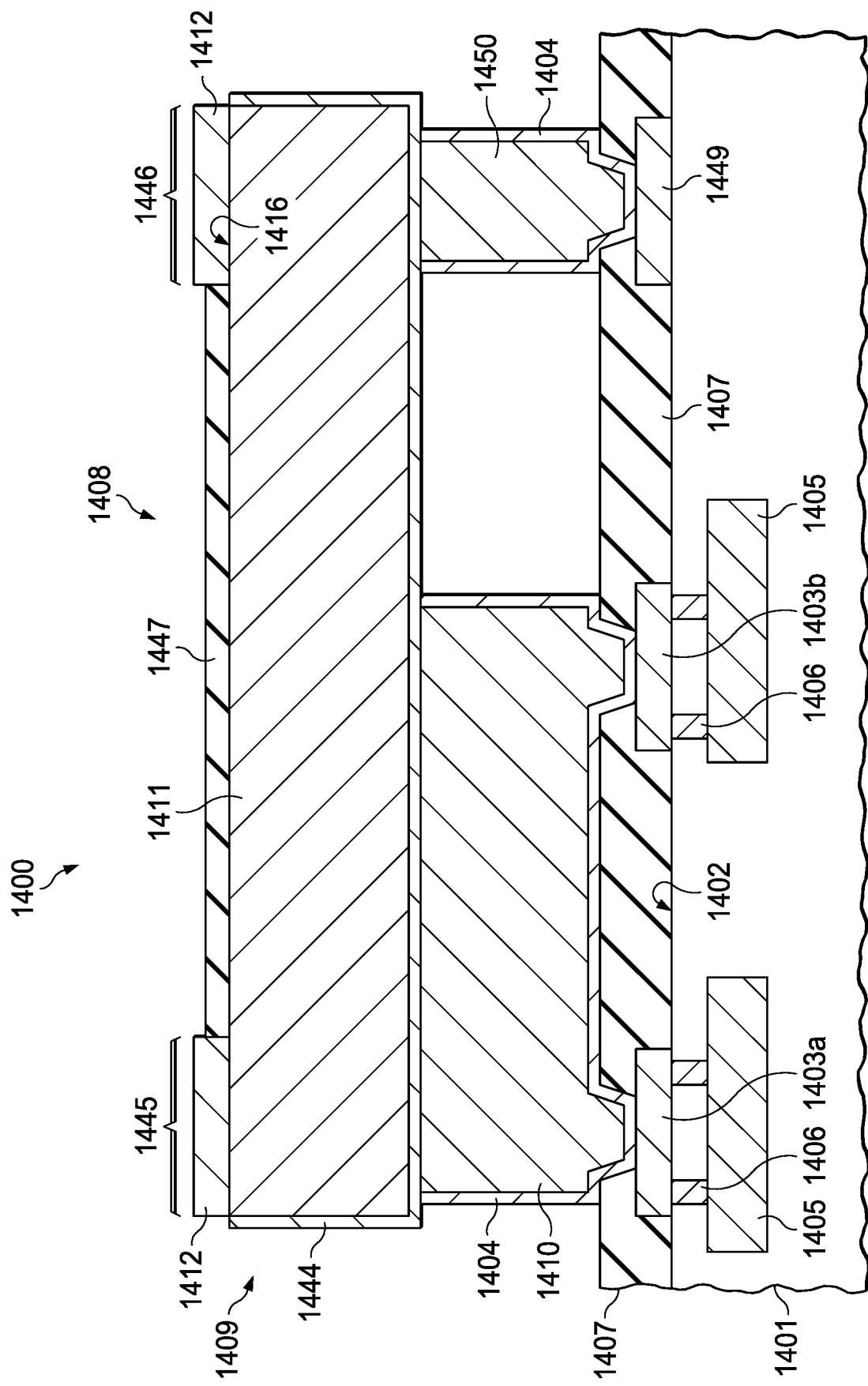
FIG. 14A and FIG. 14B are cross sections of a further example microelectronic device which includes an electrically conductive pillar with an expanded head.
Figure 14B:
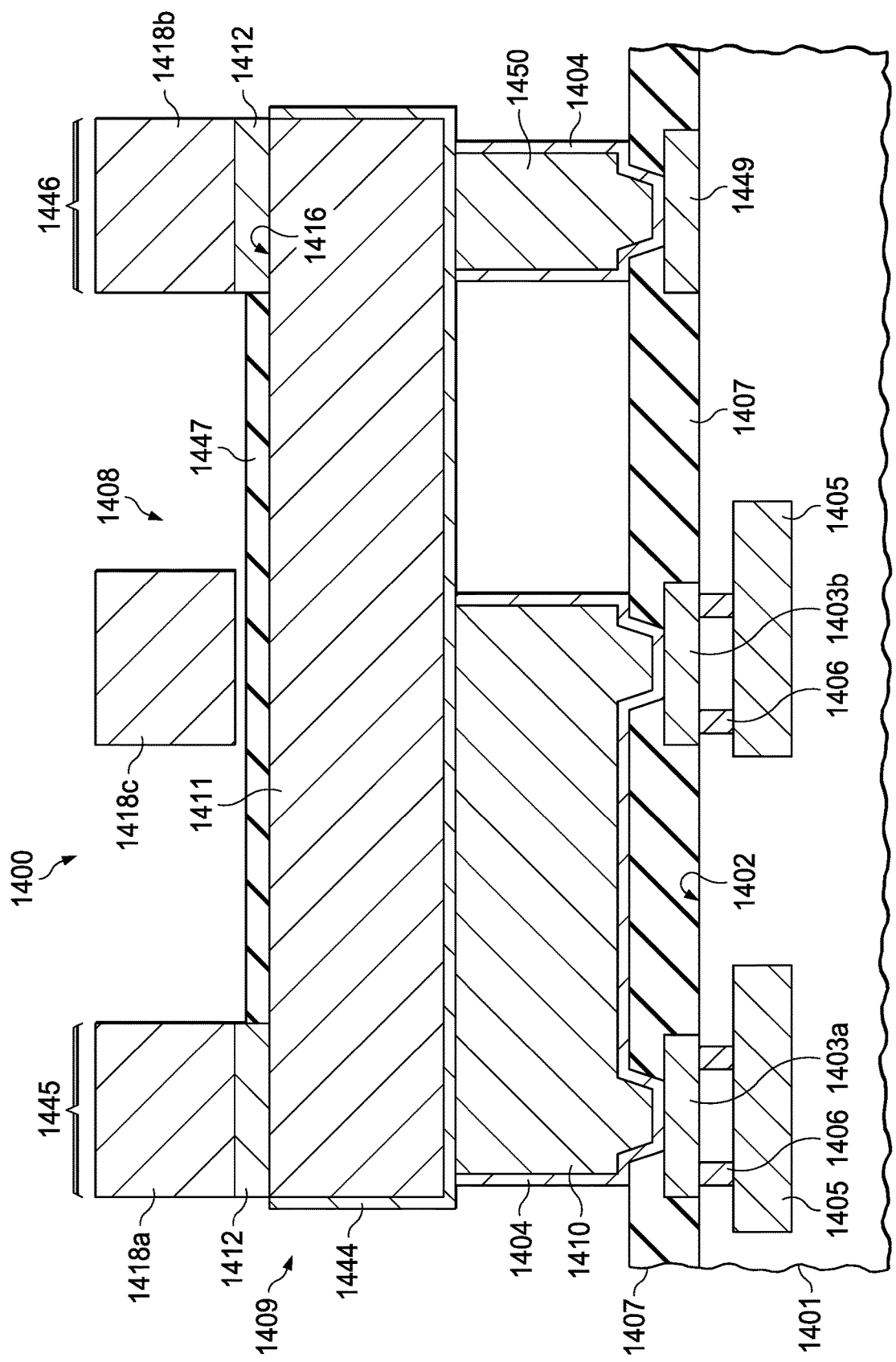

FIG. 14A and FIG. 14B are cross sections of a further example microelectronic device which includes an electrically conductive pillar with an expanded head. Referring to FIG. 14A, the microelectronic device 1400 has a substrate 1401 with an I/O surface 1402. The microelectronic device 1400 includes a first I/O pad 1403a and a second I/O pad 1403b, on the I/O surface 1402. The substrate 1401 may be similar to the substrate 101 disclosed in reference to FIG. 1A. The I/O pads 1403a and 1403b may be electrically coupled to interconnects 1405 through vias 1406. A PO layer 1407 may optionally be disposed over the I/O surface 1402, with openings that expose the I/O pads 1403a and 1403b.

The microelectronic device 1400 of the instant example may further include an auxiliary pad 1449. The auxiliary pad 1449 may optionally be free of an electrical connection to one of the interconnects 1405 through one of the vias 1406, as depicted in FIG. 14A. The auxiliary pad 1449 may have a same composition and a same structure as the first I/O pad 1403a and the second I/O pad 1403b. The PO layer 1407 has an opening that exposes the auxiliary pad 1449.

A first seed layer 1404 may be disposed on the I/O pads 1403a and 1403b, and on the auxiliary pad 1449. The first seed layer 1404 may have a composition similar to the seed layer 104 of FIG. 1A.

The microelectronic device 1400 includes a bump bond structure 1408. The bump bond structure 1408 includes an electrically conductive pillar 1409. The electrically conductive pillar 1409 includes a column 1410 on the first seed layer 1404; the column 1410 extends over the first I/O pad 1403a and the second I/O pad 1403b. The electrically conductive pillar 1409 of the instant example also includes an auxiliary column 1450 on the first seed layer 1404 over the auxiliary pad 1449. The auxiliary column 1450 is separate from the column 1410. In the instant example, the first seed layer 1404 may extend onto lateral surfaces of the column 1410 and the auxiliary column 1450, as depicted in FIG. 14A.

The electrically conductive pillar 1409 further includes a second seed layer 1444 on the column 1410 and on the auxiliary column 1450. The electrically conductive pillar 1409 includes an expanded head 1411 on the second seed layer 1444. The expanded head 1411 of the instant example extends over the column 1410 and over the auxiliary column 1450. The second seed layer 1444 may extend onto lateral surfaces of the expanded head 1411, as depicted in FIG. 14A. The expanded head 1411 has a contact surface 1416 which is flat. The contact surface 1416 is located opposite from the column 1410 and opposite from the auxiliary column 1450. The auxiliary column 1450 may provide mechanical support for the expanded head 1411.

The bump bond structure 1408 of the instant example has a first connection area 1445 on the contact surface 1416, and a second connection area 1446 on the contact surface 1416. The bump bond structure 1408 includes solder 1412 on the expanded head 1411 in the first connection area 1445 and in the second connection area 1446. The bump bond structure 1408 may optionally include an insulator layer 1447 on the expanded head 1411 between the first connection area 1445 and the second connection area 1446.

Referring to FIG. 14B, the microelectronic device 1400 is assembled into a package structure, such as a lead frame or chip carrier. The package structure has a first package electrode 1418a, a second package electrode 1418b, and a third package electrode 1418c located between the first package electrode 1418a and the second package electrode 1418b. The first package electrode 1418a, the second package electrode 1418b, and the third package electrode 1418c may be manifested as a first lead 1418a, a second lead 1418b, and a third lead 1418c. The bump bond structure 1408 is connected to the first lead 1418a and the second lead 1418b. The solder 1412 couples the electrically conductive pillar 1409 in the first connection area 1445 to the first lead 1418a, and couples the electrically conductive pillar 1409 in the second connection area 1446 to the second lead 1418b. The third lead 1418c may be isolated from the expanded head 1411 by the insulator layer 1447, advantageously preventing an undesired electrical contact between the third lead 1418c and the bump bond structure 1408. Having the expanded head 1411 connected to the first lead 1418a and the second lead 1418b may enable a more efficient layout for the microelectronic device 1400 or the leads 1418a, 1418b, and 1418c, compared to using bump bond structures with one connection area per bump bond structure.

Figure 15A:
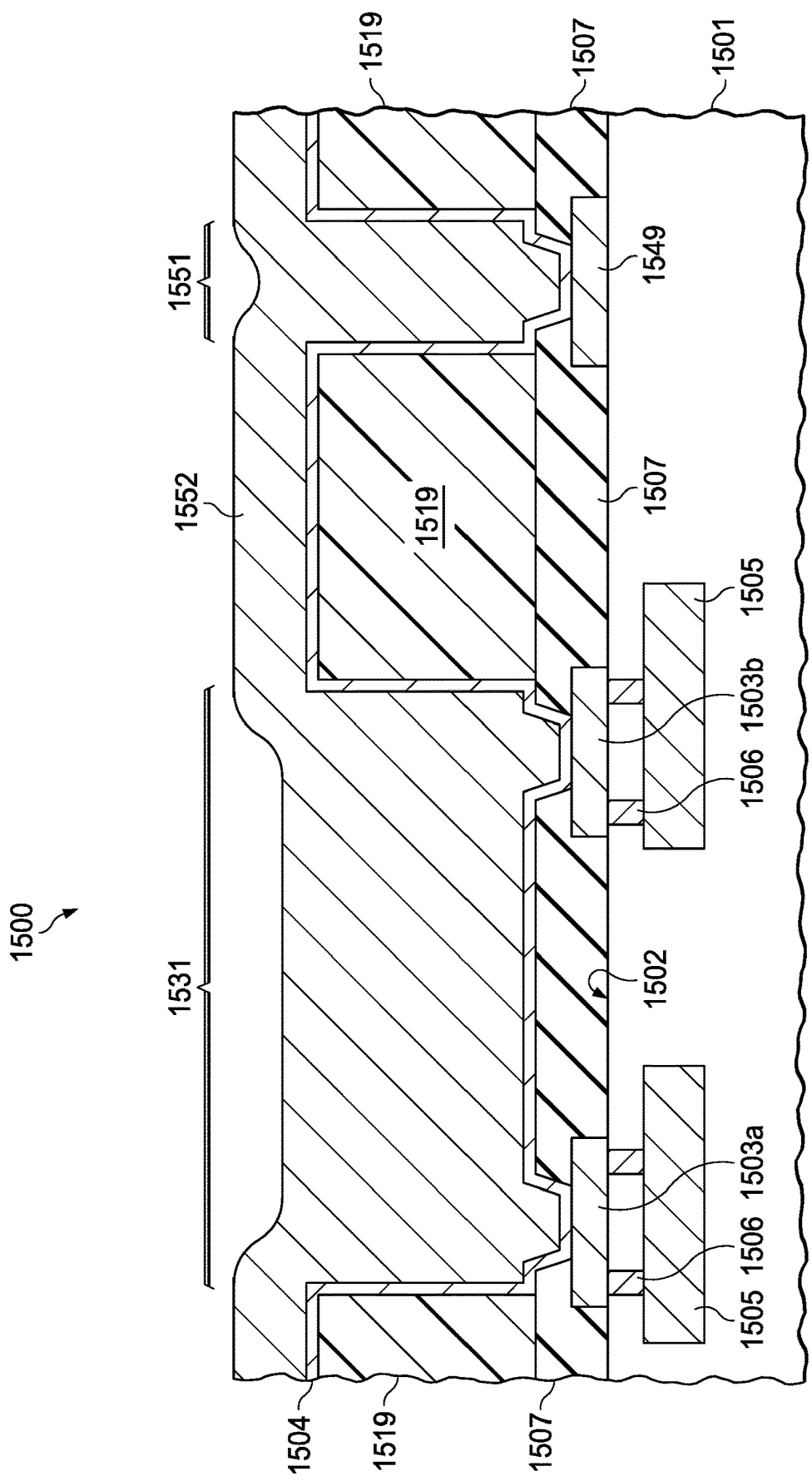
FIG. 15A through FIG. 15F are cross sections of a microelectronic device which includes electrically conductive pillars with expanded heads, depicted in stages of a further example method of formation.

FIG. 15A through FIG. 15F are cross sections of a microelectronic device which includes electrically conductive pillars with expanded heads, depicted in stages of a further example method of formation. Referring to FIG. 15A, the microelectronic device 1500 has a substrate 1501 with an I/O surface 1502. The microelectronic device 1500 includes a first I/O pad 1503a, a second I/O pad 1503b, and an auxiliary pad 1549, on the I/O surface 1502. The substrate 1501 may be similar to the substrate 101 disclosed in reference to FIG. 1A. The I/O pads 1503a and 1503b may be electrically coupled to interconnects 1505 through vias 1506. The auxiliary pad 1549 may optionally be free of an electrical connection to one of the interconnects 1505 through one of the vias 1506, as depicted in FIG. 15A. A PO layer 1507 may optionally be disposed over the I/O surface 1502, with openings that expose the I/O pads 1503a and 1503b and the auxiliary pad 1549.

A column trench layer 1519 is formed over the substrate 1501, and over the PO layer 1507, if present. The column trench layer 1519 has a column trench 1531 which exposes the first I/O pad 1503a and the second I/O pad 1503b. The column trench layer 1519 has an auxiliary column trench 1551 which exposes the auxiliary pad 1549. The column trench layer 1519 may include an organic polymer or other material suitable for a copper CMP process and a subsequent removal process. The column trench layer 1519 may be formed, for example, by a photolithographic process, or by an additive process.

A first seed layer 1504 is subsequently formed over the column trench layer 1519. The first seed layer 1504 extends into the column trench 1531 and contacts the first I/O pad 1503a and the second I/O pad 1503b. The first seed layer 1504 also extends into the auxiliary column trench 1551 and contacts the auxiliary pad 1549. The first seed layer 1504 provides an electrically conductive layer for a subsequent column electroplating process.

The column electroplating process forms a copper column layer 1552 on the first seed layer 1504. The copper column layer 1552 fills the column trench 1531 and the auxiliary column trench 1551, and extends over the column trench layer 1519 adjacent to the column trench 1531 and the auxiliary column trench 1551. The column electroplating process may use additives to form the copper column layer 1552 with a greater thickness in the column trench 1531 and the auxiliary column trench 1551 than over the column trench layer 1519 adjacent to the column trench 1531 and the auxiliary column trench 1551.

Figure 15B:
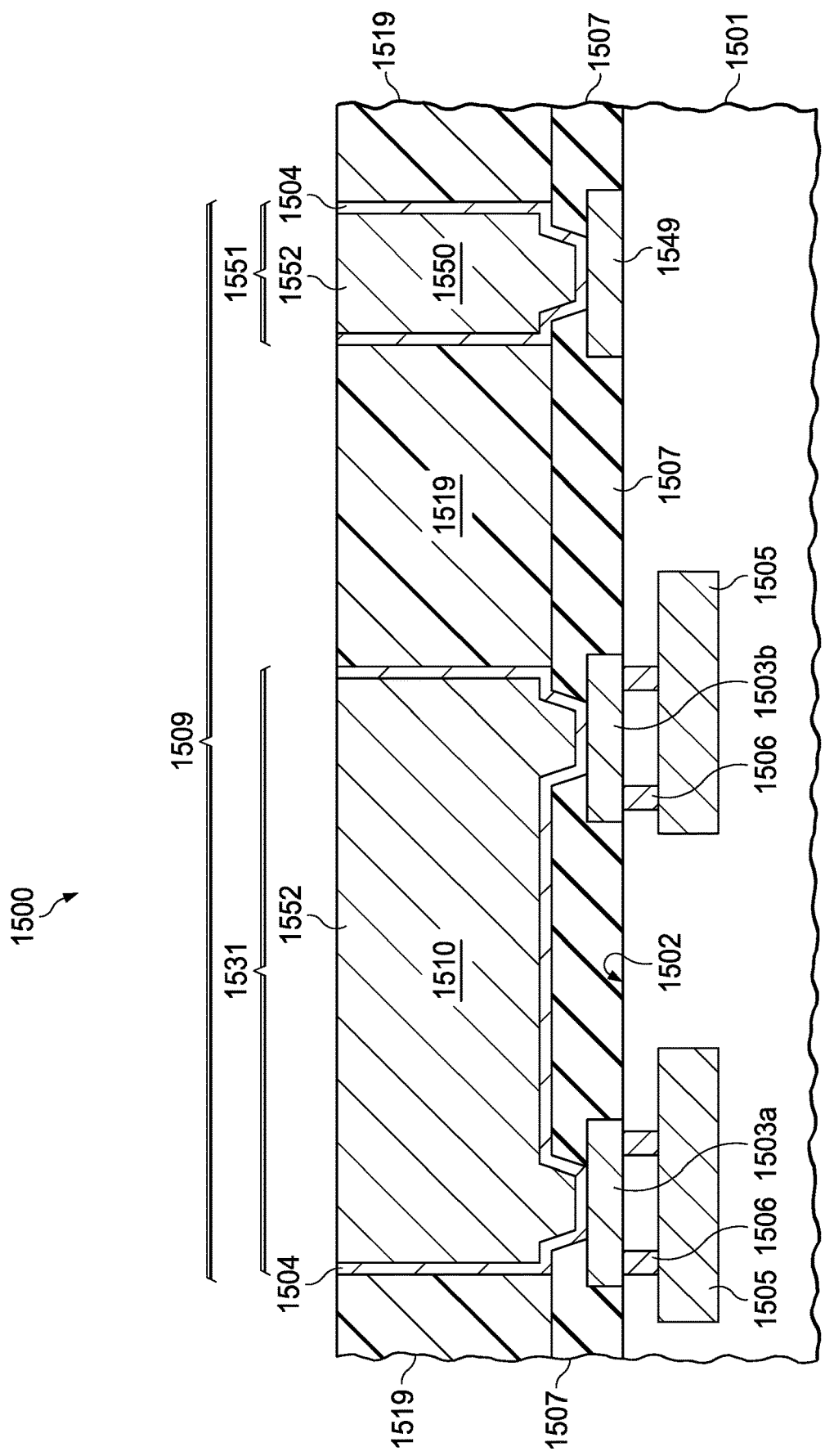

Referring to FIG. 15B, the copper column layer 1552 over the column trench layer 1519 is removed, for example by a copper CMP process, leaving the copper column layer 1552 in the column trench 1531 and in the auxiliary column trench 1551. The copper column layer 1552 in the column trench 1531 provides a column 1510 of an electrically conductive pillar 1509. The copper column layer 1552 in the auxiliary column trench 1551 provides an auxiliary column 1550 of the electrically conductive pillar 1509. The first seed layer 1504 over the column trench layer 1519 is also removed, as indicated in FIG. 15B. The first seed layer 1504 may be removed from over the column trench layer 1519 by the process used to remove the copper column layer 1552 from over the column trench layer 1519. Alternatively, the first seed layer 1504 may be removed from over the column trench layer 1519 by a separate process, such as a wet etch process.

Figure 15C:
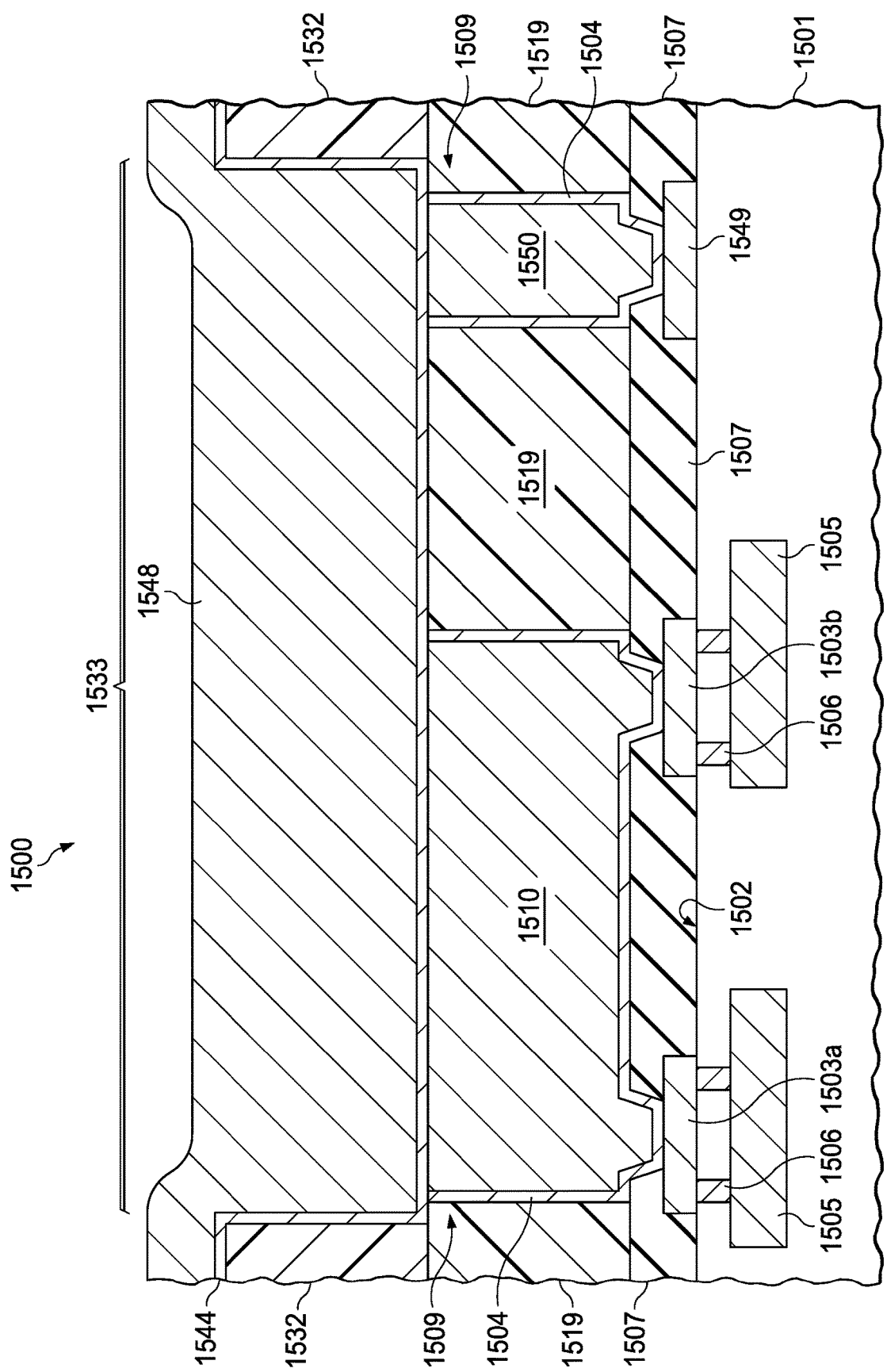

Referring to FIG. 15C, a head trench layer 1532 is formed over the column trench layer 1519. The head trench layer 1532 has a head trench 1533 which exposes the column 1510 and the auxiliary column 1550, and exposes the column trench layer 1519 around the column 1510 and the auxiliary column 1550, as shown in FIG. 15C. The head trench layer 1532 may be formed, for example, by a photolithographic process or an additive process. The head trench layer 1532 may be formed by a process similar to the process used to form the column trench layer 1519.

A second seed layer 1544 is formed over the head trench layer 1532, extending into the head trench 1533 and contacting the column 1510 and the auxiliary column 1550. The second seed layer 1544 provides an electrically conductive layer for a subsequent head electroplating process.

The head electroplating process forms a copper head layer 1548 on the second seed layer 1544. The copper head layer 1548 fills the head trench 1533 and extends over the head trench layer 1532 adjacent to the head trench 1533. The head electroplating process may use additives similar to those used in the column electroplating process, to form the copper head layer 1548 with a greater thickness in the head trench 1533 than over the head trench layer 1532 adjacent to the head trench 1533.

Figure 15D:
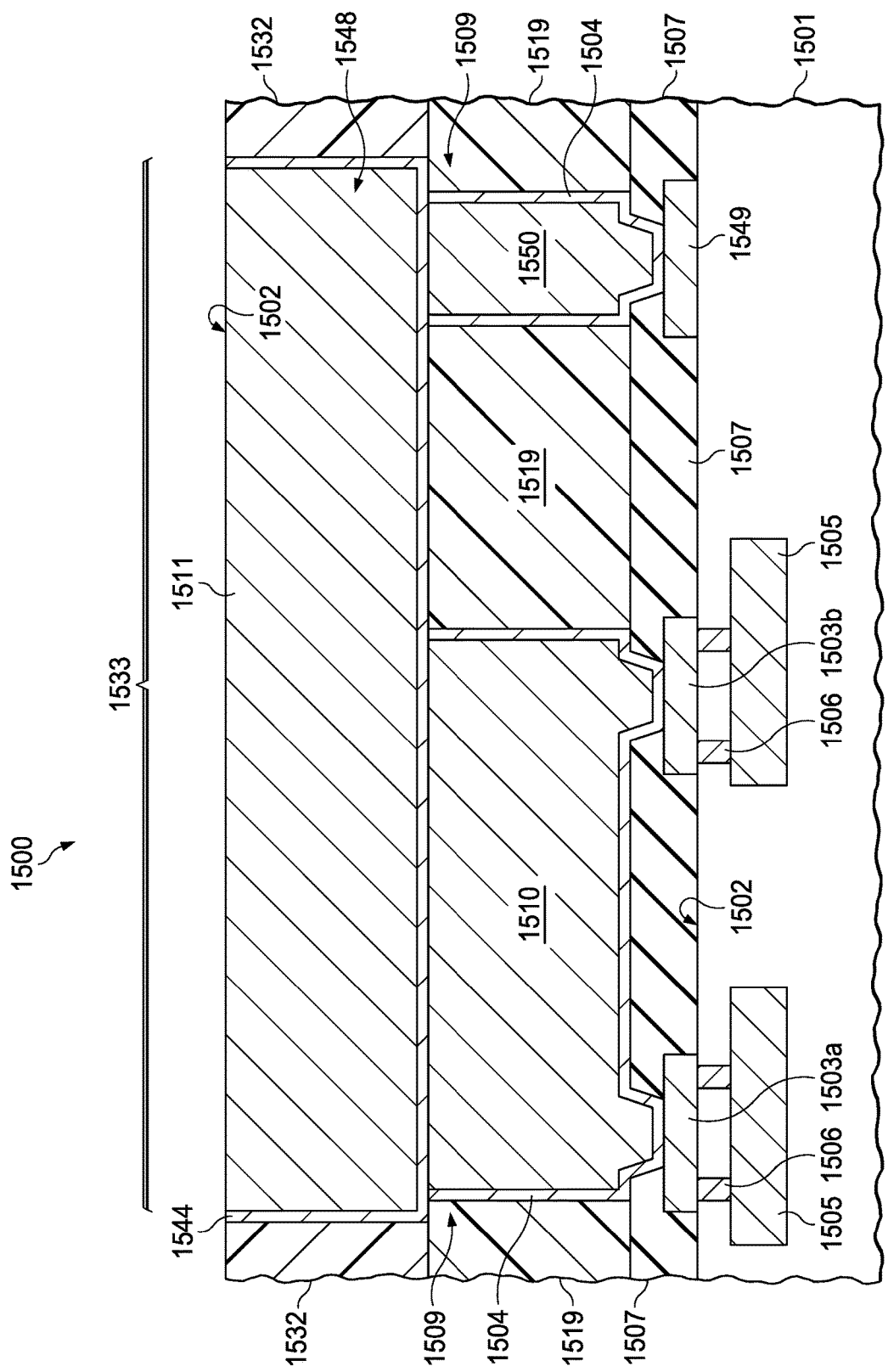

Referring to FIG. 15D, the copper head layer 1548 over the head trench layer 1532 adjacent to the head trench 1533 is removed, for example, by a copper CMP process, leaving the copper head layer 1548 in the head trench 1533, to provide an expanded head 1511 of the electrically conductive pillar 1509. The second seed layer 1544 over the head trench layer 1532 adjacent to the head trench 1533 is also removed. The second seed layer 1544 over the head trench layer 1532 may also be removed by the copper CMP process, or may be removed by a separate process. The expanded head 1511 has a contact surface 1516 located opposite from the column 1510 and the auxiliary column 1550.

Figure 15E:
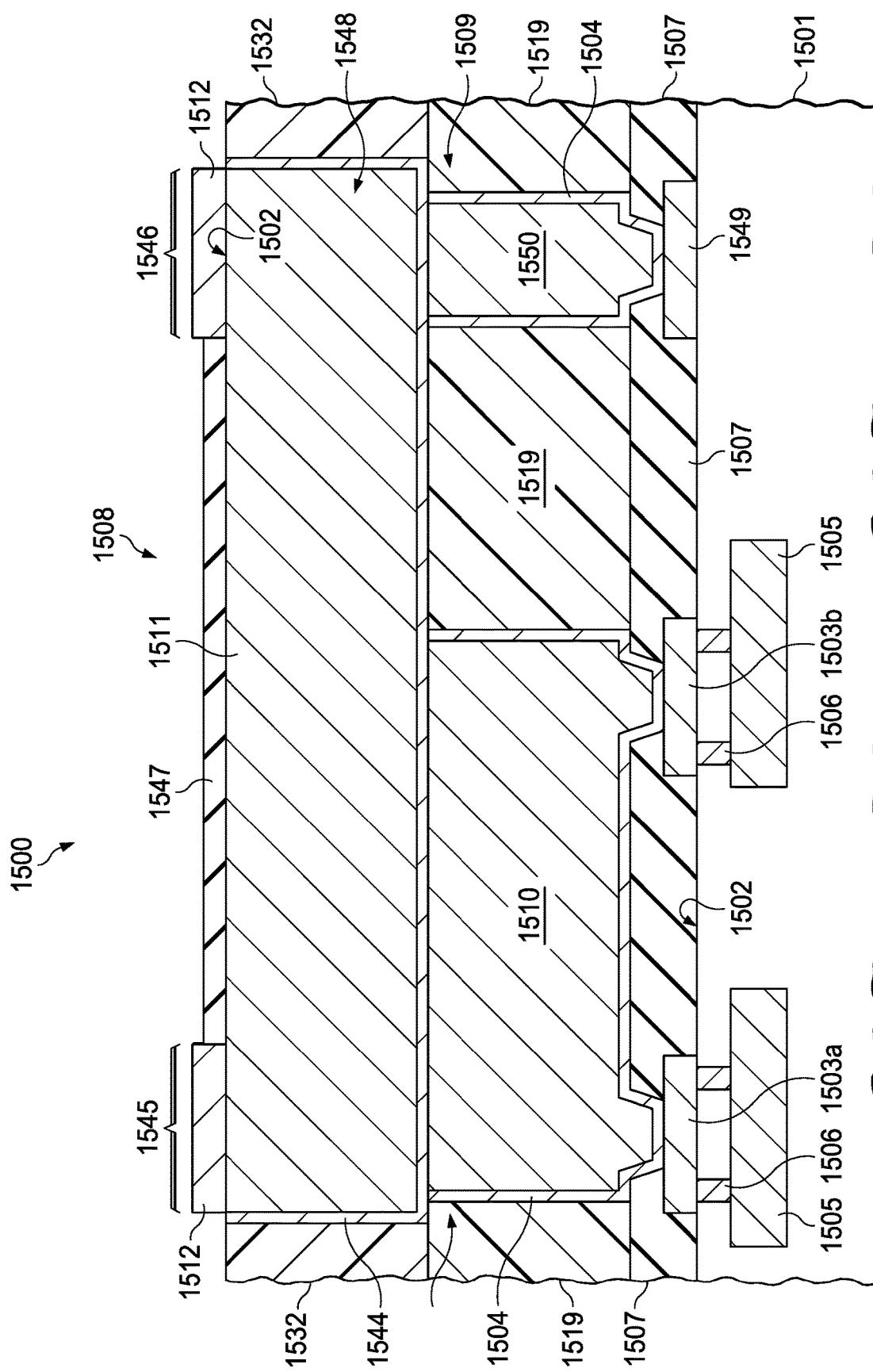

Referring to FIG. 15E, the contact surface 1516 includes a first connection area 1545 and a second connection area 1546. The first connection area 1545 and the second connection area 1546 are laterally separated in the instant example. An insulator layer 1547 may be formed on the contact surface 1516, between the first connection area 1545 and the second connection area 1546. The insulator layer 1547 may include any of the materials, and may be formed by any of the processes, disclosed in reference to the insulator layer 1547 of FIG. 13F.

Solder 1512 is formed on the contact surface 1516 in the first connection area 1545 and the second connection area 1546. The solder 1512 may be formed, for example, by an electroplating process, or by an additive process. The solder 1512 may include any of the metals disclosed in reference to the solder 112 of FIG. 1A. The solder 1512 may be formed after the insulator layer 1547 is formed, or may be formed prior to forming the insulator layer 1547. The first seed layer 1504, the column 1510, the auxiliary column 1550, the second seed layer 1544, the expanded head 1511, the solder 1512, and the insulator layer 1547 provide a bump bond structure 1508.

Figure 15F:
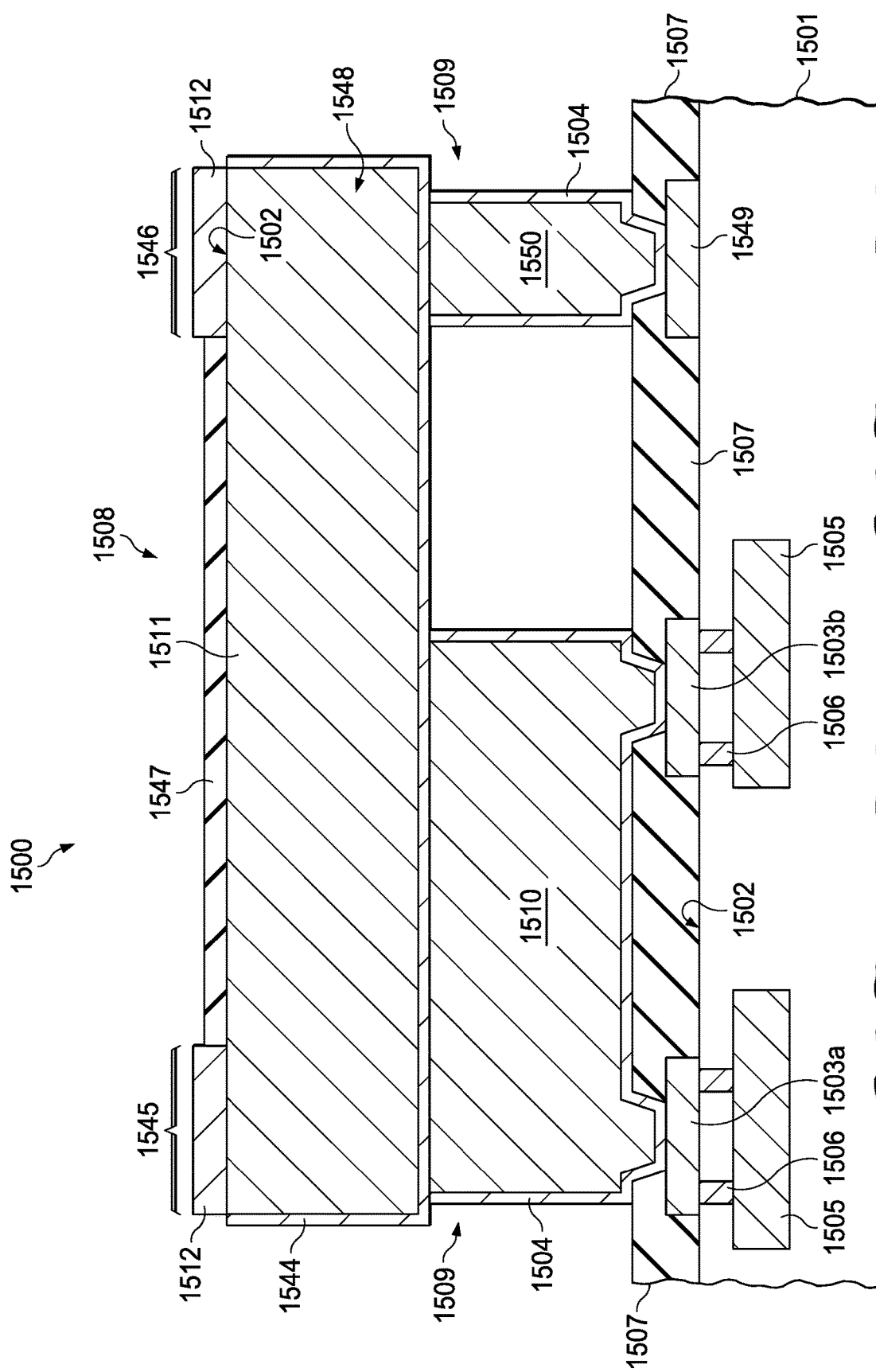

Referring to FIG. 15F, the head trench layer 1532 and the column trench layer 1519 of FIG. 15E are removed, leaving the bump bond structure 1508 in place on the first I/O pad 1503*a*, the second I/O pad 1503*b*, and the auxiliary pad 1549. The head trench layer 1532 and the column trench layer 1519 may be removed by a single process, which is facilitated by the head trench layer 1532 being in direct contact with the column trench layer 1519. The head trench layer 1532 and the column trench layer 1519 may be removed, for example, by a dry removal process using oxygen radicals, or a wet removal process using one or more organic solvents.

Various features of the examples disclosed herein may be combined in other manifestations of example microelectronic devices. For example, the columns and expanded heads of the electrically conductive pillars disclosed in reference to FIG. 1A and FIG. 1B, FIG. 3, FIG. 5A and FIG. 5B, FIG. 8, FIG. 10A, FIG. 12A, and FIG. 14A may be formed by the methods disclosed in reference to FIG. 2A through FIG. 2G, FIG. 4A through FIG. 4F, FIG. 6A through FIG. 6E, FIG. 7A through FIG. 7D, FIG. 9A through FIG. 9D, FIG. 11A through FIG. 11K, FIG. 13A through FIG. 13I, and FIG. 15A through FIG. 15F. The plating masks disclosed in reference to FIG. 2A, FIG. 4A, FIG. 6A, FIG. 6B, FIG. 7A, FIG. 11A, FIG. 11D, and FIG. 13A, may be formed by any of the methods for forming plating masks or trench layers disclosed herein. Similarly, the trench layers disclosed in reference to FIG. 13C, FIG. 15A, and FIG. 15C may be formed by any of the methods for forming trench layers or plating masks disclosed herein. The bump bond structures disclosed in FIG. 1A and FIG. 1B, FIG. 3, FIG. 5A and FIG. 5B, FIG. 8, FIG. 10A, FIG. 12A, and FIG. 14A may include a barrier layer as disclosed in reference to FIG. 3.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a substrate having an input/output (I/O) surface;
   an I/O pad on the I/O surface; and
   a bump bond structure on the I/O pad, the bump bond structure including:
      an electrically conductive pillar, including:
         a column on the I/O pad;
         an expanded head on the column, wherein:
            the expanded head extends past the column on all lateral sides of the column by a lateral distance that is approximately equal to a vertical thickness of the expanded head;
            the expanded head has a rounded side profile with a radius that is approximately equal to the thickness of the expanded head; and
            the expanded head has a contact surface which is flat, the contact surface being located opposite from the column; and
      solder on the contact surface of the expanded head.

2. The microelectronic device of claim 1, further comprising a seed layer between the column and the I/O pad.

3. The microelectronic device of claim 1, wherein the column and the expanded head include primarily copper.

4. A method of forming a microelectronic device, comprising:
   providing a substrate having an input/output (I/O) surface, with an I/O pad on the I/O surface;
   forming a seed layer over the I/O surface, so that the seed layer contacts the I/O pad, the seed layer providing an electrically conductive layer;
   forming a plating mask over the seed layer, so that the plating mask exposes the seed layer over the I/O pad;

electroplating metal on the seed layer where exposed by
the plating mask, so that the metal extends through the
plating mask to form an electrically conductive pillar,
the electrically conductive pillar including
a column on the I/O pad extending from the seed layer
to a top surface of the plating mask, the top surface
of the plating mask being located opposite from the
seed layer; and
an expanded head on the column, wherein:
the expanded head extends past the column on all
lateral sides of the column by a lateral distance that
is approximately equal to a vertical thickness of the
expanded head;
the expanded head has a rounded side profile with a
radius that is approximately equal to the thickness of
the expanded head; and
the expanded head has a contact surface which is flat,
the contact surface being located opposite from the
column;
forming solder on the contact surface of the expanded
head;
removing the plating mask; and
removing the seed layer where exposed by the column.

5. The method of claim 4, wherein forming the plating mask includes a photolithographic process using photoresist.

6. The method of claim 4, wherein the column and the expanded head include primarily copper.

7. A microelectronic device, comprising:
a substrate having an input/output (I/O) surface;
an I/O pad on the I/O surface; and
a bump bond structure on the I/O pad, the bump bond structure including:
an electrically conductive pillar, including:
a column on the I/O pad;
an expanded head on the column, wherein:
the expanded head has a contact surface which is flat, the contact surface being located opposite from the column;
the expanded head extends laterally past the column by a first lateral distance in a first lateral direction and by a second lateral distance in a second lateral direction; and
the first lateral distance is greater than the second lateral distance; and
solder on the contact surface of the expanded head.

8. The microelectronic device of claim 7, wherein the column and the expanded head include primarily copper.

9. The microelectronic device of claim 7, wherein the flat contact surface extends to a lateral perimeter of the expanded head.

10. A method of forming a microelectronic device, comprising:
providing a substrate having an input/output (I/O) surface, with an I/O pad on the I/O surface;
forming an electrically conductive pillar on the I/O pad, the electrically conductive pillar including
a column on the I/O pad; and
an expanded head on the column, wherein:
the expanded head has a contact surface which is flat, the contact surface being located opposite from the column;
the expanded head extends laterally past the column by a first lateral distance in a first lateral direction and by a second lateral distance in a second lateral direction; and
the first lateral distance is greater than the second lateral distance; and forming solder on the contact surface of the expanded head.

11. The method of claim 10, wherein forming the electrically conductive pillar includes:
forming a seed layer over the I/O surface, so that the seed layer contacts the I/O pad, the seed layer providing an electrically conductive layer;
forming a column plating mask over the seed layer, so that the column plating mask has a column opening that exposes the seed layer over the I/O pad;
forming a head plating mask over the column plating mask, so that the head plating mask has a head opening that exposes the column opening in the column plating mask;
electroplating copper on the seed layer where exposed by the column plating mask, so that the copper extends through the column opening to form the column and into the head opening to form the expanded head;
removing the head plating mask;
removing the column plating mask; and
removing the seed layer where exposed by the column.

12. The method of claim 10, wherein forming the electrically conductive pillar includes:
forming a seed layer over the I/O surface, so that the seed layer contacts the I/O pad, the seed layer providing an electrically conductive layer;
forming a pillar plating mask over the seed layer, so that the pillar plating mask has a column opening that exposes the seed layer over the I/O pad and a head opening that exposes the column opening;
electroplating metal on the seed layer where exposed by the pillar plating mask, so that the metal extends through the column opening to form the column and into the head opening to form the expanded head;
removing the pillar plating mask; and
removing the seed layer where exposed by the column.

13. The method of claim 10, wherein forming the electrically conductive pillar includes forming the column by a first additive process, and forming the expanded head by a second additive process.

14. A microelectronic device, comprising:
a substrate having an input/output (I/O) surface;
a first I/O pad on the I/O surface; and
a bump bond structure on the first I/O pad, the bump bond structure including:
an electrically conductive pillar, including:
a first column on the I/O pad;
an expanded head on the first column, wherein:
the expanded head has a contact surface, the contact surface being located opposite from the first column;
the expanded head extends laterally past the first column in at least one lateral direction;
the bump bond structure has a first connection area on the contact surface; and
the bump bond structure has a second connection area on the expanded head; and
solder on the contact surface of the expanded head.

15. The microelectronic device of claim 14, wherein the second connection area is on the contact surface of the expanded head.

16. The microelectronic device of claim 14, wherein:
the microelectronic device includes a second I/O pad on the I/O surface;
the electrically conductive pillar includes a second column on the second I/O pad; and the second column contacts the expanded head at the second connection area.

17. A method of forming a microelectronic device, comprising:
   providing a substrate having an input/output (I/O) surface, with an I/O pad on the I/O surface;
   forming an electrically conductive pillar on the I/O pad, the electrically conductive pillar including
      a column on the I/O pad; and
      an expanded head on the column, wherein:
         the expanded head has a contact surface, the contact surface being located opposite from the first column;
         the expanded head extends laterally past the first column in at least one lateral direction;
         the bump bond structure has a first connection area on the contact surface; and
         the bump bond structure has a second connection area on the expanded head; and
   forming solder on the contact surface of the expanded head.

18. The method of claim 17, wherein forming the electrically conductive pillar includes:
   forming a first seed layer over the I/O surface, so that the first seed layer contacts the I/O pad, the first seed layer providing an electrically conductive layer;
   forming a column plating mask over the first seed layer, so that the column plating mask has a column opening that exposes the first seed layer over the I/O pad;
   electroplating metal on the first seed layer to form the column in the column opening;
   forming a second seed layer over the column plating mask so that the second seed layer contacts the column;
   forming a head plating mask over the second seed layer, so that the head plating mask has a head opening that exposes the second seed layer over the column;
   electroplating metal on the second seed layer where exposed by the head plating mask, to form the expanded head;
   removing the head plating mask;
   removing the second seed layer where exposed by the expanded head;
   removing the column plating mask; and
   removing the first seed layer where exposed by the column.

19. The method of claim 17, wherein forming the electrically conductive pillar includes:
   forming a first seed layer over the I/O surface, so that the first seed layer contacts the I/O pad, the first seed layer providing an electrically conductive layer;
   forming a column plating mask over the first seed layer, so that the column plating mask has a column opening that exposes the first seed layer over the I/O pad;
   electroplating copper on the first seed layer to form the column in the column opening;
   forming a head trench layer over the column plating mask, so that the head trench layer has a head trench which exposes the column;
   forming a second seed layer over the head trench layer so that the second seed layer contacts the column;
   electroplating copper on the second seed layer to form a copper head layer in the head trench;
   removing the copper head layer and the second seed layer from over the head trench layer adjacent to the head trench, leaving the copper head layer in the head trench to provide the expanded head;
   removing the head trench layer;
   removing the column plating mask; and
   removing the first seed layer where exposed by the column.

20. The method of claim 19, wherein removing the copper head layer and the second seed layer from over the head trench layer adjacent to the head trench is performed by a copper chemical mechanical polishing (CMP) process.

* * * * *